(12) United States Patent
Tsuboi

(10) Patent No.: US 12,457,688 B2
(45) Date of Patent: Oct. 28, 2025

(54) ELECTRONIC MODULE, ELECTRONIC APPARATUS, AND METHOD OF MANUFACTURING THE ELECTRONIC MODULE

(71) Applicant: CANON KABUSHIKI KAISHA, Tokyo (JP)

(72) Inventor: Noritake Tsuboi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 122 days.

(21) Appl. No.: 18/498,080

(22) Filed: Oct. 31, 2023

(65) Prior Publication Data

US 2024/0147624 A1 May 2, 2024

(30) Foreign Application Priority Data

Nov. 2, 2022 (JP) .................. 2022-176322
Sep. 29, 2023 (JP) .................. 2023-169939

(51) Int. Cl.
H05K 1/18 (2006.01)
H01L 25/16 (2023.01)
H05K 3/34 (2006.01)

(52) U.S. Cl.
CPC ............ H05K 1/181 (2013.01); H01L 25/16 (2013.01); H05K 3/3436 (2013.01);
(Continued)

(58) Field of Classification Search
CPC .... H05K 1/111; H05K 3/3436; H05K 3/3485; H05K 2201/10515; H05K 2201/10636;
(Continued)

(56) References Cited

U.S. PATENT DOCUMENTS 5,684,677 A * 11/1997 Uchida ................ H05K 3/3442
361/773
11,412,616 B2    8/2022 Tsuboi
(Continued)

FOREIGN PATENT DOCUMENTS

JP       2012-199347       10/2012
JP       2013-122939       6/2013
(Continued)

*Primary Examiner* — Nathan Milakovich
(74) *Attorney, Agent, or Firm* — VENABLE LLP

(57) ABSTRACT

An electronic module includes a first wiring component, a first electronic component, a first bonding member, and a second bonding member. The first wiring component includes a first pad, a second pad, and a first insulating member. The first pad, the second pad, and the first insulating member are formed in a first mounting surface. The first electronic component includes a first electrode and a second electrode and is surface-mounted on the first mounting surface. The first bonding member is configured to bond the first pad and the first electrode together. The second bonding member is configured to bond the second pad and the second electrode together. The first electrode and the second electrode are positioned on an insulating area of the first mounting surface. A distance between the first electrode and the first insulating member is smaller than a distance between the first electrode and the first pad.

34 Claims, 20 Drawing Sheets

(52) U.S. Cl.
CPC ......... *H05K 3/3442* (2013.01); *H05K 3/3485* (2020.08); *H05K 2201/10015* (2013.01); *H05K 2201/10378* (2013.01); *H05K 2201/10515* (2013.01); *H05K 2201/10636* (2013.01); *H05K 2201/10734* (2013.01); *H05K 2203/0465* (2013.01)

(58) Field of Classification Search
CPC .. H05K 2201/10734; H05K 2203/0465; H01L 23/49816
See application file for complete search history.

(56) References Cited

U.S. PATENT DOCUMENTS

| | | |
|---|---|---|
| 11,792,936 B2 | 10/2023 | Tsuboi |
| 2006/0108607 A1 | 5/2006 | Teshima |
| 2008/0179083 A1* | 7/2008 | Del Rosario ........ H05K 1/0231 29/832 |
| 2012/0292088 A1* | 11/2012 | Lee ..................... H05K 3/3431 228/179.1 |
| 2013/0100624 A1* | 4/2013 | Carpenter ............. H05K 1/114 174/262 |
| 2019/0150334 A1* | 5/2019 | Cyril ................... H05K 3/4038 361/767 |
| 2022/0020807 A1 | 1/2022 | Hasegawa |
| 2022/0102330 A1 | 3/2022 | Onoko |
| 2022/0386468 A1* | 12/2022 | Karakawa ............ H10F 39/809 |
| 2023/0223713 A1 | 7/2023 | Hasegawa |
| 2023/0403796 A1 | 12/2023 | Tsuboi |

FOREIGN PATENT DOCUMENTS

| | | |
|---|---|---|
| JP | 2015-176998 | 10/2015 |
| JP | 2020-194883 | 12/2020 |
| JP | 2020-205409 | 12/2020 |
| WO | 2005/024945 | 3/2005 |

* cited by examiner

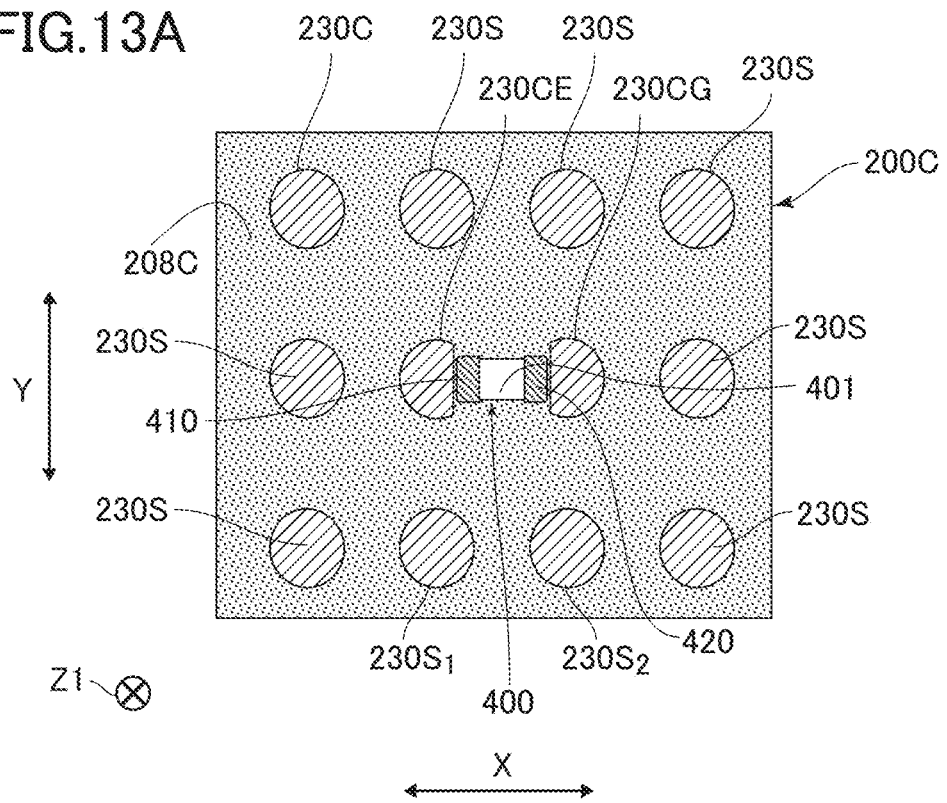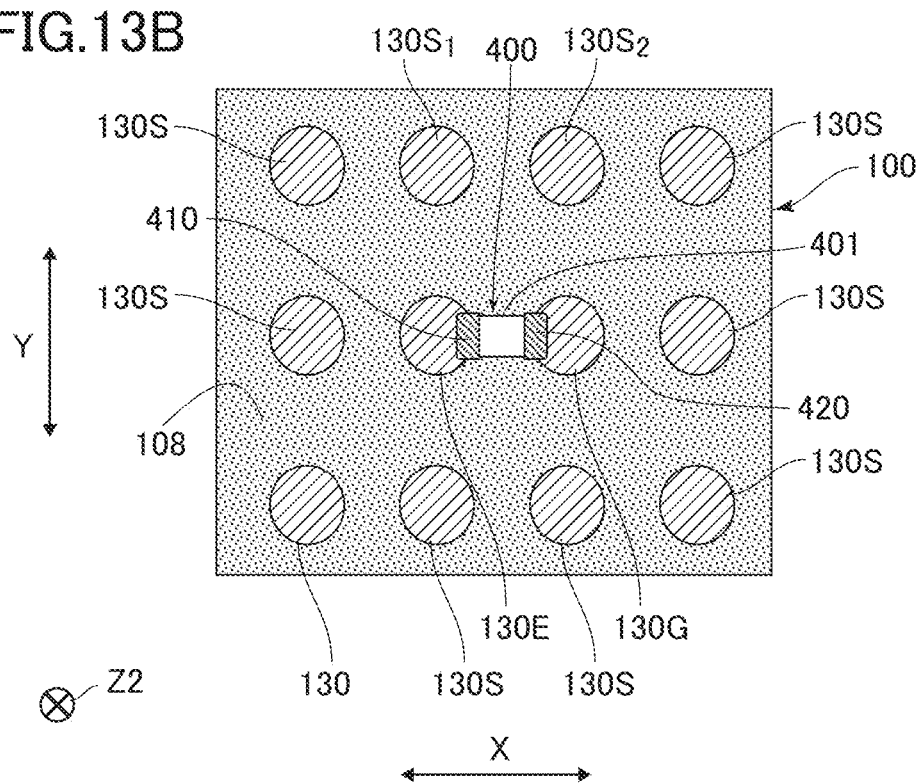

ELECTRONIC MODULE, ELECTRONIC APPARATUS, AND METHOD OF MANUFACTURING THE ELECTRONIC MODULE

BACKGROUND OF THE INVENTION

Field of the Invention

The present disclosure relates to an electronic module, an electronic apparatus, and a method of manufacturing the electronic module.

Description of the Related Art

In electronic apparatuses including an electronic module, transmission signals are increasingly increased in speed and decreased in voltage, and it is required to reduce the noise produced by the electronic module. As one of methods for reducing the noise, Japanese Patent Application Publication No. 2020-205409 and WO 2005/024945 A1 disclose a technique for mounting a chip component, such as a bypass capacitor, in a space between a ball grid array (BGA) semiconductor device and a wiring board.

However, when the electronic module is manufactured, short-circuit failure may occur. In the short-circuit failure, a bonding member that bonds an electrode of an electronic component to a wiring board short-circuits to another bonding member.

SUMMARY OF THE INVENTION

According to a first aspect of the present disclosure an electronic module includes a first wiring component, a first electronic component, a first bonding member, and a second bonding member. The first wiring component includes a first pad, a second pad, and a first insulating member configured to define the first pad and the second pad. The first pad, the second pad, and the first insulating member are formed in a first mounting surface. The first electronic component includes a first electrode and a second electrode and is surface-mounted on the first mounting surface. The first bonding member is configured to bond the first pad and the first electrode together. The second bonding member is configured to bond the second pad and the second electrode together. The first electrode and the second electrode are positioned on an insulating area of the first mounting surface. The insulating area is formed by the first insulating member. A distance between the first electrode and the first insulating member is smaller than a distance between the first electrode and the first pad.

According to a second aspect of the present disclosure, a method of manufacturing an electronic module includes supplying a first solder paste such that the first solder paste extends from a top of a first pad of a wiring component to a top of an insulating member of the wiring component, and supplying a second solder paste such that the second solder paste extends from a top of a second pad of the wiring component to a top of the insulating member of the wiring component. In addition, the method includes placing an electronic component on the wiring component such that a first electrode of the electronic component contacts a portion of the first solder paste formed on the insulating member, and that a second electrode of the electronic component contacts a portion of the second solder paste formed on the insulating member. In addition, the method includes forming a first molten solder and a second molten solder by melting the first solder paste and the second solder paste by heating the first solder paste and the second solder paste in a state where the electronic component is pressed against the insulating member, and forming a first bonding member and a second bonding member by solidifying the first molten solder and the second molten solder by cooling the first molten solder and the second molten solder, The first bonding member and the second bonding member are members that bond the first electrode and the second electrode to the wiring component in a state where the first electrode and the second electrode are positioned on the insulating member.

Further features of the present invention will become apparent from the following description of exemplary embodiments with reference to the attached drawings.

BRIEF DESCRIPTION OF THE DRAWINGS

FIG. 13A is a plan view of a wiring board and an electronic component of the second embodiment.

FIG. 13B is a plan view of a package board and the electronic component of the second embodiment.

DESCRIPTION OF THE EMBODIMENTS

Hereinafter, example embodiments of the present disclosure will be described in detail with reference to the accompanying drawings.

First Embodiment

Figure 1:
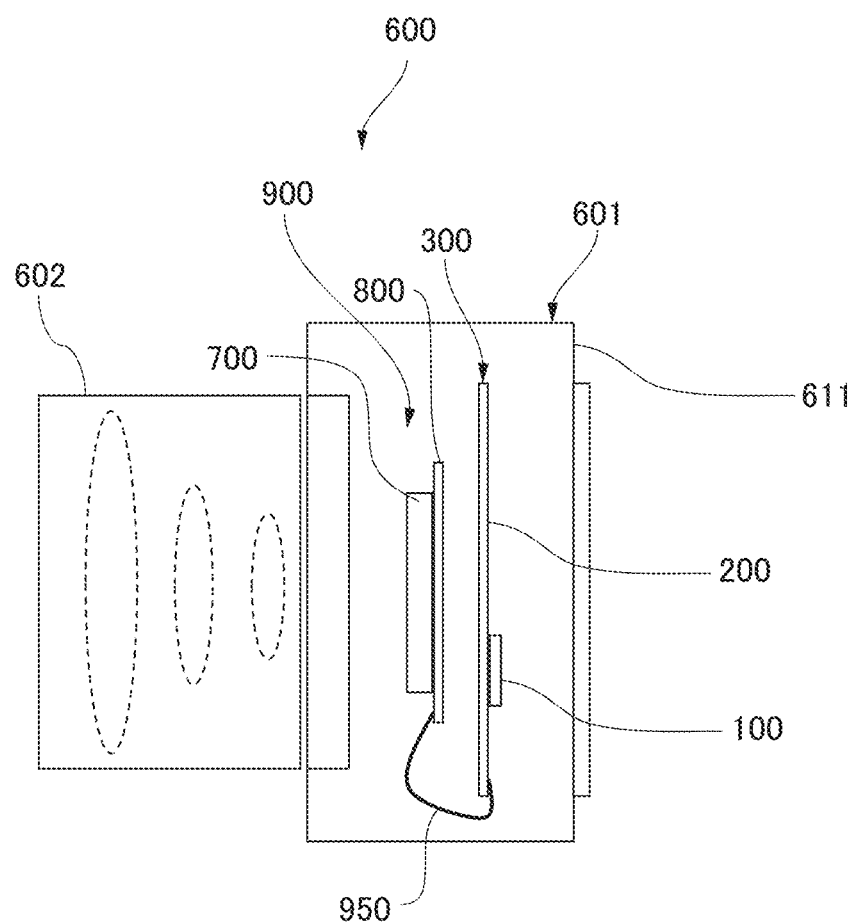
FIG. 1 is a diagram illustrating a digital camera, which is an image pickup device that serves as one example of an electronic apparatus of a first embodiment.

FIG. 1 is a diagram illustrating a digital camera 600, which is an image pickup device that serves as one example of an electronic apparatus of a first embodiment. The digital camera 600 is a digital camera with interchangeable lenses, and includes a camera body 601. To the camera body 601, a lens unit (lens barrel) 602 including lenses is detachably attached. The camera body 601 includes a housing 611, a processing module 300, and a sensor module 900. The processing module 300 and the sensor module 900 are disposed in the housing 611. In the first embodiment, the processing module 300 is one example of an electronic module. The processing module 300 and the sensor module 900 are electrically connected with each other via a cable 950.

The sensor module 900 includes an image sensor 700 and a wiring board 800. The image sensor 700 is mounted on the wiring board 800. For example, the wiring board 800 is a rigid wiring board, and is also a printed wiring board. The image sensor 700 is a semiconductor device. For example, the image sensor 700 is a complementary metal oxide semiconductor (CMOS) image sensor or a charge coupled device (CCD) image sensor. The image sensor 700 has a function that converts the light having passed through the lens unit 602, to an electrical signal.

The processing module 300 includes a wiring board 200, and a semiconductor device 100 mounted on the wiring board 200. The wiring board 200 is one example of a first wiring component, and the semiconductor device 100 is one example of a second wiring component. The wiring component may have another function member other than the wiring as long as the wiring component has the wiring. In the first embodiment, the semiconductor device 100 is an integrated-circuit component. The semiconductor device 100 may be a digital signal processor; and has a function to receive an electrical signal from the image sensor 700, correct the electrical signal, and create image data.

Figure 2:
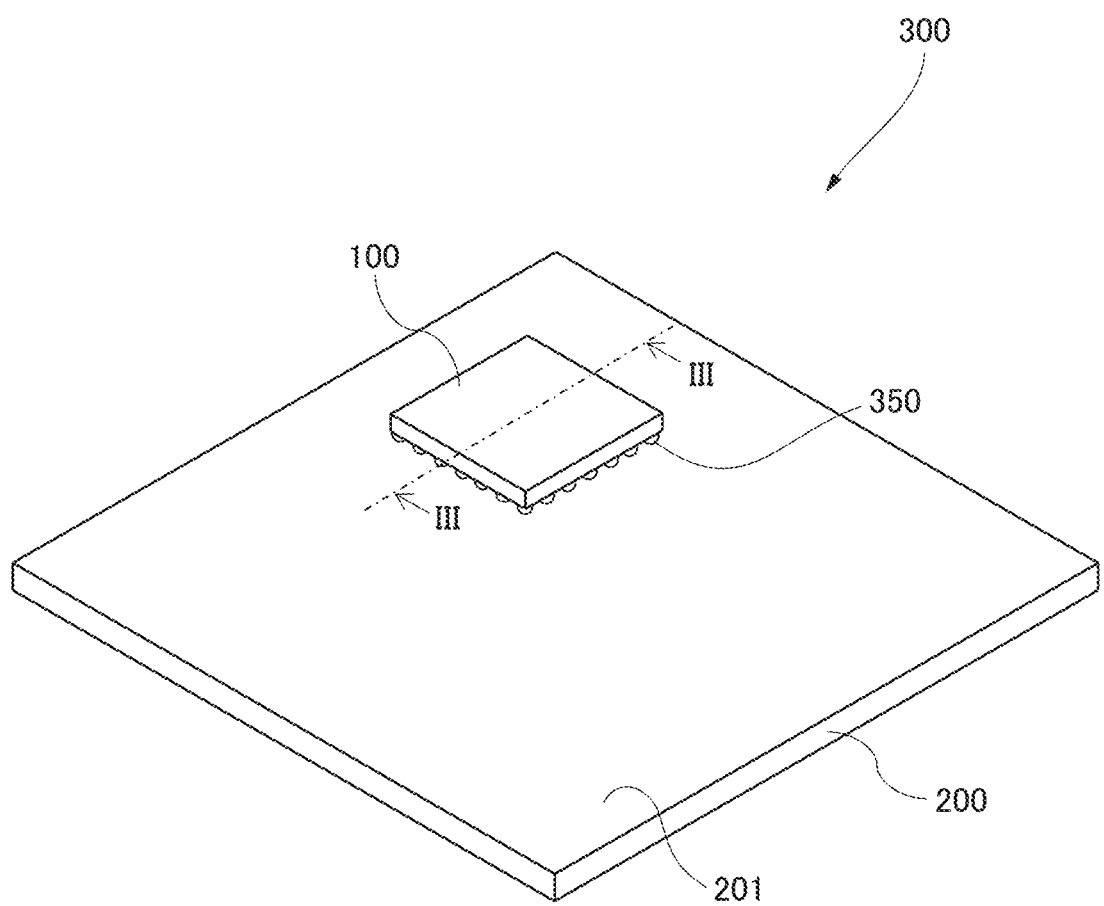
FIG. 2 is a perspective view of a processing module of the first embodiment.

FIG. 2 is a perspective view of the processing module 300 of the first embodiment. The wiring board 200 includes a mounting surface 201. The mounting surface 201 is one example of a first mounting surface. The semiconductor device 100 is bonded to the wiring board 200 via a plurality of bonding members 350. Each of the bonding members 350 is a conductive member that mainly contains solder as bonding material. Each of the bonding members 350 may contain additive, such as a metal other than the solder, semimetal, or insulating material.

The semiconductor device 100 is an area-array semiconductor package. In the first embodiment, the semiconductor device 100 is a ball grid array (BGA) semiconductor package. The wiring board 200 is a printed wiring board, and is also a rigid wiring board. Note that although not illustrated, a power supply circuit is mounted on the wiring board 200. The power supply circuit supplies electric power to the semiconductor device 100 via the wiring board 200.

Figure 3:
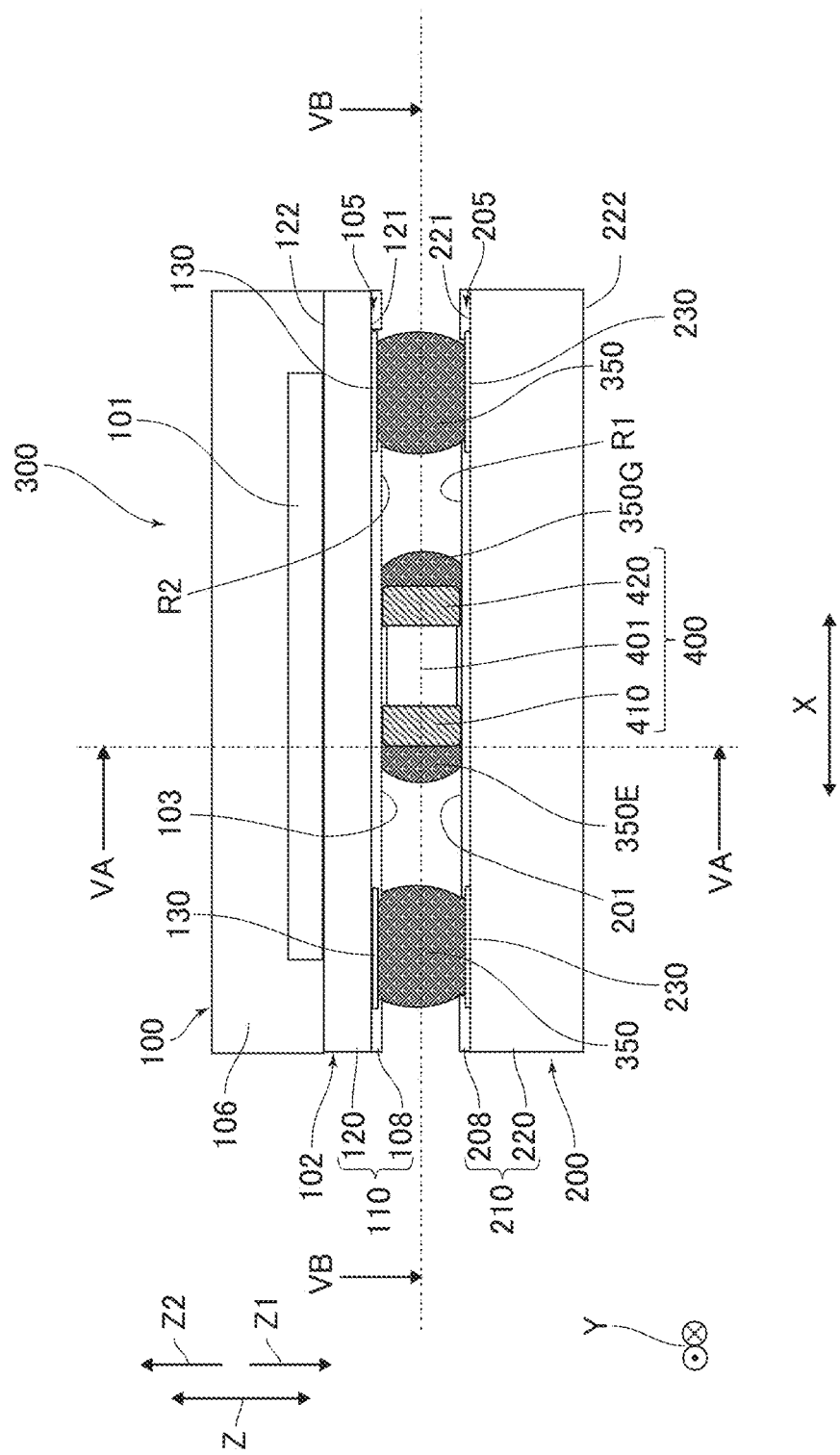
FIG. 3 is a cross-sectional view of the processing module of the first embodiment.

FIG. 3 is a cross-sectional view of the processing module 300 of the first embodiment. FIG. 3 illustrates one portion of a cross section of the processing module 300, taken along a III-III line of FIG. 2. The semiconductor device 100 includes a mounting surface 103 that faces the mounting surface 201 of the wiring board 200. The mounting surface 103 is one example of a second mounting surface. The mounting surface 201 of the wiring board 200 and the mounting surface 103 of the semiconductor device 100 are electrically and mechanically connected with each other via the plurality of bonding members 350. The semiconductor device 100 includes a package board 102, and a semiconductor element 101 mounted on the package board 102. The package board 102 is a printed wiring board, and is also a rigid wiring board.

In the first embodiment, the processing module 300 includes a plurality of electronic components. In FIG. 3, an electronic component 400, which is one of the plurality of electronic components, is illustrated. The electronic component 400 is one example of a first electronic component. The electronic component 400 is surface-mounted on the mounting surface 201 of the wiring board 200, and on the mounting surface 103. Note that the plurality of electronic components may include two or more electronic components 400. The electronic component 400 is a passive component, such as a capacitor, a resistor, or an inductor. Preferably, the electronic component 400 is a capacitor, and is disposed in the vicinity of the semiconductor device 100 that causes the noise. Preferably, the electronic component 400 functions as a bypass capacitor for the semiconductor device 100, and is disposed between the semiconductor device 100 and the wiring board 200. The electronic component 400 is a chip component, and can be disposed in a narrow space between the semiconductor device 100 and the wiring board 200.

The wiring board 200 includes an insulator 210 that includes an insulating board 220 and a solder resist 208. The insulating board 220 includes a main surface 221, and a main surface 222 opposite to the main surface 221. The wiring board 200 is one example of a first wiring board. The insulator 210 is one example of a first insulator. The solder resist 208 is one example of a first insulating member. The insulating board 220 is one example of a first insulating board. The main surface 221 is one example of a first main surface. The wiring board 200 includes a conductor layer 205 that is disposed between the main surface 221 of the insulating board 220 and the solder resist 208, and that is one example of a first conductor layer. The conductor layer 205 includes a plurality of pads 230 that is disposed on the main surface 221 of the insulating board 220, and that is spaced from each other. The plurality of pads 230 is defined by the insulator 210, that is, by the solder resist 208. The mounting surface 201 includes an insulating area R1 formed by the insulator 210, and a conductive area formed by the pads 230. In the first embodiment, the insulating area R1 of the mounting surface 201 is formed by the solder resist 208. Note that if the solder resist 208 is not formed, the insulating board 220 serves as the first insulating member and the insulating area R1 of the mounting surface 201 is formed by the insulating board 220.

The pitch of two of the plurality of pads 230, which are closest to each other, is equal to or smaller than 0.7 mm. The pitch of two pads 230 is a center-to-center distance of the two pads 230. Preferably, the plurality of pads 230 is disposed at high density, and the pitch of two pads 230, closest to each other, is equal to or smaller than 0.4 mm. The plurality of pads 230 may be arranged in a checked pattern or a matrix pattern, or may be arranged in a staggered pattern. In the first embodiment, the plurality of pads 230 is arranged in a checked pattern.

Note that an X direction and a Y direction are defined as directions parallel to the mounting surface 201 and/or the main surface 221, and that a Z direction is defined as a direction perpendicular to the mounting surface 201 and/or the main surface 221. The X direction, the Y direction, and the Z direction intersect each other. Preferably, the X direction, the Y direction, and the Z direction are orthogonal to each other. The Z direction is also a height direction of the electronic component 400. A Z1 direction of the Z direction is a direction extending from the semiconductor device 100 toward the wiring board 200, and a Z2 direction of the Z direction is a direction opposite to the Z1 direction and extending from the wiring board 200 toward the semiconductor device 100.

Each of the pads 230 is a portion of the conductor pattern included in the wiring board 200, and is used for the bonding. The pads 230 have electrical conductivity. The material of each of the pads 230 is a metal, such as copper or gold. For example, each of the pads 230 serves as a signal terminal, a power supply terminal, a ground terminal, or a dummy terminal. The insulating board 220 has electrical insulation property. The material of the insulating board 220 is an insulating material, such as epoxy resin.

Figure 4A:
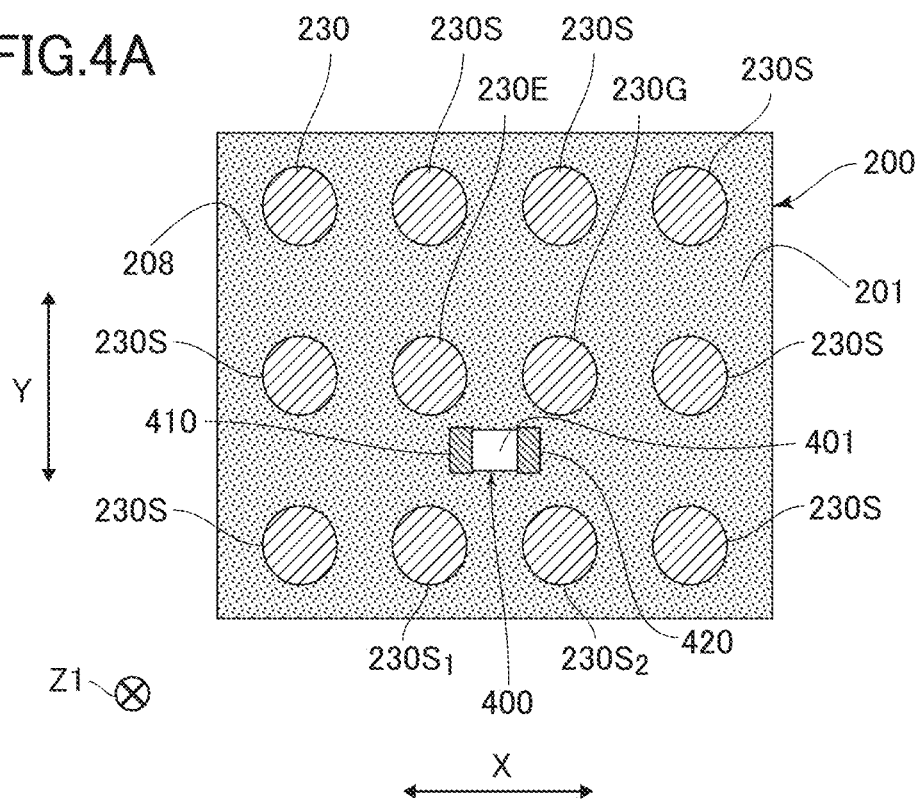
FIG. 4A is a plan view of a wiring board and an electronic component of the first embodiment.

FIG. 4A is a plan view of the wiring board 200 and the electronic component 400 of the first embodiment. FIG. 4A illustrates the wiring board 200 and the electronic component 400 viewed in the Z1 direction. The plurality of pads 230 includes a pad 230E that serves as a power supply terminal, a pad 230G that serves as a ground terminal, and a plurality of pads 230S other than the pads 230E and 230G. The pad 230E is one example of a first pad. The pad 230G is one example of a second pad. Each of the pads 230S serves as a signal terminal, a power supply terminal, a ground terminal, or a dummy terminal. The pad 230E and the pad 230G are adjacent to each other in the X direction. The plurality of pads 230S is disposed around the pad 230E and the pad 230G.

A pad 230S of the plurality of pads 230S that is closest to the pad 230E in the Y direction is defined as a pad $230S_1$. The pad $230S_1$ is one example of a fifth pad. A pad 230S of the plurality of pads 230S that is closest to the pad 230G in the Y direction is defined as a pad $230S_2$. The pad $230S_2$ is one example of a sixth pad. The pad $230S_1$ and the pad $230S_2$ are adjacent to each other in the X direction.

Note that if the plurality of pads 230S includes two pads that are closest to the pad 230E in the Y direction, one of the two pads is defined as the pad $230S_1$. Similarly, if the plurality of pads 230S includes two pads that are closest to the pad 230G in the Y direction, one of the two pads is defined as the pad $230S_2$. In this case, the pad $230S_1$ and the pad $230S_2$ are adjacent to each other in the X direction.

Each of the pads 230E, 230G, $230S_1$, and $230S_2$ is formed like a circle when viewed in the Z direction, that is, in the Z1 direction. In addition, when viewed in the Z direction, that is, in the Z1 direction, the areas of the pads 230E, 230G, $230S_1$, and $230S_2$ are equal to each other. In the first embodiment, each of the pads 230 is formed like a circle when viewed in the Z direction, that is, in the Z1 direction. In addition, in the first embodiment, when viewed in the Z direction, that is, in the Z1 direction, the areas of the pads 230 are equal to each other. Note that the pads 230 are portions of the conductor pattern disposed on the insulator 210, and the portions are not covered with the insulator 210 that includes the solder resist 208. In addition, the shape of each of the pads 230 is the shape of each of the portions of the conductor pattern, which are not covered with the insulator 210. In addition, the area of each of the pads 230 is the area of each of the portions of the conductor pattern, which are not covered with the insulator 210.

The solder resist 208 is one example of a first solder resist. The solder resist 208 is an organic insulating film made of an organic insulating material, such as a solder resist material. The solder resist 208 is formed on the main surface 221.

The plurality of pads 230 is exposed by a plurality of openings formed in the solder resist 208. Each of the pads 230 may be a solder mask defined (SMD) pad or a non-solder mask defined (NSMD) pad. In the first embodiment, each of the pads 230 is an SMD pad. Note that the solder resist 208 may not be formed on the wiring board 200.

As illustrated in FIG. 3, the package board 102 includes an insulator 110 that includes an insulating board 120 and a solder resist 108. The insulator 110 is one example of a second insulator. The solder resist 108 is one example of a second insulating member. The insulating board 120 includes a main surface 121, and a main surface 122 opposite to the main surface 121. The package board 102 is one example of a second wiring board. The package board 102 may be an interposer. The insulating board 120 is one example of a second insulating board. The main surface 121 is one example of a second main surface. Note that the X direction and the Y direction serve also as directions parallel to the mounting surface 103 and the main surface 121, and that the Z direction serves also as a direction perpendicular to the mounting surface 103 and the main surface 121.

For example, the semiconductor element 101 is a semiconductor chip. Preferably, the semiconductor element 101 is mounted on the main surface 122 of the insulating board 120 so as to face upward or downward. In the first embodiment, the semiconductor element 101 is mounted on the main surface 122 of the insulating board 120 so as to face downward.

The semiconductor element 101 includes a plurality of power supply terminals, a plurality of ground terminals, and a plurality of signal terminals. Each of the terminals included in the semiconductor element 101 is bonded to the package board 102 in the wire bonding or flip-chip bonding. Note that although not illustrated, a heatsink may be disposed on the top surface of the semiconductor element 101.

On the main surface 122 of the insulating board 120, a sealing resin 106 is formed for sealing the semiconductor element 101. The package board 102 includes a conductor layer 105 that is disposed between the main surface 121 of the insulating board 120 and the solder resist 108, and that is one example of a second conductor layer. The conductor layer 105 includes a plurality of pads 130 that is disposed on the main surface 121 of the insulating board 120, and that is spaced from each other. The plurality of pads 130 is defined by the insulator 110, that is, by the solder resist 108. The mounting surface 103 includes an insulating area R2 formed by the solder resist 108 of the insulator 110, and a conductive area formed by the pads 130. In the first embodiment, the insulating area R2 of the mounting surface 103 is formed by the solder resist 108. Note that if the solder resist 108 is not formed, the insulating board 120 serves as the second insulating member and the insulating area R2 of the mounting surface 103 is formed by the insulating board 120.

The pitch of two of the plurality of pads 130, which are closest to each other, is equal to or smaller than 0.7 mm. The pitch of two pads 130 is a center-to-center distance of the two pads 130. Preferably, the plurality of pads 130 is disposed at high density, and the pitch of two pads 130, closest to each other, is equal to or smaller than 0.4 mm. The plurality of pads 130 may be arranged in a checked pattern or a matrix pattern, or may be arranged in a staggered pattern. In the first embodiment, the plurality of pads 130 is arranged in a checked pattern.

Each of the pads 130 is a portion of the conductor pattern included in the package board 102, and is used for the bonding. The pads 130 have electrical conductivity. The material of each of the pads 130 is a metal, such as copper or gold. For example, each of the pads 130 serves as a signal terminal, a power supply terminal, a ground terminal, or a dummy terminal. The insulating board 120 has electrical insulation property. The material of the insulating board 120 may be ceramic such as alumina. The insulating board 120 may be a resin board made of glass epoxy resin, for example.

Figure 4B:
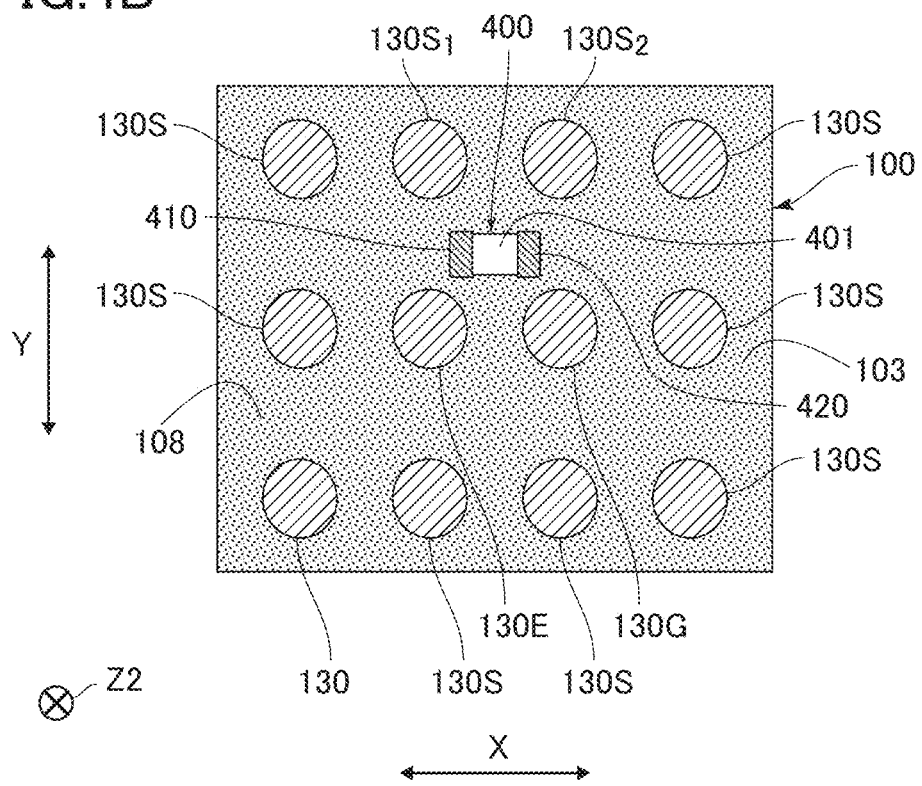
FIG. 4B is a plan view of a package board and the electronic component of the first embodiment.

FIG. 4B is a plan view of the package board 102 and the electronic component 400 of the first embodiment. FIG. 4B illustrates the package board 102 and the electronic component 400 viewed in the Z2 direction. The plurality of pads 130 includes a pad 130E that serves as a power supply terminal, a pad 130G that serves as a ground terminal, and a plurality of pads 130S other than the pads 130E and 130G. The pad 130E is one example of a third pad. The pad 130G is one example of a fourth pad. Each of the pads 130S serves as a signal terminal, a power supply terminal, a ground terminal, or a dummy terminal. The pad 130E and the pad 130G are adjacent to each other in the X direction. The plurality of pads 130S is disposed around the pad 130E and the pad 130G.

A pad 130S of the plurality of pads 130S that is closest to the pad 130E in the Y direction is defined as a pad $130S_1$. The pad $130S_1$ is one example of a seventh pad. A pad 130S of the plurality of pads 130S that is closest to the pad 130G in the Y direction is defined as a pad $130S_2$. The pad $130S_2$ is one example of an eighth pad. The pad $130S_1$ and the pad $130S_2$ are adjacent to each other in the X direction.

Note that if the plurality of pads 130S includes two pads that are closest to the pad 130E in the Y direction, one of the two pads is defined as the pad $130S_1$. Similarly, if the plurality of pads 130S includes two pads that are closest to the pad 130G in the Y direction, one of the two pads is defined as the pad $130S_2$. In this case, the pad $130Si$ and the pad $130S_2$ are adjacent to each other in the X direction.

Each of the pads 130E, 130G, $130S_1$, and $130S_2$ is formed like a circle when viewed in the Z direction, that is, in the Z2 direction. In addition, when viewed in the Z direction, that is, in the Z2 direction, the areas of the pads 130E, 130G, $130S_1$, and $130S_2$ are equal to each other. In the first embodiment, each of the pads 130 is formed like a circle when viewed in the Z direction, that is, in the Z2 direction. In addition, in the first embodiment, when viewed in the Z direction, that is, in the Z2 direction, the areas of the pads 130 are equal to each other. Note that the pads 130 are portions of the conductor pattern disposed on the insulator 110, and the portions are not covered with the insulator 110 that includes the solder resist 108. In addition, the shape of each of the pads 130 is the shape of each of the portions of the conductor pattern, which are not covered with the insulator 110. In addition, the area of each of the pads 130 is the area of each of the portions of the conductor pattern, which are not covered with the insulator 110.

The solder resist 108 is one example of a second solder resist. The solder resist 108 is an organic insulating film made of an organic insulating material, such as a solder resist material. The solder resist 108 is formed on the main surface 121.

The plurality of pads 130 is exposed by a plurality of openings formed in the solder resist 108. Each of the pads 130 may be an SMD pad or an NSMD pad. In the first embodiment, each of the pads 130 is an SMD pad. Note that the solder resist 108 may not be formed on the package board 102.

The pad 130E is electrically connected to a power supply terminal of the semiconductor element 101 via a via conductor (not illustrated) formed in the insulating board 120. The pad 130G is electrically connected to a ground terminal of the semiconductor element 101 via a via conductor (not illustrated) formed in the insulating board 120.

The plurality of pads 230 and the plurality of pads 130 face each other in the Z direction. That is, the pad 230E and the pad 130E face each other in the Z direction. The pad 230G and the pad 130G face each other in the Z direction. The pad $230S_1$ and the pad $130S_1$ face each other in the Z direction. The pad $230S_2$ and the pad $130S_2$ face each other in the Z direction.

Figure 5A:
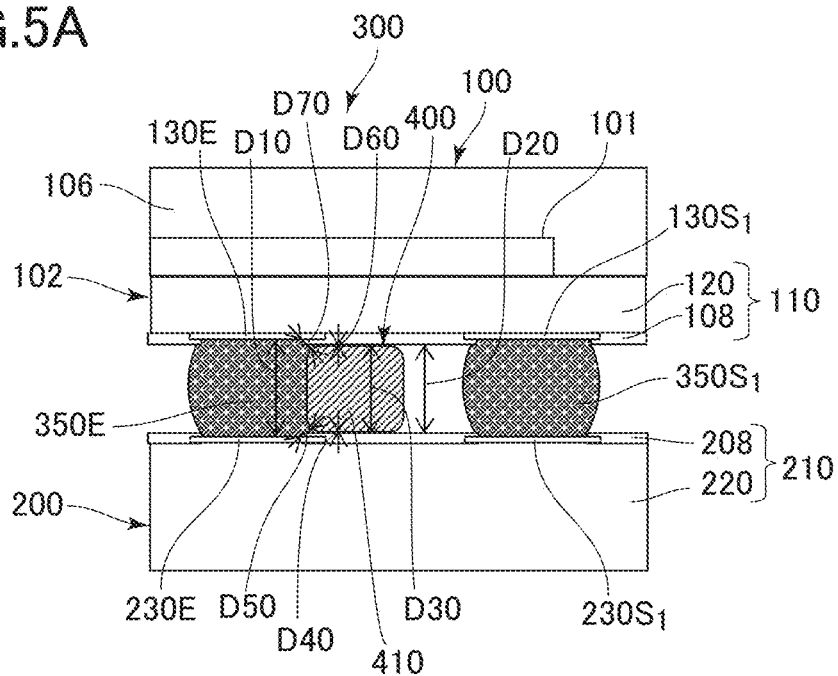
FIG. 5A is a cross-sectional view of the processing module of the first embodiment.
Figure 5B:
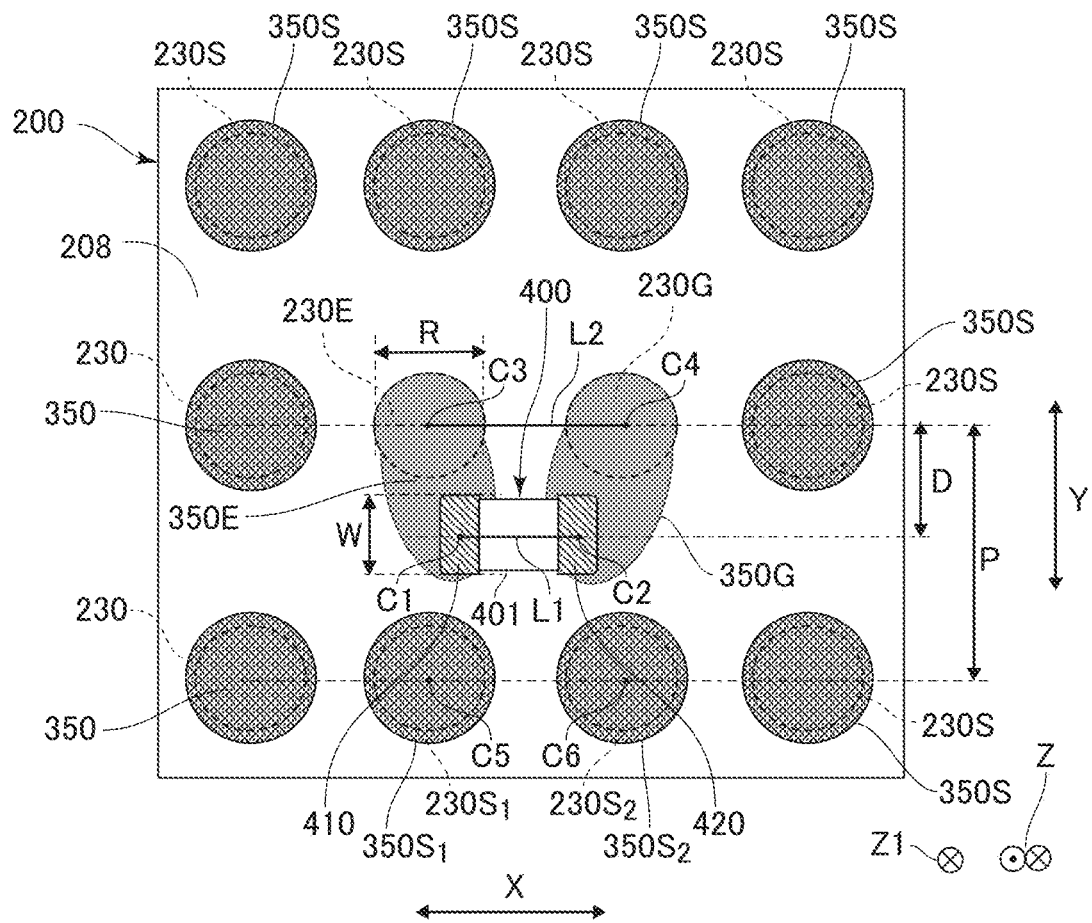
FIG. 5B is a cross-sectional view of the processing module of the first embodiment.

Each of FIGS. 5A and 5B is a cross-sectional view of the processing module 300 of the first embodiment. FIG. 5A illustrates a cross section of the processing module 300, taken along a VA-VA line of FIG. 3. FIG. 5B illustrates a cross section of the processing module 300, taken along a VB-VB line of FIG. 3.

The pad 230E of the wiring board 200 and the pad 130E of the package board 102 are bonded to each other via a bonding member 350E of the plurality of bonding members 350. The pad 230G of the wiring board 200 and the pad 130G of the package board 102 are bonded to each other via a bonding member 350G of the plurality of bonding members 350. The bonding member 350E is one example of a first bonding member, and the bonding member 350G is one example of a second bonding member.

The pads 230S of the wiring board 200 and the pads 130S of the package board 102 are bonded to each other via bonding members 350S of the plurality of bonding members 350. In particular, the pad 230S₁ of the wiring board 200 and the pad 130S₁ of the package board 102 are bonded to each other via a bonding member 350S₁ of the plurality of bonding members 350. In addition, the pad 230S₂ of the wiring board 200 and the pad 130S₂ of the package board 102 are bonded to each other via a bonding member 350S₂ of the plurality of bonding members 350.

Thus, the pads 130 are electrically connected to the pads 230 via the bonding members 350. That is, the pad 130E is electrically connected to the pad 230E via the bonding member 350E. The pad 130G is electrically connected to the pad 230G via the bonding member 350G. The pads 130S are electrically connected to the pads 230S via the bonding members 350S. In particular, the pad 130S₁ is electrically connected to the pad 230S₁ via the bonding member 350S₁. In addition, the pad 130S₂ is electrically connected to the pad 230S₂ via the bonding member 350S₂.

A distance D40 between an electrode 410 and the solder resist 208 is smaller than a distance D50 between the electrode 410 and the pad 230E. The electrode 410 may be in contact with the solder resist 208. If the electrode 410 is in contact with the solder resist 208, the distance D40 is zero. In addition, the distance between an electrode 420 and the solder resist 208 is smaller than the distance between the electrode 420 and the pad 230G. The electrode 420 may be in contact with the solder resist 208. If the electrode 420 is in contact with the solder resist 208, the distance between the electrode 420 and the solder resist 208 is zero.

A distance D60 between an electrode 410 and the solder resist 108 is smaller than a distance D70 between the electrode 410 and the pad 130E. The electrode 410 may be in contact with the solder resist 108. If the electrode 410 is in contact with the solder resist 108, the distance D60 is zero. In addition, the distance between the electrode 420 and the solder resist 108 is smaller than the distance between the electrode 420 and the pad 130G. The electrode 420 may be in contact with the solder resist 108. If the electrode 420 is in contact with the solder resist 108, the distance between the electrode 420 and the solder resist 108 is zero.

Preferably, the size of the electronic component 400 in a plan view is equal to or smaller than the 0402 size. For example, the size of the electronic component 400 in a plan view is the 0402 size, which is 0.4 mm×0.2 mm; or is the 0201 size, which is 0.25 mm×0.125 mm. Note that the notation of the 0402 size, the 0201 size, and the like conforms to the size notation (in millimeters) for electronic components defined in Japanese Industrial Standards.

The electronic component 400 includes an element body 401, the electrode 410, and the electrode 420. The element body 401 is formed like a substantially rectangular parallelepiped that extends in the longitudinal direction. The electrodes 410 and 420 are separated from each other in the longitudinal direction of the element body 401, and form a pair. The pair of the electrodes 410 and 420 is fixed to the element body 401 in a state where the electrodes 410 and 420 are separated from each other in the longitudinal direction. In FIG. 5B, the longitudinal direction of the electronic component 400, that is, the longitudinal direction of the element body 401 is parallel with the X direction. The lateral direction of the electronic component 400, that is, the lateral direction of the element body 401 is parallel with the Y direction. The Y direction is a direction orthogonal to the X direction, and is also the width direction of the electronic component 400, the width direction of the element body 401, the width direction of the electrode 410, and the width direction of the electrode 420. The Z direction is also the height direction of the electronic component 400, that is, the height direction of the element body 401. The Z direction is a direction orthogonal to the X direction and the Y direction. The Z direction is also a direction perpendicular to the main surfaces 121, 122, 221, and 222.

The electrode 410, which is one of the electrodes 410 and 420 that form a pair, is one example of a first electrode; and the electrode 420, which is the other of the electrodes 410 and 420, is one example of a second electrode. Each of the electrodes 410 and 420 includes a base material, and an outer coating that covers the base material. The material of the outer coating of each of the electrodes 410 and 420 is an electrically-conductive metal material, such as tin.

The electrode 410 of the electronic component 400 is in contact with the bonding member 350E. That is, the electrode 410 is bonded to the pad 230E and the pad 130E via the bonding member 350E. In this manner, the electrode 410 is electrically connected to the pad 230E and the pad 130E. In addition, the electrode 420 of the electronic component 400 is in contact with the bonding member 350G. That is, the electrode 420 is bonded to the pad 230G and the pad 130G via the bonding member 350G. In this manner, the electrode 420 is electrically connected to the pad 230G and the pad 130G. In such a connection structure, the electronic component 400 can function as a bypass capacitor for the semiconductor device 100, that is, for the semiconductor element 101.

Figure 6:
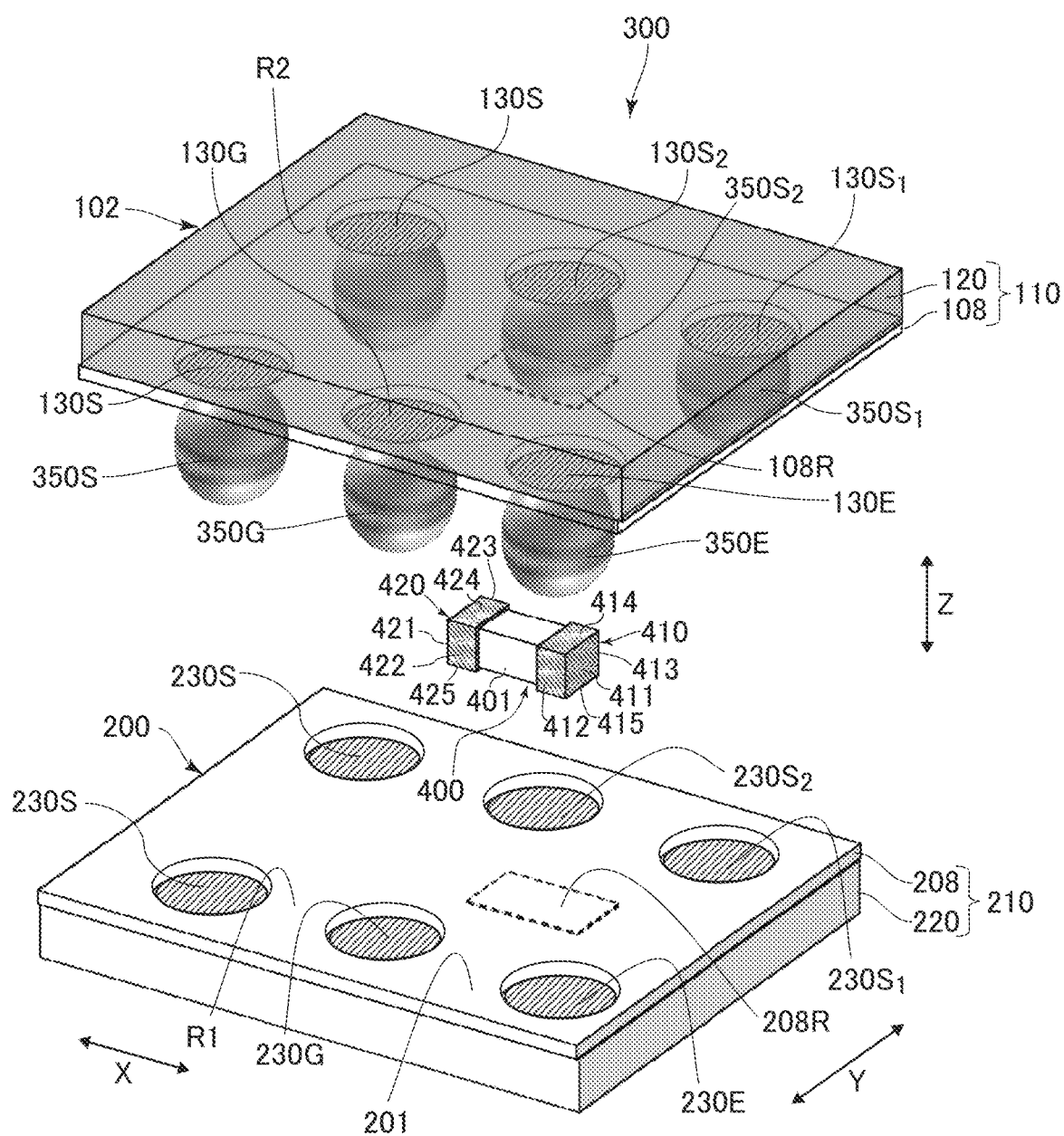
FIG. 6 is an exploded perspective view of the processing module of the first embodiment.

FIG. 6 is an exploded perspective view of the processing module 300 of the first embodiment. Note that in FIG. 6, one portion of the processing module 300 is illustrated as a translucent portion for convenience of description. The electronic component 400 is positioned on one area 108R of the insulating area R2 (of the mounting surface 103) formed by the solder resist 108, and on one area 208R of the insulating area R1 (of the mounting surface 201) formed by the solder resist 208. That is, the electrodes 410 and 420 are positioned on the area 108R, and on the area 208R. Each of the electrodes 410 and 420 of the electronic component 400 may be partly in contact with the area 208R, and may be partly in contact with the area 108R.

The electrode 410 has three side surfaces 411, 412, and 413, a top surface 414, and a bottom surface 415. Each of the surfaces 411 to 415 is an electrode surface. Each of the side surface 411, the side surface 412, the side surface 413, the top surface 414, and the bottom surface 415 is rectangular when viewed in a direction perpendicular to the surface. The two surfaces 412 and 413 of the three surfaces 411, 412, and 413 face each other in the Y direction, being spaced from each other. The top surface 414 and the bottom surface 415 face each other in the Z direction, being spaced from each other. The side surface 411 is in contact with the side surface 412, the side surface 413, the top surface 414, and the bottom surface 415; and is adjacent to the side surface 412, the side surface 413, the top surface 414, and the bottom surface 415 so as to be orthogonal to the surfaces.

The electrode 420 has three side surfaces 421, 422, and 423, a top surface 424, and a bottom surface 425. Each of the surfaces 421 to 425 is an electrode surface. Each of the side surface 421, the side surface 422, the side surface 423, the top surface 424, and the bottom surface 425 is rectangular when viewed in a direction perpendicular to the surface. The two surfaces 422 and 423 of the three surfaces 421, 422, and 423 face each other in the Y direction, being spaced from each other. The top surface 424 and the bottom surface 425 face each other in the Z direction, being spaced from each other. The side surface 421 is in contact with the side surface 422, the side surface 423, the top surface 424, and the bottom surface 425; and is adjacent to the side surface 422, the side surface 423, the top surface 424, and the bottom surface 425 so as to be orthogonal to the surfaces. The side surface 411 of the electrode 410 and the side surface 421 of the electrode 420 face each other in the X direction, being spaced from each other.

The top surface 414 of the electrode 410 faces a portion of the solder resist 108 in the Z direction. The portion of the solder resist 108 is in the vicinity of the pad 130E. The bottom surface 415 of the electrode 410 faces a portion of the solder resist 208 in the Z direction. The portion of the solder resist 208 is in the vicinity of the pad 230E.

The top surface 424 of the electrode 420 faces a portion of the solder resist 108 in the Z direction. The portion of the solder resist 108 is in the vicinity of the pad 130G. The bottom surface 425 of the electrode 420 faces a portion of the solder resist 208 in the Z direction. The portion of the solder resist 208 is in the vicinity of the pad 230G.

The electrodes 410 and 420 of the electronic component 400 are sandwiched between the insulator 210 and the insulator 110. That is, the electrodes 410 and 420 of the electronic component 400 are sandwiched between the solder resist 108 and the solder resist 208. The electronic component 400 may be in contact with at least one of the wiring board 200 and the semiconductor device 100. The top surface 414 of the electrode 410 may be in contact with the insulator 110, that is, with the solder resist 108; the bottom surface 415 of the electrode 410 may be in contact with the insulator 210, that is, with the solder resist 208. In addition, the top surface 424 of the electrode 420 may be in contact with the insulator 110, that is, with the solder resist 108; the bottom surface 425 of the electrode 420 may be in contact with the insulator 210, that is, with the solder resist 208.

When the semiconductor element 101 operates, the power supply noise is produced by the inductance and resistance of a line between the electrode 410 of the electronic component 400 and a power supply terminal of the semiconductor element 101, and by the inductance and resistance of a line between the electrode 420 of the electronic component 400 and a ground terminal of the semiconductor element 101.

The power supply noise is the fluctuation in voltage of the power supply line, produced by the semiconductor device 100 being operated. The fluctuation in voltage is caused by the change in power supply current, caused by the inductance and resistance that are parasitic on the power supply line.

For reducing the power supply noise, it is preferable to reduce the inductance and resistance of the line. For reducing the inductance and resistance of the line, it is necessary to dispose the electronic component 400, which functions as a bypass capacitor, at a position at which the electronic component 400 is made close to the semiconductor element 101 as much as possible. That is, it is necessary to shorten the line between the semiconductor element 101 and the electronic component 400, as much as possible.

In the first embodiment, since the electrode 410 of the electronic component 400 is electrically connected to the pad 130E of the package board 102 via the bonding member 350E, the inductance and resistance of the line between the electrode 410 of the electronic component 400 and the pad 130E of the package board 102 can be reduced.

In addition, since the electrode 420 of the electronic component 400 is electrically connected to the pad 130G of the package board 102 via the bonding member 350G, the inductance and resistance of the line between the electrode 420 of the electronic component 400 and the pad 130G of the package board 102 can be reduced.

Since the inductance and resistance of the line is reduced, the power supply noise produced by the operation of the semiconductor element 101 is reduced, and the speed of communication achieved by signals in the semiconductor device 100, or the semiconductor element 101, can be increased.

Preferably, when viewed in the Z direction, the electronic component 400 is positioned within an area surrounded by the outer shape of the semiconductor element 101. In this arrangement, since the line between the semiconductor element 101 and the electronic component 400 is shortened, the inductance and resistance of the line can be reduced, so that the power supply noise can be reduced.

Next, a method of manufacturing the processing module 300 will be described. FIGS. 7A to 9 are diagrams for illustrating the method of manufacturing the processing module 300 of the first embodiment. In each of FIGS. 7A to 9, a plan view of a member including the wiring board 200, and a cross-sectional view of the member including the wiring board 200 are illustrated. The plan view is a plan view of the member viewed in the Z1 direction; the cross-sectional view is a cross-sectional view taken along a D1-D1 line.

Figure 7A:
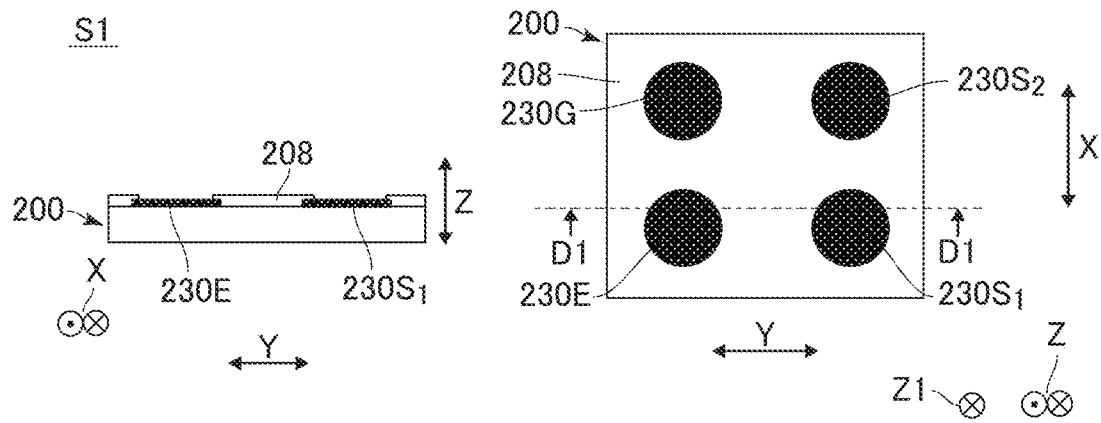
FIG. 7A is a diagram for illustrating a method of manufacturing the processing module of the first embodiment.

In a process S1 illustrated in FIG. 7A, the wiring board 200 is prepared. Note that in the process S1, the semiconductor device 100 and the electronic component 400 are also prepared, although not illustrated.

Figure 7B:
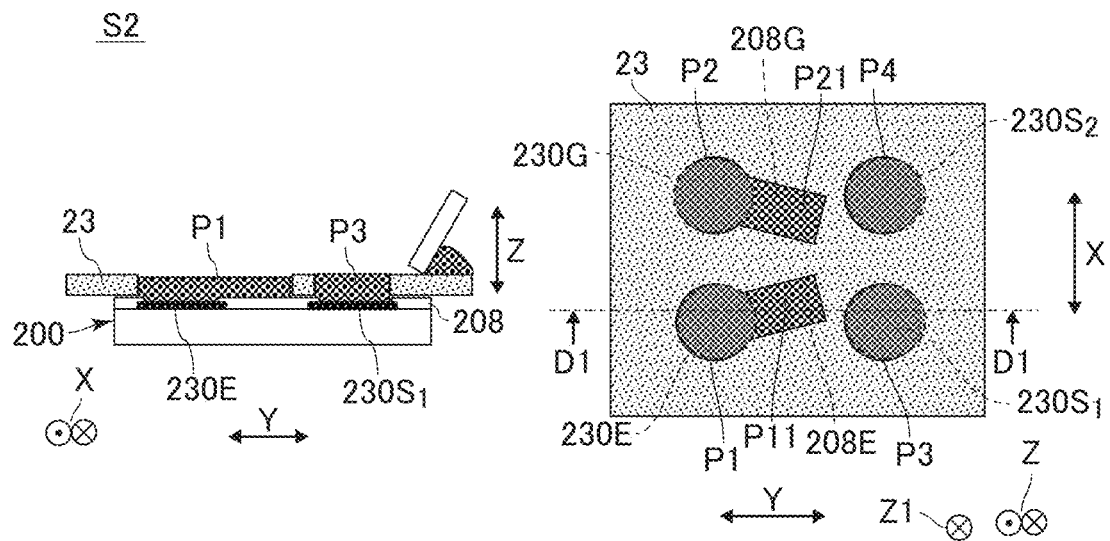
FIG. 7B is a diagram for illustrating the method of manufacturing the processing module of the first embodiment.

In a process S2 illustrated in FIG. 7B, a solder paste P1, a solder paste P2, a solder paste P3, and a solder paste P4 are supplied onto the wiring board 200, being spaced from each other. The solder paste P1 is one example of a first solder paste, and is supplied so as to extend from the top of the pad 230E to the top of a portion 208E of the solder resist 208. The solder paste P2 is one example of a second solder paste, and is supplied so as to extend from the top of the pad 230G to the top of a portion 208G of the solder resist 208. The solder paste P3 is one example of a third solder paste, and is supplied onto the pad $230S_1$. The solder paste P4 is one example of a fourth solder paste, and is supplied onto the pad $230S_2$.

Each of the solder pastes P1, P2, P3, and P4 contains solder powder, and flux component necessary for soldering. Preferably, the solder pastes P1, P2, P3, and P4 are made of the same material. However, the present disclosure is not limited to this. For example, the materials of the solder pastes P1, P2, P3, and P4 may be different from each other if the melting points of the materials are close to each other.

In the process S2, the solder pastes P1 to P4 are supplied onto the wiring board 200 in the screen printing that uses a mask 23. Note that the method of supplying the solder pastes P1 to P4 is not limited to the screen printing. For example, the solder pastes P1 to P4 may be supplied onto the wiring board 200 by using a dispenser.

Figure 7C:
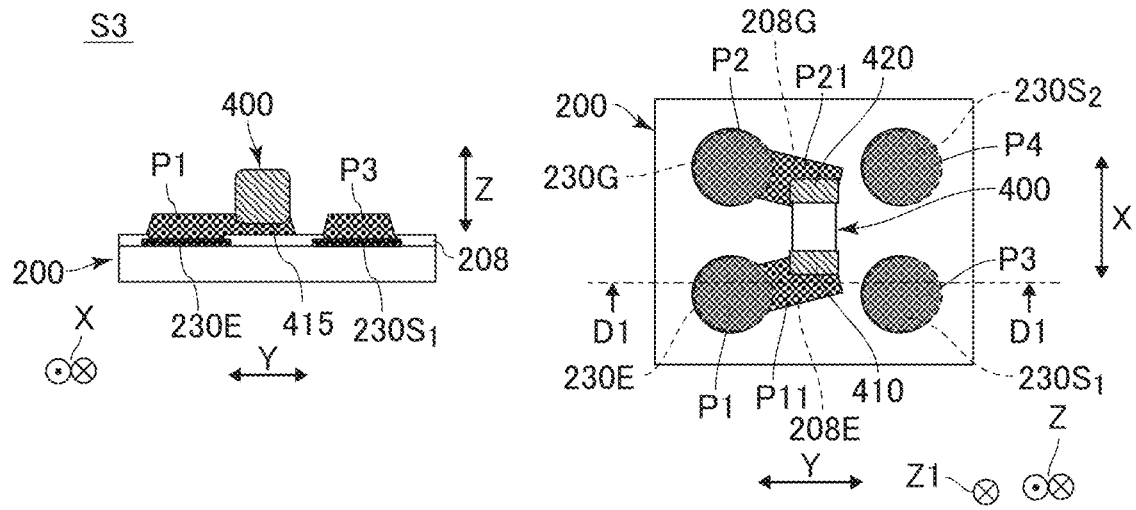
FIG. 7C is a diagram for illustrating the method of manufacturing the processing module of the first embodiment.

In a process S3 illustrated in FIG. 7C, the electronic component 400 is placed on the wiring board 200 such that the electrode 410 of the electronic component 400 contacts a portion P11 of the solder paste P1 supplied onto the portion 208E, and that the electrode 420 of the electronic component 400 contacts a portion P21 of the solder paste P2 supplied onto the portion 208G. In the process S3, the electronic component 400 is placed on the solder pastes P1 and P2 by using a mounter (not illustrated).

Figure 8A:
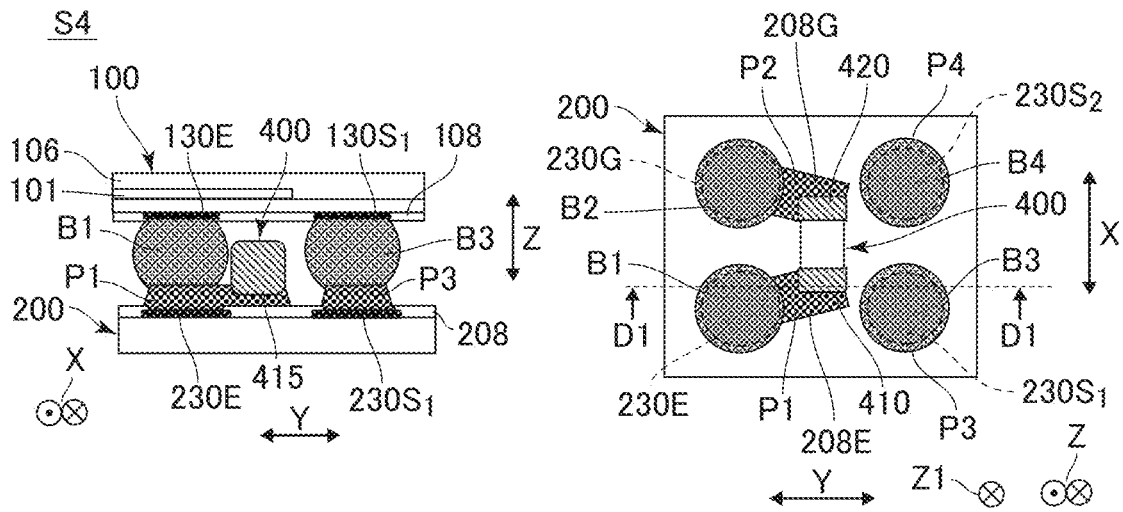
FIG. 8A is a diagram for illustrating the method of manufacturing the processing module of the first embodiment.

In a process S4 illustrated in FIG. 8A, the semiconductor device 100 is placed on the wiring board 200 such that the pad 130E faces the pad 230E, the pad 130G faces the pad 230G, the pad $130S_1$ faces the pad $230S_1$, and the pad $130S_2$ faces the pad 230S$_2$. In the process S4, the semiconductor device 100 is placed on the wiring board 200 by using a mounter (not illustrated).

Note that the pads 130E, 130G, 130S$_1$, and 130S$_2$ of the semiconductor device 100 are respectively provided with solder balls B1, B2, B3, and B4. That is, the semiconductor device 100 is a BGA semiconductor package. In the process S4, the semiconductor device 100 is placed on the wiring board 200, so that the solder balls B1, B2, B3, and B4 contact the solder pastes P1, P2, P3, and P4, respectively. However, when the semiconductor device 100 is placed on the wiring board 200, the solder balls B1, B2, B3, and B4 do not contact the electronic component 400. That is, the electronic component 400 is disposed at a position at which the electronic component 400 does not contact the solder balls B1, B2, B3, and B4 when the semiconductor device 100 is placed on the wiring board 200.

Then, the wiring board 200 on which the semiconductor device 100 and the electronic component 400 are placed is conveyed to a reflow furnace (not illustrated). In a process S5-1 illustrated in FIG. 8B, the ambient temperature in the reflow furnace is adjusted into a temperature equal to or higher than the melting point of the solder. In this manner, the solder balls B1 to B4 melt when heated. The solder balls B1 to B4 melt, and become fluid molten solders M1 to M4, respectively. The amounts of solder of the solder balls B1 to B4 are substantially equal to each other.

When the solder balls B1 to B4 melt, the semiconductor device 100 sinks toward a direction in which the semiconductor device 100 approaches the electronic component 400. As a result, the distance between the top surface 414 of the electrode 410 and the pad 130E is decreased, and the distance between the top surface 424 of the electrode 420 and the pad 130G is decreased.

Figure 8B:
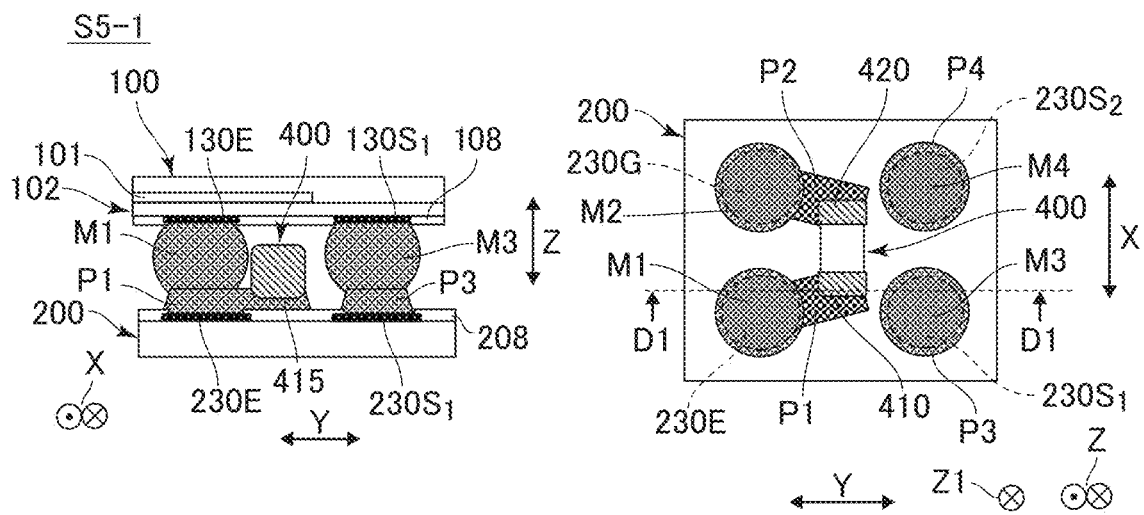
FIG. 8B is a diagram for illustrating the method of manufacturing the processing module of the first embodiment.
Figure 8C:
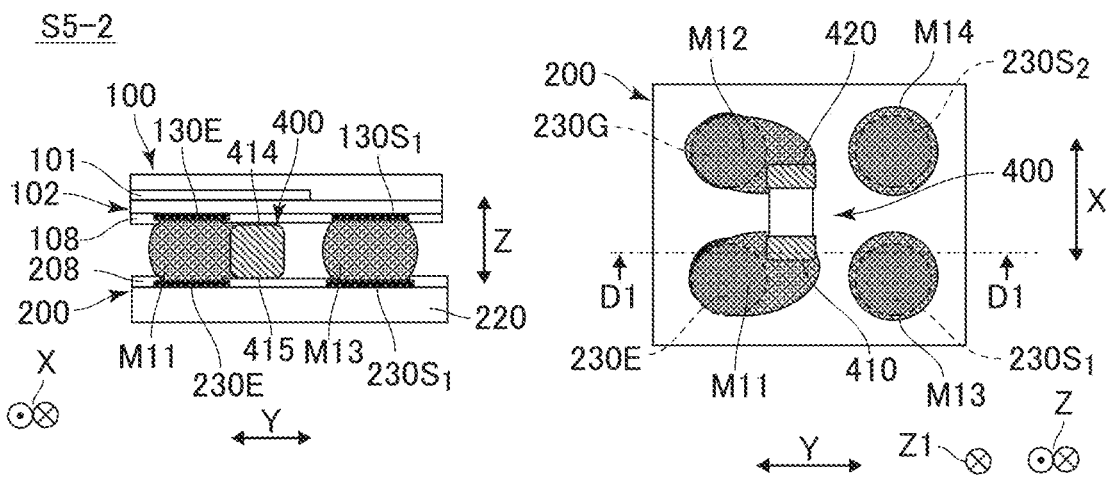
FIG. 8C is a diagram for illustrating the method of manufacturing the processing module of the first embodiment.

In a process S5-2 illustrated in FIG. 8C, the heating is continued, following the heating in the process S5-1. As a result, the solder pastes P1 to P4 melt. The solder pastes P1 to P4 melt into molten solders, and the molten solders aggregate on the respective pads 230E, 230G, 230S$_1$, and 230S$_2$.

The molten solder M1 and the molten solder, into which the solder paste P1 has melted, join with each other into a molten solder M11. In addition, the molten solder M2 and the molten solder, into which the solder paste P2 has melted, join with each other into a molten solder M12. In addition, the molten solder M3 and the molten solder, into which the solder paste P3 has melted, join with each other into a molten solder M13. In addition, the molten solder M4 and the molten solder, into which the solder paste P4 has melted, join with each other into a molten solder M14.

Note that since the molten solders M11 and M12 respectively aggregate on the pads 230E and 230G, the force is applied to the electronic component 400 in a direction in which the electronic component 400 approaches the pads 230E and 230G. However, the electronic component 400 is sandwiched between the insulator 210 of the wiring board 200 and the insulator 110 of the semiconductor device 100. That is, the electronic component 400 is pressed against the insulator 210 (the solder resist 208) of the wiring board 200, by the semiconductor device 100. In addition, the electronic component 400 is pressed against the insulator 110 (the solder resist 108) of the semiconductor device 100, by the wiring board 200. Thus, the frictional force that prevents the electronic component 400 from approaching the pads 230E and 230G is produced between the electronic component 400 and the semiconductor device 100, or between the electronic component 400 and the wiring board 200. As a result, the electronic component 400 hardly moves in the direction in which the electronic component 400 approaches the pads 230E and 230G. That is, even in a stage where the molten solders M11 and M12 are formed, the electrodes 410 and 420 of the electronic component 400 remain overlapping with the solder resists 108 and 208 in the Z direction. Note that the state where the electronic component 400 is pressed against the solder resists 108 and 208 is a state where the force is applied to the electronic component 400 from the solder resists 108 and 208. Thus, in the state, the electronic component 400 may not be directly in contact with the solder resist 108, and may not be directly in contact with the solder resist 208. For example, a solder may be formed between the electronic component 400 and the solder resist 108, and a solder may be formed between the electronic component 400 and the solder resist 208.

In the above-described processes S5-1 and S5-2, since the solder pastes P1 to P4 and the solder balls B1 to B4 melt when heated, the semiconductor device 100 sinks, and the electrodes 410 and 420 of the electronic component 400 contact the insulator 210 of the wiring board 200 and the insulator 110 of the package board 102. That is, the electrodes 410 and 420 of the electronic component 400 are sandwiched between the insulator 210 of the wiring board 200 and the insulator 110 of the semiconductor device 100.

In the first embodiment, the electrodes 410 and 420 of the electronic component 400 contact the solder resist 108 and the solder resist 208. That is, the electrodes 410 and 420 of the electronic component 400 are sandwiched between the solder resist 108 of the semiconductor device 100 and the solder resist 208 of the wiring board 200.

Figure 9:
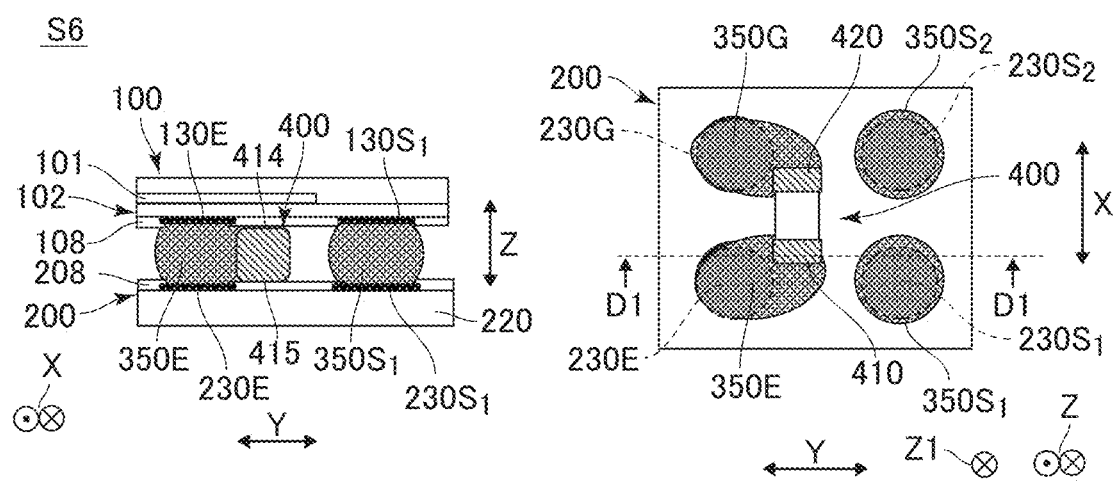
FIG. 9 is a diagram for illustrating the method of manufacturing the processing module of the first embodiment.

After that, in a process S6 illustrated in FIG. 9, the molten solders M11 to M14 are solidified by cooling the molten solders M11 to M14. The bonding member 350E is formed by solidifying the molten solder M11. In addition, the bonding member 350G is formed by solidifying the molten solder M12. In addition, the bonding member 350S$_1$ is formed by solidifying the molten solder M13. In addition, the bonding member 350S$_2$ is formed by solidifying the molten solder M14. Even in a stage where the bonding members 350E and 350G are formed by solidifying the molten solders M11 and M12, the electrodes 410 and 420 of the electronic component 400 remain overlapping with the solder resists 108 and 208 in the Z direction.

Through the above-described processes S1 to S6, the processing module 300 is manufactured. After that, the processing module 300 is disposed in the housing 611 illustrated in FIG. 1, so that the camera body 601, that is, the digital camera 600 is manufactured.

In the processing module 300 manufactured in this manner, the electrode 410 of the electronic component 400 is in contact with the insulator 210 directly or via solder, and thus is not directly in contact with the pad 230E. In addition, the electrode 410 of the electronic component 400 is in contact with the insulator 110 directly or via solder, and thus is not directly in contact with the pad 130E. In addition, the electrode 420 of the electronic component 400 is in contact with the insulator 210 directly or via solder, and thus is not directly in contact with the pad 230G. In addition, the electrode 420 of the electronic component 400 is in contact with the insulator 110 directly or via solder, and thus is not directly in contact with the pad 130G. Furthermore, in the first embodiment, when viewed in the Z direction, the whole of the electrodes 410 and 420 of the electronic component 400 overlaps with the solder resists 208 and 108.

That is, in the first embodiment, the electrodes 410 and 420 of the electronic component 400 are disposed between the package board 102 and the wiring board 200 in a state where the electrodes 410 and 420 of the electronic component 400 are sandwiched between the insulator 110 of the package board 102 and the insulator 210 of the wiring board 200.

In the first embodiment, when the solder balls B1 to B4 melt in the manufacturing process of the processing module 300, the molten solder wets and spreads on the pads 230E and 230G of the wiring board 200, so that the semiconductor device 100 sinks from the position in which the semiconductor device 100 is located before the solder melts. When the semiconductor device 100 sinks, the electronic component 400 serves as a spacer, and regulates the sinking of the semiconductor device 100. In this manner, the distance between the semiconductor device 100 and the wiring board 200 in the Z direction is prevented from becoming smaller than the height of the electronic component 400 in the Z direction. Thus, the possibility that the bonding members 350E and 350G are crushed is reduced. As a result, the possibility that the short-circuit failure occurs between the bonding member 350E and the bonding member $350S_1$ is reduced, and the possibility that the short-circuit failure occurs between the bonding member 350G and the bonding member $350S_2$ is reduced.

In addition, in the first embodiment, in the processes S5-1 and S5-2, the possibility that the molten solder in contact with the pads 230E and 130E is pushed out by the volume of a portion of the electronic component 400 (the portion includes the electrode 410) is reduced. Thus, in the processing module 300 manufactured in this manner, the possibility that the short-circuit failure occurs between the bonding member 350E and the bonding member $350S_1$ is reduced. In addition, in the processes S5-1 and S5-2, the possibility that the molten solder in contact with the pads 230G and 130G is pushed out by the volume of a portion of the electronic component 400 (the portion includes the electrode 420) is reduced. Thus, in the processing module 300 manufactured in this manner, the possibility that the short-circuit failure occurs between the bonding member 350G and the bonding member $350S_2$ is reduced.

If one portion of the electronic component 400 is buried in a swollen portion of the bonding member 350E, that is, if one portion of the electronic component 400 overlaps with the pad 230E when viewed in the Z direction, the maximum diameter of the swollen portion of the bonding member 350E is increased by the volume of the one portion of the electronic component 400. In the first embodiment, however, the electrode 410 of the electronic component 400 does not overlap with the pad 230E when viewed in the Z direction. Thus, the possibility that the one portion of the electronic component 400 is buried in the swollen portion of the bonding member 350E can be eliminated or reduced. Thus, it is possible that when viewed in the Z direction, the maximum diameter of the swollen portion of the bonding member 350E is made smaller than the maximum diameter of a swollen portion of the bonding member $350S_1$. As a result, the possibility that the short-circuit failure occurs between the bonding member 350E and the bonding member $350S_1$ is reduced.

In addition, it is possible that when viewed in the Z direction, the maximum diameter of a swollen portion of the bonding member 350G is made smaller than the maximum diameter of a swollen portion of the bonding member $350S_2$. As a result, the possibility that the short-circuit failure occurs between the bonding member 350G and the bonding member $350S_2$ is reduced. Note that the swollen portion of each of the bonding members 350E and 350G does not include a fillet-shaped portion. In addition, the shape of a cross section of the swollen portion of each of the bonding members 350E, 350G, $350S_1$, and $350S_2$, taken along an XY plane, is substantially circular.

In the first embodiment, as illustrated in FIG. 5A, a distance D10 between the pad 230E and the pad 130E in the Z direction is larger than a distance D20 between the insulator 210 and the insulator 110 in the Z direction. The distance D20 is also the distance between the solder resist 208 and the solder resist 108 in the Z direction. In addition, if the electrode 410 is in contact with the solder resist 208 and the solder resist 108, the distance D20 is equal to a height D30 of the electrode 410 in the Z direction.

As described above, since the electronic component 400 is not directly in contact with the pads 230E, 230G, 130E, and 130G, the distance between the wiring board 200 and the package board 102 can be set at a proper distance in the heating processes of S5-1 and S5-2. Thus, the possibility that the bonding member 350E is crushed is reduced, and the possibility that the short-circuit failure occurs between the bonding member 350E and the bonding member $350S_1$ is reduced. Similarly, the distance between the wiring board 200 and the package board 102 can be set at a proper distance, by the electronic component 400, in the heating processes of S5-1 and S5-2. Thus, the possibility that the bonding member 350G is crushed is reduced, and the possibility that the short-circuit failure occurs between the bonding member 350G and the bonding member $350S_2$ is reduced.

In addition, as illustrated in FIG. 5B, when viewed in the Z direction, a virtual line-segment L1 from a center C1 of the electrode 410 of the electronic component 400 to a center C2 of the electrode 420 of the electronic component 400 does not overlap with a virtual line-segment L2 from a center C3 of the pad 230E to a center C4 of the pad 230G. The virtual line-segment L1 is one example of a first virtual line-segment, and is a straight line-segment. The virtual line-segment L2 is one example of a second virtual line-segment, and is a straight line-segment. As described above, the shape of a cross section of the swollen portion of each of the bonding members 350, taken along an XY plane, is substantially circular. Since the virtual line-segment L2 is shifted from the virtual line-segment L1 in this manner, a maximum diameter R of the swollen portion of each of the bonding members 350E and 350G, obtained in an XY plane, can be made smaller than the maximum diameter of the swollen portion of each of the bonding members 350S (to which the electronic component 400 is not connected), obtained in an XY plane. As a result, the possibility that the short-circuit failure occurs in each of the bonding members 350E and 350G is effectively reduced.

In the first embodiment, the virtual line-segment L1 is shifted from the virtual line-segment L2 in the Y direction. Thus, the possibility that the short-circuit failure occurs in each of the bonding members 350E and 350G is more effectively reduced.

In addition, in the first embodiment, when viewed in the Z direction, a shortest distance D between the virtual line-segment L1 and the virtual line-segment L2 is preferably smaller than a pitch P between the pad 230E and the pad $230S_1$ in the Y direction. For example, the pitch P is equal to or smaller than 0.7 mm.

Thus, the possibility that the short-circuit failure occurs between the bonding member 350E and the bonding member $350S_1$ is effectively reduced. Similarly, when viewed in the Z direction, the shortest distance D between the virtual line-segment L1 and the virtual line-segment L2 is preferably smaller than a pitch between the pad 230G and the pad 230S$_2$ in the Y direction. Thus, the possibility that the short-circuit failure occurs between the bonding member 350G and the bonding member 350S$_2$ is effectively reduced. Note that in the example illustrated in FIG. 5B, the virtual line-segment L1 and the virtual line-segment L2 are parallel to each other. Thus, the shortest distance D is the distance between the virtual line-segment L1 and the virtual line-segment L2 in the Y direction. In addition, when viewed in the Z direction, the pitch P is the distance between the center C3 of the pad 230E and a center C5 of the pad 230S$_1$. In addition, when viewed in the Z direction, the pitch P is the distance between the center C4 of the pad 230G and a center C6 of the pad 230S$_2$.

More preferably, the shortest distance D is equal to or smaller than half the pitch P. That is, when viewed in the Z direction, the electrode 410 of the electronic component 400 is preferably closer to the pad 230E than to the pad 230S$_1$. Similarly, when viewed in the Z direction, the electrode 420 of the electronic component 400 is preferably closer to the pad 230G than to the pad 230S$_2$. Thus, the possibility that the short-circuit failure occurs in each of the bonding members 350E and 350G is more effectively reduced.

In addition, when viewed in the Z direction, the shortest distance D between the virtual line-segment L1 and the virtual line-segment L2 is preferably larger than half a width W of the electrode 410 in the width direction. The width direction is also the lateral direction of the electronic component 400. Thus, the possibility that the short-circuit failure occurs in the bonding member 350E is more effectively reduced. Note that since the width of the electrode 420 is equal to the width of the electrode 410, the possibility that the short-circuit failure occurs in the bonding member 350G is more effectively reduced.

In summary, it is preferable to satisfy the relationship of W/2<D<P, and it is more preferable to satisfy the relationship of W/2<D<P/2.

By satisfying the above-described relationship, the electrodes 410 and 420 of the electronic component 400 are reliably bonded to the bonding members 350E and 350G, respectively. In addition, the possibility that the short-circuit failure occurs between the bonding member 350E and the bonding member 350S$_1$ and between the bonding member 350G and the bonding member 350S$_2$ is reduced.

If the shortest distance D is equal to or smaller than half the width W when viewed in the Z direction, the electrodes 410 and 420 are moved by the aggregation force of the molten solders M11 and M12, so as to overlap with the pads 230E and 230G. In this case, the diameter of each of the bonding members 350E and 350G increases easily. In addition, if the distance D is equal to or larger than the pitch P, the electronic component 400 is located too close to the pads 230S$_1$ and 230S$_2$.

In addition, it is preferable that the pitch P and the height D30 of the electronic component 400 in the Z direction satisfy the relationship of P/4<D30<P. Note that the height D30 of the electronic component 400 in the Z direction is the height of the electrode 410 in the Z direction. The height of the electrode 420 in the Z direction is equal to the height of the electrode 410 in the Z direction.

That is, the height D30 of the electronic component 400 is preferably larger than one quarter of the pitch P between the pad 230E and the pad 230S$_1$. In addition, the height D30 of the electronic component 400 is preferably smaller than the pitch P between the pad 230E and the pad 230S$_1$.

For example, if the pitch P is 0.4 mm, it is preferable that the electronic component 400 have the 0402 size in which the height D30 is 0.2 mm, or the 0201 size in which the height D30 is 0.125 mm.

Since the height D30 of the electronic component 400 is smaller than the pitch P, the possibility that the open-circuit failure occurs in the bonding members 350E and 350G is reduced even if the electronic component 400 is disposed between the wiring board 200 and the package board 102.

In addition, since the height D30 of the electronic component 400 is larger than one quarter of the pitch P, the amount of sinking of the semiconductor device 100 is reduced, so that the possibility that the short-circuit failure occurs in the bonding members 350E and 350G is effectively reduced.

Figure 10:
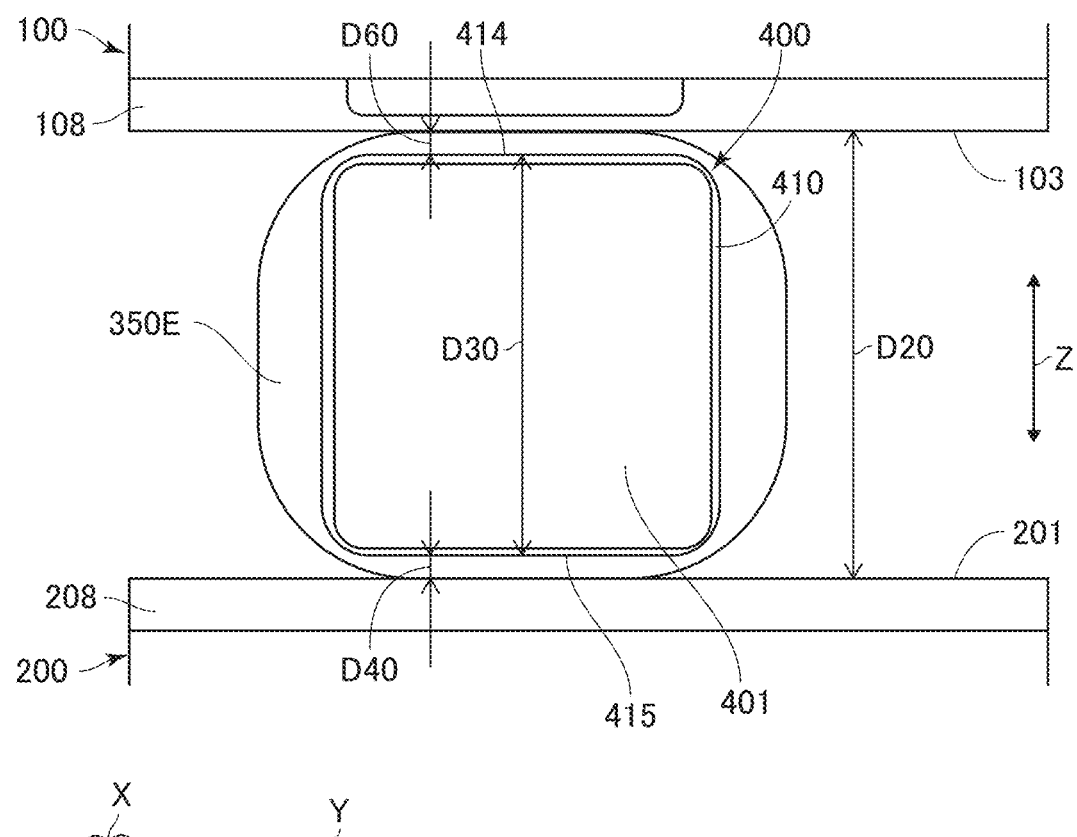
FIG. 10 is an enlarged cross-sectional view of the electronic component and its surroundings of the first embodiment.

FIG. 10 is one example of an enlarged cross-sectional view of the electronic component 400 and its surroundings, illustrated in FIG. 5A. As illustrated in FIG. 10, one portion of the bonding member 350E may exist between the electrode 410 and the solder resist 208. Thus, the electrode 410 may be separated from the solder resist 208 via the bonding member 350E. In this case, the thickness of the bonding member 350E formed between the bottom surface 415 of the electrode 410 and the solder resist 208 is equal to the distance D40 between the electrode 410 and the solder resist 208. Similarly, as illustrated in FIG. 10, one portion of the bonding member 350E may exist between the electrode 410 and the solder resist 108. Thus, the electrode 410 may be separated from the solder resist 108 via the bonding member 350E. In this case, the thickness of the bonding member 350E formed between the top surface 414 of the electrode 410 and the solder resist 108 is equal to the distance D60 between the electrode 410 and the solder resist 108.

As can be understood from FIGS. 5A and 10, the distance D40 between the electrode 410 and the solder resist 208 is smaller than the height D30 of the electronic component 400. The height D30 of the electronic component 400 is preferably 0.125 mm. Thus, the distance D40 between the electrode 410 and the solder resist 208 is preferably smaller than 0.125 mm, for example. The distance D40 between the electrode 410 and the solder resist 208 is preferably equal to or smaller than 100 and is more preferably equal to or smaller than 50 Similarly, the distance between the electrode 420 and the solder resist 208 is smaller than 0.125 mm, for example. The distance between the electrode 420 and the solder resist 208 is preferably equal to or smaller than 100 and is more preferably equal to or smaller than 50 μm.

As can be understood from FIGS. 5A and 10, the distance D60 between the electrode 410 and the solder resist 108 is smaller than the height D30 of the electronic component 400. The height D30 of the electronic component 400 is preferably 0.125 mm. Thus, the distance D60 between the electrode 410 and the solder resist 108 is preferably smaller than 0.125 mm, for example. The distance D60 between the electrode 410 and the solder resist 108 is preferably equal to or smaller than 100 and is more preferably equal to or smaller than 50 Similarly, the distance between the electrode 420 and the solder resist 108 is smaller than 0.125 mm, for example. The distance between the electrode 420 and the solder resist 108 is preferably equal to or smaller than 100 and is more preferably equal to or smaller than 50 μm.

As can be understood from FIGS. 5A and 10, the distance D40 between the electrode 410 and the solder resist 208 is smaller than half the height D30 of the electronic component 400. Similarly, the distance between the electrode 420 and the solder resist 208 is smaller than half the height D30 of the electronic component 400.

In addition, as can be understood from FIGS. 5A and 10, the distance D60 between the electrode 410 and the solder resist 108 is smaller than half the height D30 of the electronic component 400. Similarly, the distance between the electrode 420 and the solder resist 108 is smaller than half the height D30 of the electronic component 400.

In addition, each of the distance between the electrode 410 and the wiring board 200 and the distance between the electrode 420 and the wiring board 200 is preferably equal to or smaller than 50 Specifically, each of the distance D40 between the electrode 410 and the solder resist 208 and the distance between the electrode 420 and the solder resist 208 is preferably equal to or smaller than 50 µm.

In addition, each of the distance between the electrode 410 and the semiconductor device 100 and the distance between the electrode 420 and the semiconductor device 100 is preferably equal to or smaller than 50 Specifically, each of the distance D60 between the electrode 410 and the solder resist 108 and the distance between the electrode 420 and the solder resist 108 is preferably equal to or smaller than 50 µm.

In addition, as can be understood from FIGS. 5A and 10, the height D30 of the electrode 410 of the electronic component 400 in the Z direction is larger than each of the distance between the electronic component 400 and the wiring board 200 and the distance between the electronic component 400 and the semiconductor device 100. Similarly, the height of the electrode 420 of the electronic component 400 in the Z direction is larger than each of the distance between the electronic component 400 and the wiring board 200 and the distance between the electronic component 400 and the semiconductor device 100.

In addition, as can be understood from FIG. 3, the distance between the electrode 410 and the solder resist 208 is smaller than the distance between the element body 401 and the solder resist 108, and the distance between the electrode 410 and the solder resist 108 is smaller than the distance between the element body 401 and the solder resist 208.

As described above, in the processing module 300 of the first embodiment, the possibility of the open-circuit failure and the short-circuit failure is reduced, and the bonding members 350E and 350G can be formed stably. In addition, since the electrodes 410 and 420 of the electronic component 400 are disposed, sandwiched between the insulator 210 and the insulator 110, the amount of sinking of the semiconductor device 100 in the Z direction is reduced (the semiconductor device 100 sinks when the solder melts). Thus, the possibility that the bonding members 350E and 350G are crushed is reduced.

Furthermore, since the electronic component 400 is disposed such that the virtual line-segment L1 and the virtual line-segment L2 are shifted from each other, the electrodes 410 and 420 of the electronic component 400 are respectively not drawn into the vicinity of the center C3 of the pad 230E and the vicinity of the center C4 of the pad 230G. In such a configuration, the maximum diameter R of each of the bonding members 350E and 350G, viewed in the Z direction, is decreased. As a result, the possibility that the short-circuit failure occurs in the bonding members 350E and 350G is reduced, and the bonding members 350E and 350G can be formed stably. Therefore, the yield of the manufactured processing modules 300 is increased.

First Modification of First Embodiment

Figure 11A:
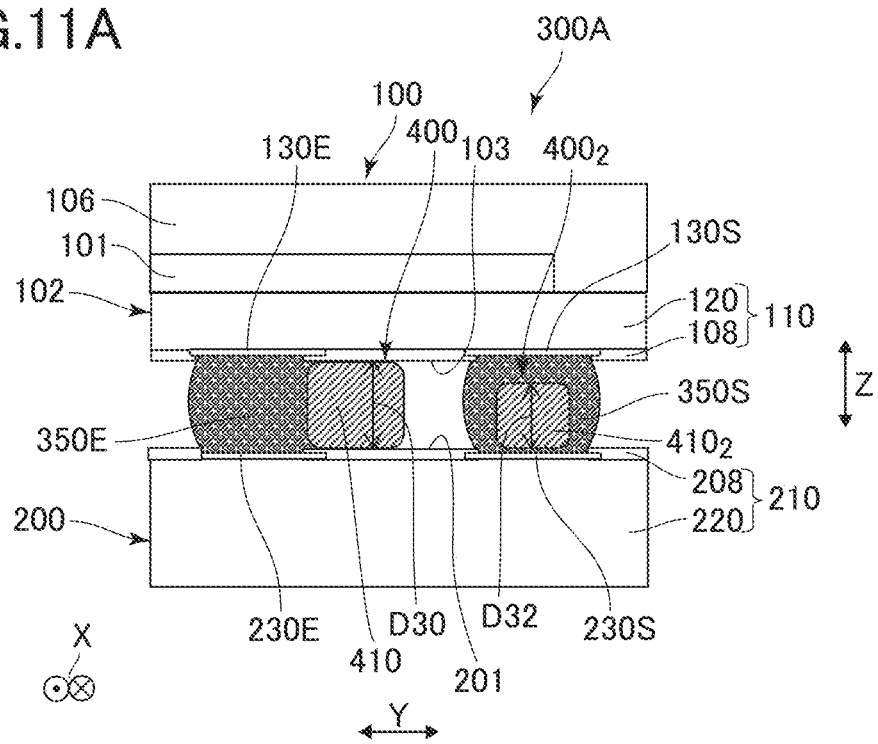
FIG. 11A is a cross-sectional view of a processing module of a first modification of the first embodiment.

FIG. 11A is a cross-sectional view of a processing module 300A of a first modification of the first embodiment. In the first modification, a component identical to a component of the first embodiment is given a symbol identical to the symbol of the component of the first embodiment, and the detailed description thereof will be omitted.

The processing module 300A includes a semiconductor device 100, a wiring board 200, and a plurality of electronic components. An electronic component 400 and an electronic component $400_2$ of the plurality of electronic components are disposed between a package board 102 of the semiconductor device 100 and the wiring board 200. The electronic component 400 has the structure described in the first embodiment, and the electronic component $400_2$ is an electronic component having a size smaller than the size of the electronic component 400. The electronic component 400 is one example of a first electronic component, and the electronic component $400_2$ is one example of a second electronic component. Each of the electronic components 400 and $400_2$ is a passive component. Each of the electronic components 400 and $400_2$ is a chip component, and is surface-mounted on a mounting surface 201 of the wiring board 200 and a mounting surface 103. For example, the electronic component 400 has the 0402 size, and the electronic component $400_2$ has the 0201 size smaller than the 0402 size. A height D32 of the electronic component $400_2$ in the Z direction is smaller than a height D30 of the electronic component 400 in the Z direction. The height D30 of the electronic component 400 is also the height of an electrode 410 of the electronic component 400. The electronic component $400_2$ has two electrodes. The height D32 of the electronic component $400_2$ is also the height of the electrodes of the electronic component $400_2$.

The electrode 410 of the electronic component 400 is bonded to a pad 230E and a pad 130E via a bonding member 350E. An electrode 4102 that is one of the two electrodes of electronic component $400_2$ is bonded to a pad 230S and a pad 130S via a bonding member 350S. The electrode 410 of the electronic component 400 overlaps with at least one (both in the present modification) of the solder resist 108 and the solder resist 208 in the Z direction. In contrast, the electrode 4102, which is one of the two electrodes of the electronic component $400_2$, overlaps with at least one (both in the present modification) of the pad 230S and the pad 130S in the Z direction. That is, the electrode 4102, which is one of the two electrodes of the electronic component $400_2$, is positioned on at least one (both in the present modification) of the pad 230S and the pad 130S. The electrode 4102, which is one of the two electrodes of the electronic component $400_2$, may not overlap with at least one (both in the present modification) of the solder resist 108 and the solder resist 208. The same holds true for the other electrode of the two electrodes of the electronic component $400_2$.

In this manner, the two or more electronic components 400 and $400_2$, which have sizes different from each other, may be disposed between the wiring board 200 and the package board 102. The electronic component $400_2$ has a volume smaller than the volume of the electronic component 400. Thus, even if one portion of the electronic component $400_2$ is buried in the bonding member 350S, the possibility that the short-circuit failure occurs between the bonding members 350S and a bonding member (e.g., the bonding member 350E) adjacent to the bonding members 350S is reduced. Note that the force that causes the semiconductor device 100 to press the electronic component $400_2$, whose height is smaller than the height of the electronic component 400, against the wiring board 200 is smaller than the force that causes the semiconductor device 100 to press the electronic component 400 against the wiring board 200 (the force that causes the semiconductor device 100 to press the electronic component $400_2$ against the wiring board 200 may be zero). In addition, the force that causes the wiring board 200 to press the electronic component $400_2$, whose height is smaller than the height of the electronic component 400, against the semiconductor device 100 is smaller than the force that causes the wiring board 200 to press the electronic component 400 against the semiconductor device 100 (the force that causes the wiring board 200 to press the electronic component $400_2$ against the semiconductor device 100 may be zero). Thus, even if the electrode 4102 overlaps with the solder resists 108 and 208 in the Z direction before the reflow process, the electrode 4102 can be drawn by the molten solder, which will become the bonding member 350S, and can be moved onto the pads 230S and 130S.

Second Modification of First Embodiment

Figure 11B:
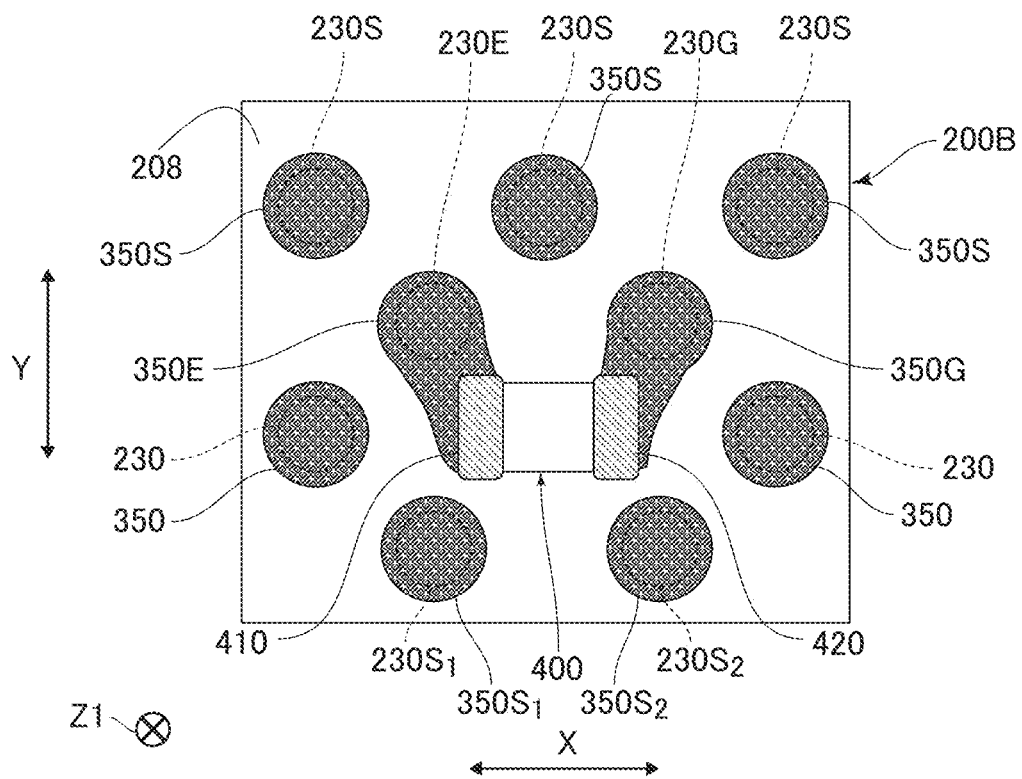
FIG. 11B is a diagram for illustrating a wiring board included in a processing module of a second modification of the first embodiment.

FIG. 11B is a diagram for illustrating a wiring board 200B included in a processing module of a second modification of the first embodiment. In the second modification, a component identical to a component of the first embodiment is given a symbol identical to the symbol of the component of the first embodiment, and the detailed description thereof will be omitted.

The processing module of the second modification includes a semiconductor device (not illustrated), a wiring board 200B, and a plurality of electronic components. The plurality of electronic components includes an electronic component 400. The electronic component 400 is disposed between a package board of the semiconductor device and the wiring board 200B. The wiring board 200B includes a plurality of pads 230 spaced from each other, and a solder resist 208. In the second modification, the arrangement pattern of the plurality of pads 230 is different from the arrangement pattern of the plurality of pads 230 of the first embodiment.

That is, in the second modification, the plurality of pads 230 is arranged in a staggered pattern. Note that although not illustrated, a plurality of pads included in the package board of the semiconductor device is also arranged in a staggered pattern. The plurality of pads of the semiconductor device and the plurality of pads 230 of the wiring board 200B are bonded to each other via a plurality of bonding members 350.

The plurality of pads 230 includes a pad 230E, a pad 230G, and a plurality of pads 230S. The plurality of pads 230S includes a pad $230S_1$ and a $230S_2$. The plurality of bonding members 350 includes a bonding member 350E, a bonding member 350G, and a plurality of bonding members 350S. The plurality of bonding members 350S includes a bonding member $350S_1$ and a bonding member 350S 2. The electrode 410 of the electronic component 400 is bonded to the pad 230E via the bonding member 350E. The electrode 420 of the electronic component 400 is bonded to the pad 230G via the bonding member 350G. As in the first embodiment, when viewed in the Z direction, the electronic component 400 is in contact with the solder resist 208, and does not overlap with the pads 230E and 230G.

Thus, as in the first embodiment, even if the plurality of pads 230 is arranged in a staggered pattern, the possibility that the short-circuit failure occurs between the bonding member 350E and the bonding member $350S_1$ is reduced, and the possibility that the short-circuit failure occurs between the bonding member 350G and the bonding member $350S_2$ is reduced.

Second Embodiment

Figure 12:
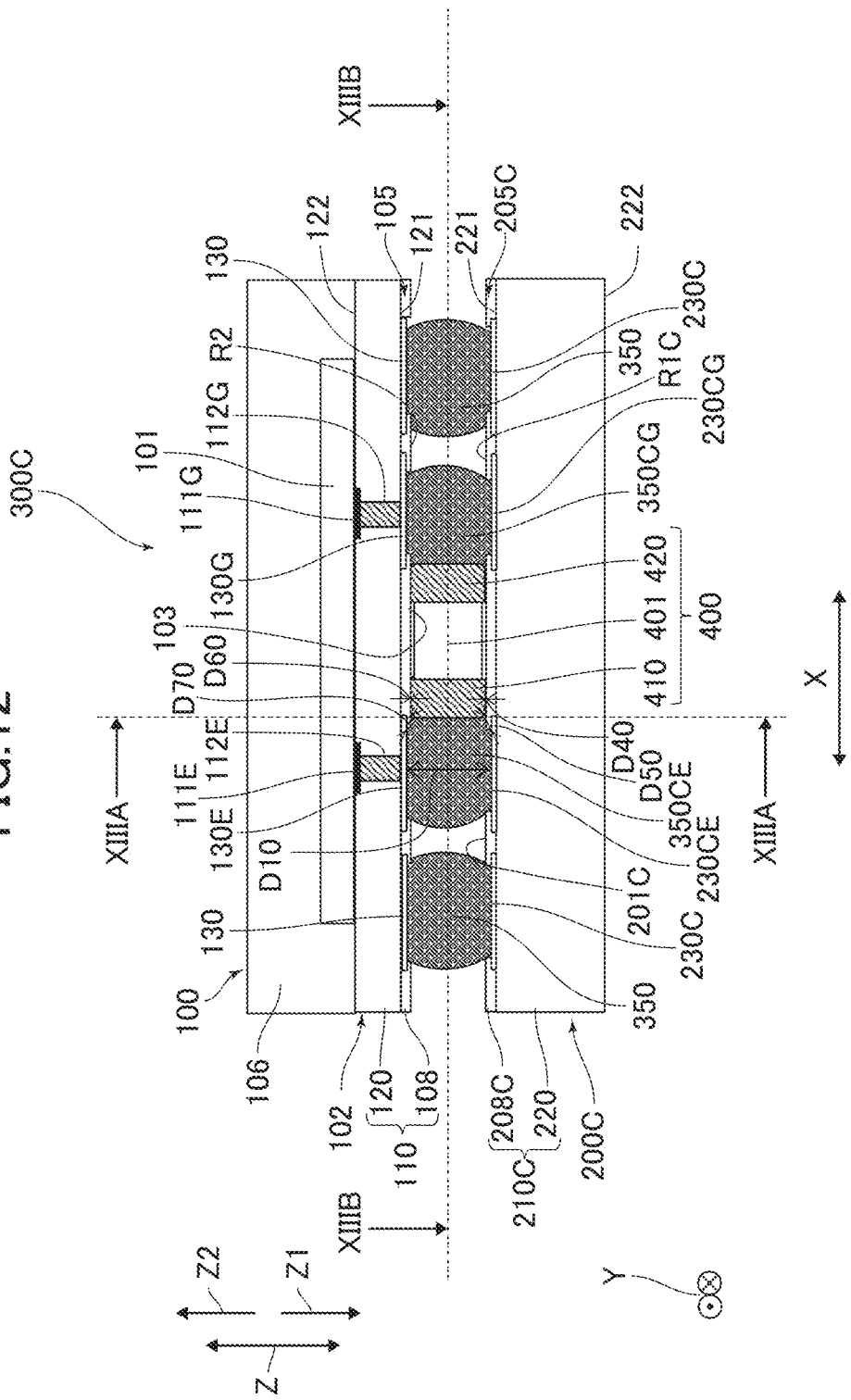
FIG. 12 is a cross-sectional view of a processing module of a second embodiment.

Next, an electronic module included in an electronic apparatus of a second embodiment will be described. FIG. 12 is a cross-sectional view of a processing module 300C that is one example of an electronic module of the second embodiment. FIG. 12 illustrates one portion of a cross section of the processing module 300C. For example, the electronic apparatus of the second embodiment is a digital camera, which is an image pickup apparatus. In the digital camera of the second embodiment, the processing module 300 of the digital camera 600 of the first embodiment is replaced with the processing module 300C. Since the configuration of the digital camera of the second embodiment except the processing module 300C is the same as the configuration of the processing module 300 of the digital camera 600 of the first embodiment except the processing module 300, the description thereof will be omitted. In addition, a component of the processing module 300C identical to a component of the processing module 300 is given a symbol identical to the symbol of the component of the first embodiment, and the description thereof will be omitted.

The processing module 300C includes a wiring board 200C, a semiconductor device 100, and an electronic component 400. The wiring board 200C is one example of a first wiring component, and the semiconductor device 100 is one example of a second wiring component. In the second embodiment, the semiconductor device 100 is an integrated-circuit component. The wiring board 200C includes a mounting surface 201C. The mounting surface 201C is one example of a first mounting surface. The semiconductor device 100 and the electronic component 400 are mounted on the mounting surface 201C.

The semiconductor device 100 is bonded to the wiring board 200C via a plurality of bonding members 350. The semiconductor device 100 is an area-array semiconductor package. In the second embodiment, the semiconductor device 100 is a BGA semiconductor package. The wiring board 200C is a printed wiring board, and is also a rigid wiring board. Note that although not illustrated, a power supply circuit is mounted on the wiring board 200C. The power supply circuit supplies electric power to the semiconductor device 100 via the wiring board 200C. The semiconductor device 100 includes a mounting surface 103 that faces the mounting surface 201C of the wiring board 200C. The mounting surface 103 is one example of a second mounting surface. The mounting surface 201C of the wiring board 200C and the mounting surface 103 of the semiconductor device 100 are electrically and mechanically connected with each other via the plurality of bonding members 350.

The semiconductor device 100 includes a package board 102, and a semiconductor element 101 mounted on the package board 102. The package board 102 is a printed wiring board, and is also a rigid wiring board.

In the second embodiment, the processing module 300C includes a plurality of electronic components. In FIG. 12, an electronic component 400, which is one of the plurality of electronic components, is illustrated. The electronic component 400 is one example of a first electronic component. The electronic component 400 is surface-mounted on the mounting surface 201C of the wiring board 200C, and on the mounting surface 103. Note that the plurality of electronic components may include two or more electronic components 400. The electronic component 400 is a passive component, such as a capacitor, a resistor, or an inductor. Preferably, the electronic component 400 is a capacitor, and is disposed in the vicinity of the semiconductor device 100 that causes the noise. Preferably, the electronic component 400 functions as a bypass capacitor for the semiconductor device 100, and is disposed between the semiconductor device 100 and the wiring board 200C. The electronic component 400 is a chip component, and can be disposed in a narrow space between the semiconductor device 100 and the wiring board 200C.

The wiring board 200C includes an insulator 210C that includes an insulating board 220 and a solder resist 208C. The wiring board 200C is one example of a first wiring board. The insulator 210C is one example of a first insulator. The solder resist 208C is one example of a first insulating member. The insulating board 220 is one example of a first insulating board. A main surface 221 is one example of a first main surface. The wiring board 200C includes a conductor layer 205C that is disposed between the main surface 221 of the insulating board 220 and the solder resist 208C, and that is one example of a first conductor layer. The conductor layer 205C includes a plurality of pads 230C that is disposed on the main surface 221 of the insulating board 220, and that is spaced from each other. The plurality of pads 230C is defined by the insulator 210C, that is, by the solder resist 208C. The mounting surface 201C includes an insulating area R1C formed by the insulator 210C, and a conductive area formed by the pads 230C. In the second embodiment, the insulating area R1C of the mounting surface 201C is formed by the solder resist 208C. Note that if the solder resist 208C is not formed, the insulating area R1C of the mounting surface 201C may be formed by the insulating board 220.

The plurality of pads 230C may be arranged in a checked pattern or a matrix pattern, or may be arranged in a staggered pattern. In the second embodiment, the plurality of pads 230C is arranged in a checked pattern.

Note that the X direction and the Y direction are directions parallel to the mounting surface 201C. The Z direction is a direction perpendicular to the mounting surface 201C. As in the first embodiment, a Z1 direction of the Z direction is a direction extending from the semiconductor device 100 toward the wiring board 200C, and a Z2 direction of the Z direction is a direction opposite to the Z1 direction and extending from the wiring board 200C toward the semiconductor device 100.

Each of the pads 230C is a portion of the conductor pattern included in the wiring board 200C, and is used for the bonding. The pads 230C have electrical conductivity. The material of each of the pads 230C is a metal, such as copper or gold. For example, each of the pads 230C serves as a signal terminal, a power supply terminal, a ground terminal, or a dummy terminal. The insulating board 220 has electrical insulation property. The material of the insulating board 220 is an insulating material, such as epoxy resin.

FIG. 13A is a plan view of the wiring board 200C and the electronic component 400 of the second embodiment. FIG. 13A illustrates the wiring board 200C and the electronic component 400 viewed in the Z1 direction. The plurality of pads 230C includes a pad 230CE that serves as a power supply terminal, a pad 230CG that serves as a ground terminal, and a plurality of pads 230S other than the pads 230CE and 230CG. The pad 230CE is one example of a first pad. The pad 230CG is one example of a second pad. Each of the pads 230S serves as a signal terminal, a power supply terminal, a ground terminal, or a dummy terminal. The pad 230CE and the pad 230CG are adjacent to each other in the X direction. The plurality of pads 230S is disposed around the pad 230CE and the pad 230CG.

A pad $230S_1$ of the plurality of pads 230S is closest to the pad 230CE in the Y direction. The pad $230S_1$ is one example of a fifth pad. A pad $230S_2$ of the plurality of pads 230S is closest to the pad 230CG in the Y direction. The pad $230S_2$ is one example of a sixth pad. The pad $230S_1$ and the pad $230S_2$ are adjacent to each other in the X direction.

In the second modification, the shape of the pad 230CE is different from the shape of the pad 230E of the first embodiment. In addition, in the second modification, the shape of the pad 230CG is different from the shape of the pad 230G of the first embodiment.

Each of the pads 230S is formed like a circle when viewed in the Z direction, that is, in the Z1 direction. However, the pad 230CE is formed like a circle that lacks a segment, when viewed in the Z direction, that is, in the Z1 direction. That is, the pad 230CE is formed like a circle that lacks one portion (e.g., a vow-shaped portion), when viewed in the Z direction, that is, in the Z1 direction. The shape of the pad 230CG is the same as that of the pad 230CE. In addition, when viewed in the Z direction, that is, in the Z1 direction, the areas of the pads 230CE and 230CG are equal to each other. However, when viewed in the Z direction, that is, in the Z1 direction, the area of each of the pads 230CE and 230CG is smaller than the area of each of the pads 230S. Note that the pads 230C are portions of the conductor pattern disposed on the insulator 210C, and the portions are not covered with the insulator 210C that includes the solder resist 208C. In addition, the shape of each of the pads 230C is the shape of each of the portions of the conductor pattern, which are not covered with the insulator 210C. In addition, the area of each of the pads 230C is the area of each of the portions of the conductor pattern, which are not covered with the insulator 210C.

The solder resist 208C is one example of a first solder resist. The solder resist 208C is an organic insulating film made of an organic insulating material, such as a solder resist material. The solder resist 208C is formed on the main surface 221.

The plurality of pads 230C is exposed by a plurality of openings formed in the solder resist 208C. Each of the pads 230C may be an SMD pad or an NSMD pad. In the second embodiment, each of the pads 230C is an SMD pad. Note that the solder resist 208C may not be formed on the wiring board 200C.

As illustrated in FIG. 12, the package board 102 includes an insulator 110 that includes an insulating board 120 and a solder resist 108. The insulator 110 is one example of a second insulator. The insulating board 120 includes a main surface 121, and a main surface 122 opposite to the main surface 121. The package board 102 is one example of a second wiring board. The insulating board 120 is one example of a second insulating board. The main surface 121 is one example of a second main surface. Note that the X direction and the Y direction serve also as directions parallel to the mounting surface 103 and the main surface 121, and that the Z direction serves also as a direction perpendicular to the mounting surface 103 and the main surface 121. For example, a semiconductor element 101 is a semiconductor chip. Note that a heatsink may be disposed on the top surface of the semiconductor element 101 although not illustrated.

On the main surface 122 of the insulating board 120, a sealing resin 106 is formed for sealing the semiconductor element 101. The package board 102 includes a plurality of pads 130 that is disposed on the main surface 121 of the insulating board 120, and that is spaced from each other. The package board 102 includes a conductor layer 105 that is disposed between the main surface 121 of the insulating board 120 and the solder resist 108, and that is one example of a second conductor layer. The conductor layer 105 includes a plurality of pads 130 that is disposed on the main surface 121 of the insulating board 120, and that is spaced from each other. The plurality of pads 130 is defined by the insulator 110, that is, by the solder resist 108. The mounting surface 103 includes an insulating area R2 formed by the solder resist 108 of the insulator 110, and a conductive area formed by the pads 130. In the second embodiment, the insulating area R2 of the mounting surface 103 is formed by the solder resist 108. Note that if the solder resist 108 is not formed, the insulating area R2 of the mounting surface 103 is formed by the insulating board 120.

The plurality of pads 130 may be arranged in a checked pattern or a matrix pattern, or may be arranged in a staggered pattern. In the second embodiment, the plurality of pads 130 is arranged in a checked pattern.

Each of the pads 130 is a portion of the conductor pattern included in the package board 102, and is used for the bonding. The pads 130 have electrical conductivity. The material of each of the pads 130 is a metal, such as copper or gold. For example, each of the pads 130 serves as a signal terminal, a power supply terminal, a ground terminal, or a dummy terminal. The insulating board 120 has electrical insulation property. The material of the insulating board 120 may be ceramic such as alumina, or may be a resin such as glass epoxy resin.

FIG. 13B is a plan view of the package board 102 and the electronic component 400 of the second embodiment. FIG. 13B illustrates the package board 102 and the electronic component 400 viewed in the Z2 direction. The plurality of pads 130 includes a pad 130E that serves as a power supply terminal, a pad 130G that serves as a ground terminal, and a plurality of pads 130S other than the pads 130E and 130G. The pad 130E is one example of a third pad. The pad 130G is one example of a fourth pad. Each of the pads 130S serves as a signal terminal, a power supply terminal, a ground terminal, or a dummy terminal. The pad 130E and the pad 130G are adjacent to each other in the X direction. The plurality of pads 130S is disposed around the pad 130E and the pad 130G.

A pad $130S_1$ of the plurality of pads 130S is closest to the pad 130E in the Y direction. The pad $130S_1$ is one example of a seventh pad. A pad $130S_2$ of the plurality of pads 130S is closest to the pad 130G in the Y direction. The pad $130S_2$ is one example of an eighth pad. The pad $130S_1$ and the pad $130S_2$ are adjacent to each other in the X direction.

The shapes of the plurality of pads 130 are equal to each other. For example, each of the pads 130 is formed like a circle when viewed in the Z direction, that is, in the Z2 direction. In addition, when viewed in the Z direction, that is, in the Z2 direction, the areas of the pads 130 are equal to each other. Note that the pads 130 are portions of the conductor pattern disposed on the insulator 110, and the portions are not covered with the insulator 110 that includes the solder resist 108. In addition, the shape of each of the pads 130 is the shape of each of the portions of the conductor pattern, which are not covered with the insulator 110. In addition, the area of each of the pads 130 is the area of each of the portions of the conductor pattern, which are not covered with the insulator 110.

The plurality of pads 130 is exposed by a plurality of openings formed in the solder resist 108. Each of the pads 130 may be an SMD pad or an NSMD pad. In the second embodiment, each of the pads 130 is an SMD pad. Note that the solder resist 108 may not be formed on the package board 102.

The pad 130E is electrically connected to a power supply terminal 111E of the semiconductor element 101 via a via conductor 112E formed in the insulating board 120. The pad 130G is electrically connected to a ground terminal 111G of the semiconductor element 101 via a via conductor 112G formed in the insulating board 120.

The plurality of pads 230C and the plurality of pads 130 face each other in the Z direction. That is, the pad 230CE and the pad 130E face each other in the Z direction. The pad 230CG and the pad 130G face each other in the Z direction. The pad $230S_1$ and the pad $130S_1$ face each other in the Z direction. The pad $230S_2$ and the pad $130S_2$ face each other in the Z direction.

Note that in the second embodiment, when viewed in the Z2 direction, one portion of the pad 130E and one portion of the electrode 410 of the electronic component 400 overlap with each other. In addition, in the second embodiment, when viewed in the Z2 direction, one portion of the pad 130G and one portion of the electrode 420 of the electronic component 400 overlap with each other.

Figure 14A:
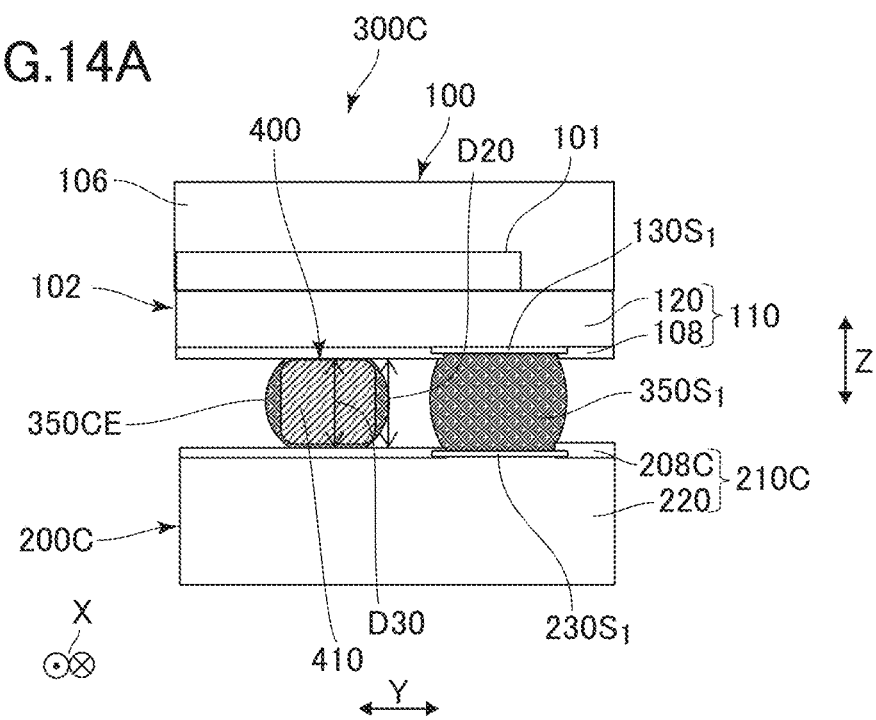
FIG. 14A is a cross-sectional view of the processing module of the second embodiment.
Figure 14B:
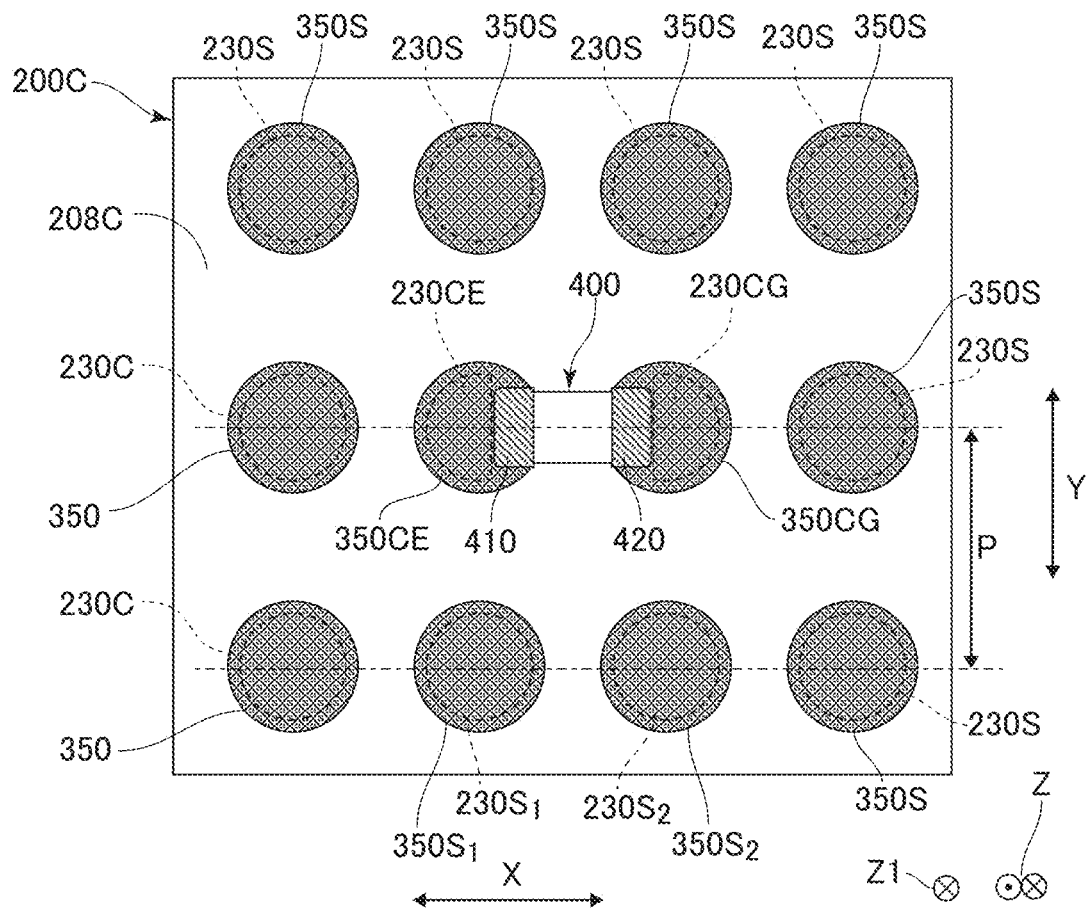
FIG. 14B is a cross-sectional view of the processing module of the second embodiment.

Each of FIGS. 14A and 14B is a cross-sectional view of the processing module 300C of the second embodiment. FIG. 14A illustrates a cross section of the processing module 300C, taken along a XIIIA-XIIIA line of FIG. 12. FIG. 14B illustrates a cross section of the processing module 300C, taken along a XIIIB-XIIIB line of FIG. 12.

The pad 230CE of the wiring board 200C and the pad 130E of the package board 102 are bonded to each other via a bonding member 350CE of the plurality of bonding members 350. The pad 230CG of the wiring board 200C and the pad 130G of the package board 102 are bonded to each other via a bonding member 350CG of the plurality of bonding members 350. The bonding member 350CE is one example of a first bonding member, and the bonding member 350CG is one example of a second bonding member.

The pads 230S of the wiring board 200C and the pads 130S of the package board 102 are bonded to each other via bonding members 350S of the plurality of bonding members 350. In particular, the pad $230S_1$ of the wiring board 200C and the pad $130S_1$ of the package board 102 are bonded to each other via a bonding member $350S_1$ of the plurality of bonding members 350. In addition, the pad $230S_2$ of the wiring board 200C and the pad 130S 2 of the package board 102 are bonded to each other via a bonding member $350S_2$ of the plurality of bonding members 350.

Thus, the pads 130 are electrically connected to the pads 230C via the bonding members 350. That is, the pad 130E is electrically connected to the pad 230CE via the bonding member 350CE. The pad 130G is electrically connected to the pad 230CG via the bonding members 350CG. The pads 130S are electrically connected to the pads 230S via the bonding members 350S. In particular, the pad $130S_1$ is electrically connected to the pad $230S_1$ via the bonding member $350S_1$. In addition, the pad $130S_2$ is electrically connected to the pad $230S_2$ via the bonding member $350S_2$.

A distance D40 between an electrode 410 and the solder resist 208C is smaller than a distance D50 between the electrode 410 and the pad 230CE. The electrode 410 may be in contact with the solder resist 208C. If the electrode 410 is in contact with the solder resist 208C, the distance D40 is zero. As can be understood from FIG. 14A, one portion of the bonding member 350CE may exist between the electrode 410 and the solder resist 208C, and the electrode 410 may be separated from the solder resist 208C via the bonding member 350CE. The distance between the electrode 420 and the solder resist 208C is smaller than the distance between the electrode 420 and the pad 230CG. The electrode 420 may be in contact with the solder resist 208C. If the electrode 420 is in contact with the solder resist 208C, the distance between the electrode 420 and the solder resist 208C is zero. Like the electrode 410, one portion of the bonding member 350CG may exist between the electrode 420 and the solder resist 208C, and the electrode 420 may be separated from the solder resist 208C via the bonding member 350CG.

A distance D60 between the electrode 410 and the solder resist 108 is smaller than a distance D70 between the electrode 410 and the pad 130E. The electrode 410 may be in contact with the solder resist 108. If the electrode 410 is in contact with the solder resist 108, the distance D60 is zero. Like the solder resist 208, one portion of the bonding member 350CE may exist between the electrode 410 and the solder resist 108, and the electrode 410 may be separated from the solder resist 108 via the bonding member 350CE. The distance between the electrode 420 and the solder resist 108 is smaller than the distance between the electrode 420 and the pad 130G. The electrode 420 may be in contact with the solder resist 108. If the electrode 420 is in contact with the solder resist 108, the distance between the electrode 420 and the solder resist 108 is zero. Like the electrode 410, one portion of the bonding member 350CG may exist between the electrode 420 and the solder resist 108, and the electrode 420 may be separated from the solder resist 108 via the bonding member 350CG.

Preferably, the size of the electronic component 400 in a plan view is equal to or smaller than the 0402 size. For example, the size of the electronic component 400 in a plan view is the 0402 size, which is 0.4 mm×0.2 mm; or is the 0201 size, which is 0.25 mm×0.125 mm. The electronic component 400 includes an element body 401, the electrode 410, and the electrode 420. The element body 401 is formed like a substantially rectangular parallelepiped that extends in the longitudinal direction. The electrodes 410 and 420 are separated from each other in the longitudinal direction of the element body 401, and form a pair.

The electrode 410, which is one of the electrodes 410 and 420 that form a pair, is one example of a first electrode; the electrode 420, which is the other of the electrodes 410 and 420, is one example of a second electrode.

The electrode 410 of the electronic component 400 is in contact with the bonding member 350CE. That is, the electrode 410 is bonded to the pad 230CE and the pad 130E via the bonding member 350CE. In this manner, the electrode 410 is electrically connected to the pad 230CE and the pad 130E. In addition, the electrode 420 of the electronic component 400 is in contact with the bonding member 350CG. That is, the electrode 420 is bonded to the pad 230CG and the pad 130G via the bonding member 350CG. In this manner, the electrode 420 is electrically connected to the pad 230CG and the pad 130G. In such a connection structure, the electronic component 400 can function as a bypass capacitor for the semiconductor device 100, that is, for the semiconductor element 101.

Figure 15:
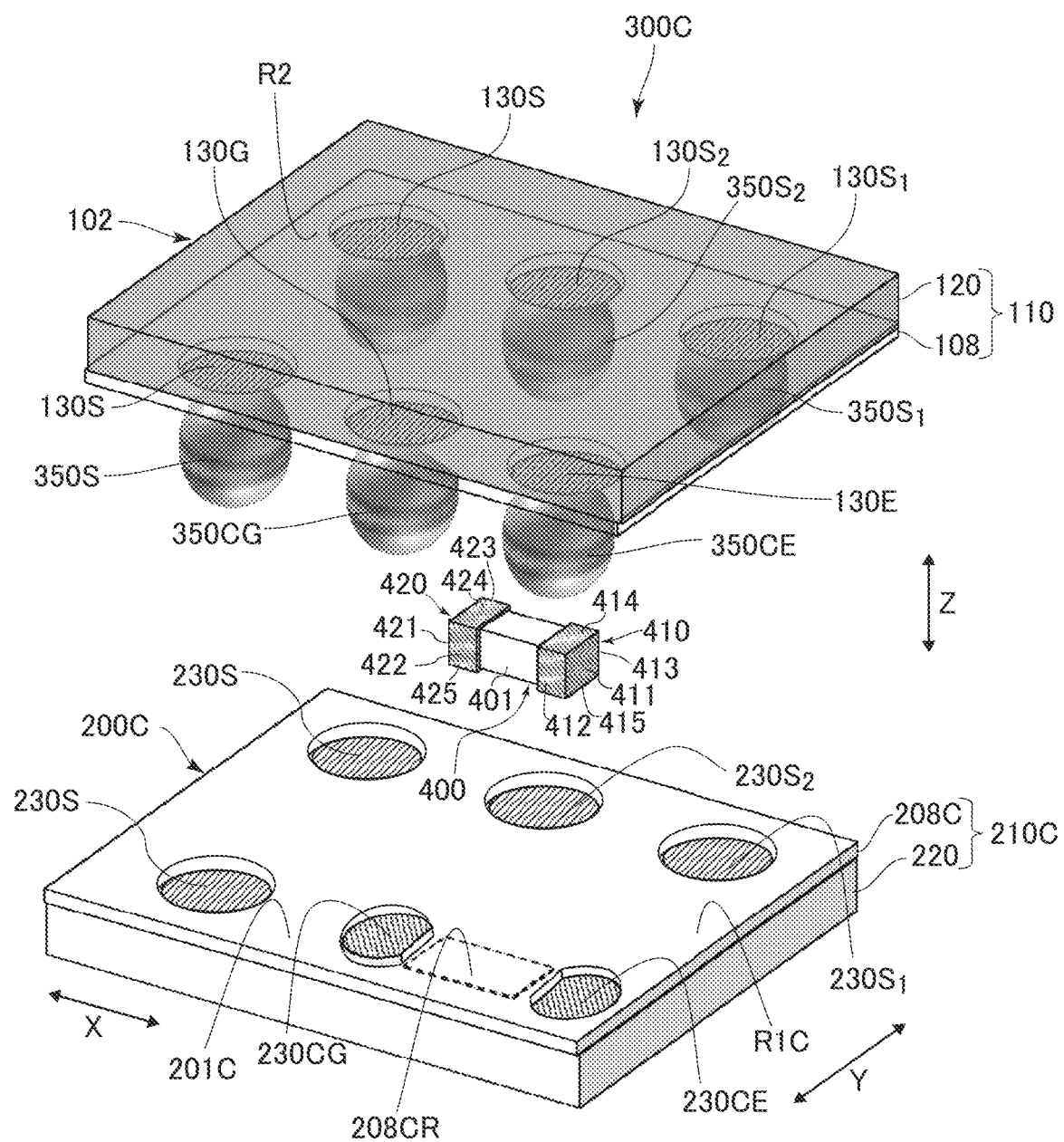
FIG. 15 is an exploded perspective view of the processing module of the second embodiment.

FIG. 15 is an exploded perspective view of the processing module 300C of the second embodiment. Note that in FIG. 15, one portion of the processing module is illustrated as a translucent portion for convenience of description. The electronic component 400 is positioned on one area 208CR of the insulating area R1C formed by the solder resist 208C (the insulating area R1C is included in the mounting surface 201C). That is, the electrodes 410 and 420 are positioned on the area 208CR. Each of the electrodes 410 and 420 of the electronic component 400 is partly in contact with the area 208CR.

The top surface 414 of the electrode 410 faces a portion of the solder resist 108 in the Z direction. The portion of the solder resist 108 is in the vicinity of the pad 130E. The bottom surface 415 of the electrode 410 faces a portion of the solder resist 208C in the Z direction. The portion of the solder resist 208C is in the vicinity of the pad 230CE.

The top surface 424 of the electrode 420 faces a portion of the solder resist 108 in the Z direction. The portion of the solder resist 108 is in the vicinity of the pad 130G. The bottom surface 425 of the electrode 420 faces a portion of the solder resist 208C in the Z direction. The portion of the solder resist 208C is in the vicinity of the pad 230CG.

The electrodes 410 and 420 of the electronic component 400 are sandwiched between the insulator 210C and the insulator 110. That is, the electrodes 410 and 420 of the electronic component 400 are sandwiched between the solder resist 108 and the solder resist 208C. Preferably, the electronic component 400 is in contact with at least one of the wiring board 200C and the semiconductor device 100. In the second embodiment, the top surface 414 of the electrode 410 is in contact with the insulator 110, that is, with the solder resist 108; the bottom surface 415 of the electrode 410 is in contact with the insulator 210C, that is, with the solder resist 208C. In addition, in the second embodiment, the top surface 424 of the electrode 420 is in contact with the insulator 110, that is, with the solder resist 108; the bottom surface 425 of the electrode 420 is in contact with the insulator 210C, that is, with the solder resist 208C.

When the semiconductor element 101 operates, the power supply noise is produced by the inductance and resistance of a line between the electrode 410 of the electronic component 400 and the power supply terminal 111E of the semiconductor element 101, and by the inductance and resistance of a line between the electrode 420 of the electronic component 400 and the ground terminal 111G of the semiconductor element 101.

The power supply noise is the fluctuation in voltage of the power supply line, produced by the semiconductor device 100 being operated. The fluctuation in voltage is caused by the change in power supply current, caused by the inductance and resistance that are parasitic on the power supply line.

For reducing the power supply noise, it is preferable to reduce the inductance and resistance of the line. For reducing the inductance and resistance of the line, it is necessary to dispose the electronic component 400, which functions as a bypass capacitor, at a position at which the electronic component 400 is made close to the semiconductor element 101 as much as possible. That is, it is necessary to shorten the line between the semiconductor element 101 and the electronic component 400, as much as possible.

In the second embodiment, since the electrode 410 of the electronic component 400 is electrically connected to the pad 130E of the package board 102 via the bonding member 350CE, the inductance and resistance of the line between the electrode 410 of the electronic component 400 and the pad 130E of the package board 102 can be reduced.

In addition, since the electrode 420 of the electronic component 400 is electrically connected to the pad 130G of the package board 102 via the bonding member 350CG, the inductance and resistance of the line between the electrode 420 of the electronic component 400 and the pad 130G of the package board 102 can be reduced.

Since the inductance and resistance of the line is reduced, the power supply noise produced by the operation of the semiconductor element 101 is reduced, and the speed of communication achieved by signals in the semiconductor device 100, or the semiconductor element 101, can be increased.

Preferably, when viewed in the Z direction, the electronic component 400 is positioned within an area surrounded by the outer shape of the semiconductor element 101. In this arrangement, since the line between the semiconductor element 101 and the electronic component 400 is shortened, the inductance and resistance of the line can be reduced, so that the power supply noise can be reduced.

Next, a method of manufacturing the processing module 300C will be described. FIGS. 16A to 18 are diagrams for illustrating the method of manufacturing the processing module 300C of the second embodiment. In each of FIGS. 16A to 18, a plan view of a member including the wiring board 200C, and a cross-sectional view of the member including the wiring board 200C are illustrated. The plan view is a plan view of the member viewed in the Z1 direction; the cross-sectional view is a cross-sectional view taken along a D2-D2 line.

Figure 16A:
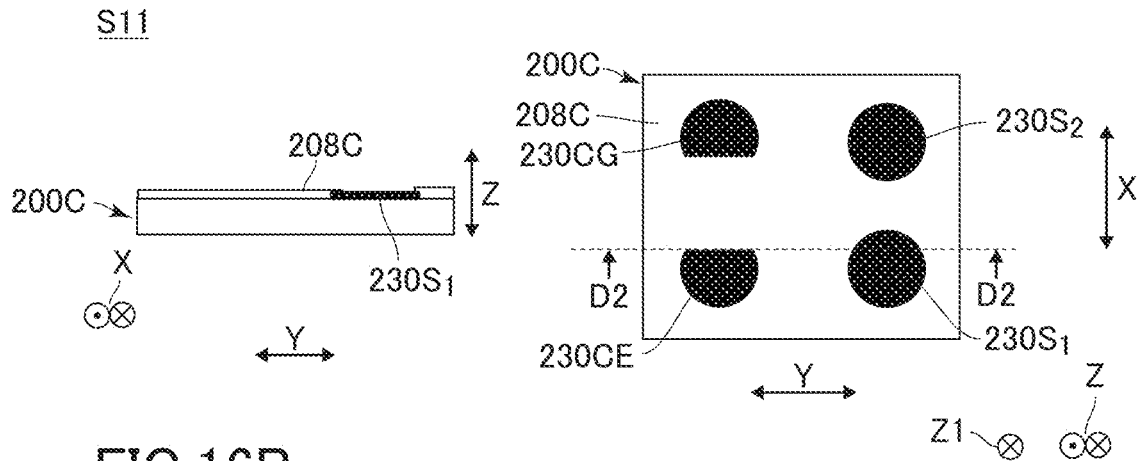
FIG. 16A is a diagram for illustrating a method of manufacturing the processing module of the second embodiment.

In a process S11 illustrated in FIG. 16A, the wiring board 200C is prepared. Note that in the process S11, the semiconductor device 100 and the electronic component 400 are also prepared, although not illustrated.

Figure 16B:
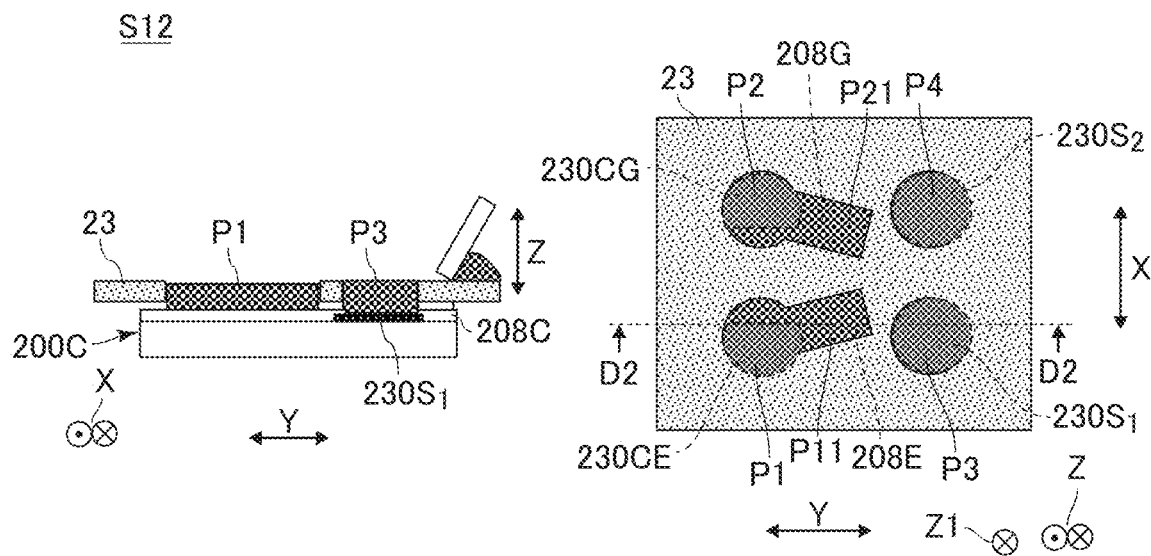
FIG. 16B is a diagram for illustrating the method of manufacturing the processing module of the second embodiment.

In a process S12 illustrated in FIG. 16B, a solder paste P1, a solder paste P2, a solder paste P3, and a solder paste P4 are supplied onto the wiring board 200C, being spaced from each other. The solder paste P1 is one example of a first solder paste, and is supplied so as to extend from the top of the pad 230CE to the top of a portion 208E of the solder resist 208C. The solder paste P2 is one example of a second solder paste, and is supplied so as to extend from the top of the pad 230CG to the top of a portion 208G of the solder resist 208C. The solder paste P3 is one example of a third solder paste, and is supplied onto the pad $230S_1$. The solder paste P4 is one example of a fourth solder paste, and is supplied onto the pad $230S_2$.

Each of the solder pastes P1, P2, P3, and P4 contains solder powder, and flux component necessary for soldering. Preferably, the solder pastes P1, P2, P3, and P4 are made of the same material. However, the present disclosure is not limited to this. For example, the materials of the solder pastes P1, P2, P3, and P4 may be different from each other if the melting points of the materials are close to each other.

In the process S12, the solder pastes P1 to P4 are supplied onto the wiring board 200C in the screen printing that uses a mask 23. Note that the method of supplying the solder pastes P1 to P4 is not limited to the screen printing. For example, the solder pastes P1 to P4 may be supplied onto the wiring board 200C by using a dispenser.

Figure 16C:
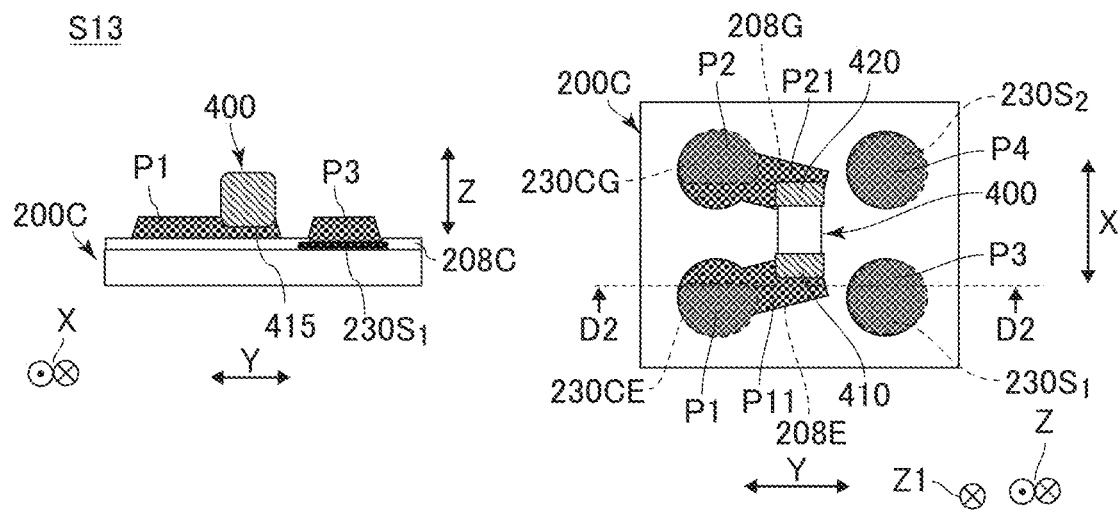
FIG. 16C is a diagram for illustrating the method of manufacturing the processing module of the second embodiment.

In a process S13 illustrated in FIG. 16C, the electronic component 400 is placed on the wiring board 200C such that the electrode 410 of the electronic component 400 contacts a portion P11 of the solder paste P1 supplied onto the portion 208E, and that the electrode 420 of the electronic component 400 contacts a portion P21 of the solder paste P2 supplied onto the portion 208G. In the process S13, the electronic component 400 is placed on the solder pastes P1 and P2 by using a mounter (not illustrated).

Figure 17A:
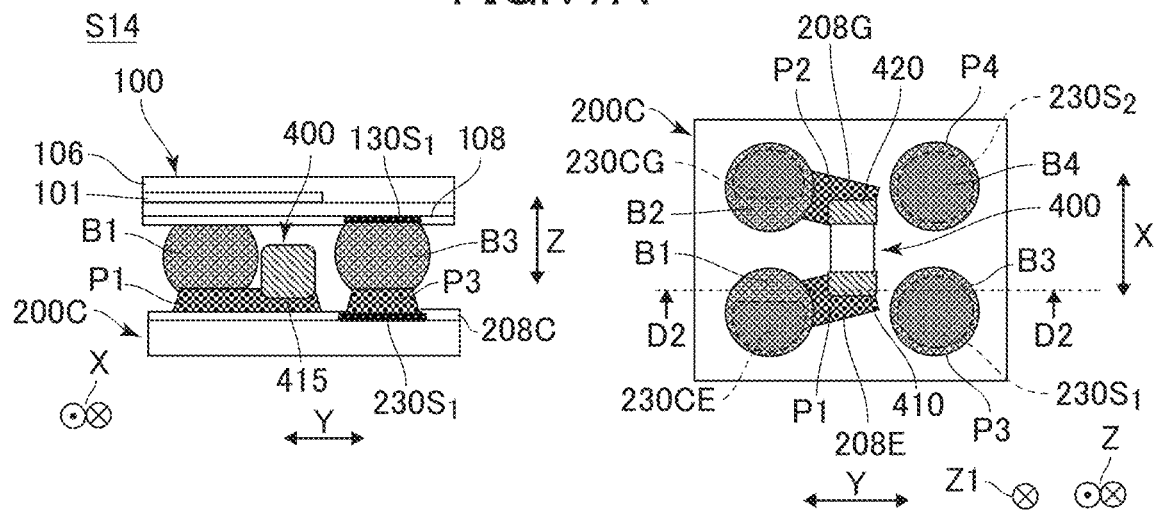
FIG. 17A is a diagram for illustrating the method of manufacturing the processing module of the second embodiment.

In a process S14 illustrated in FIG. 17A, the semiconductor device 100 is placed on the wiring board 200C such that the pad 130E faces the pad 230CE, the pad 130G faces the pad 230CG, the pad $130S_1$ faces the pad $230S_1$, and the pad $130S_2$ faces the pad $230S_2$. In the process S14, the semiconductor device 100 is placed on the wiring board 200C by using a mounter (not illustrated).

Note that the pads 130E, 130G, $130S_1$, and $130S_2$ of the semiconductor device 100 are respectively provided with solder balls B1, B2, B3, and B4. That is, the semiconductor device 100 is a BGA semiconductor package. In the process S14, the semiconductor device 100 is placed on the wiring board 200C, so that the solder balls B1, B2, B3, and B4 contact the solder pastes P1, P2, P3, and P4, respectively. However, when the semiconductor device 100 is placed on the wiring board 200C, the solder balls B1, B2, B3, and B4 do not contact the electronic component 400. That is, the electronic component 400 is disposed at a position at which the electronic component 400 does not contact the solder balls B1, B2, B3, and B4 when the semiconductor device 100 is placed on the wiring board 200C.

Then, the wiring board 200C on which the semiconductor device 100 and the electronic component 400 are placed is conveyed to a reflow furnace (not illustrated). In a process S15-1 illustrated in FIG. 17B, the ambient temperature in the reflow furnace is adjusted into a temperature equal to or higher than the melting point of the solder powder contained in the solder pastes P1 to P4. In this manner, the solder pastes P1 to P4 melt when heated. The solder pastes P1 to P4 melt, and become fluid molten solders M1 to M4, respectively.

Figure 17B:
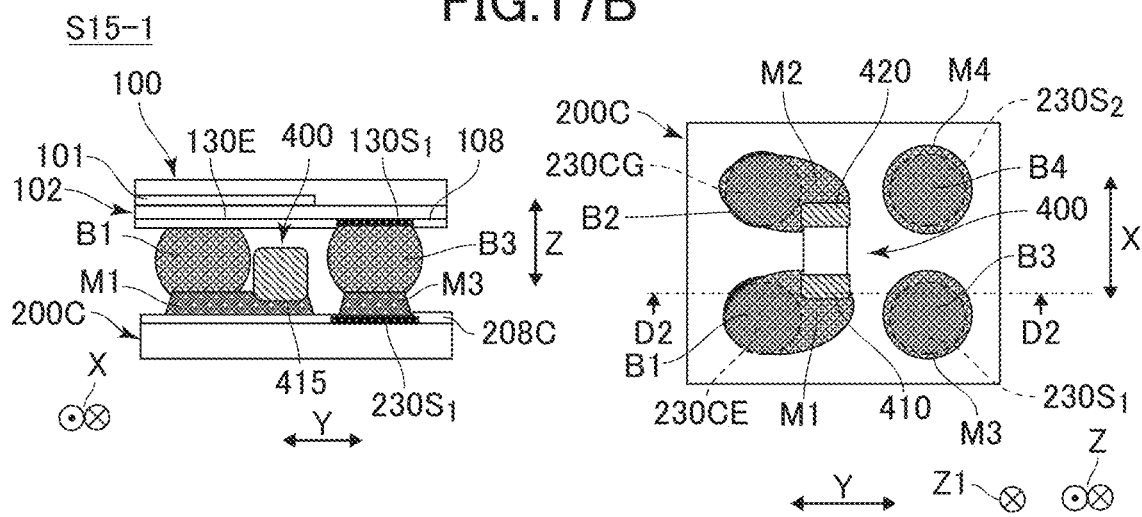
FIG. 17B is a diagram for illustrating the method of manufacturing the processing module of the second embodiment.
Figure 17C:
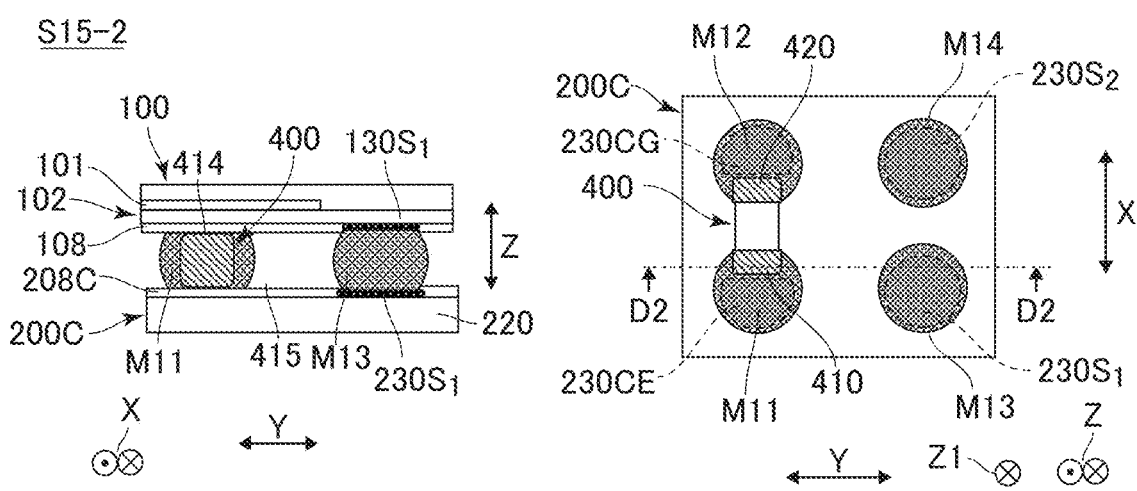
FIG. 17C is a diagram for illustrating the method of manufacturing the processing module of the second embodiment.

In a process S15-2 illustrated in FIG. 17C, the heating is continued, following the heating in the process S15-1. As a result, the molten solders M1 to M4 are caused to flow. The molten solders M1 and M2, into which the solder paste P1 and P2 have melted, aggregate on the respective pads 230CE and 230CG. The aggregation of the molten solders M1 and M2 causes the electronic component 400 to reach the vicinity of the pads 230CE and 230CG. After that, the solder balls B1 to B4 melt. The amounts of solder of the solder balls B1 to B4 are substantially equal to each other.

The molten solder M1 and the molten solder, into which the solder ball B1 has melted, join with each other into a molten solder M11. In addition, the molten solder M2 and the molten solder, into which the solder ball B2 has melted, join with each other into a molten solder M12. In addition, the molten solder M3 and the molten solder, into which the solder ball B3 has melted, join with each other into a molten solder M13. In addition, the molten solder M4 and the molten solder, into which the solder ball B4 has melted, join with each other into a molten solder M14.

When the solder balls B1 to B4 melt, the semiconductor device 100 sinks toward a direction in which the semiconductor device 100 approaches the electronic component 400. As a result, the distance between the top surface 414 of the electrode 410 and the pad 130E is decreased, and the distance between the top surface 424 of the electrode 420 and the pad 130G is decreased.

In the above-described processes S15-1 and S15-2, since the solder pastes P1 to P4 and the solder balls B1 to B4 melt when heated, the semiconductor device 100 sinks, and the electrodes 410 and 420 of the electronic component 400 contact the insulator 210C of the wiring board 200C and the insulator 110 of the package board 102. That is, the electrodes 410 and 420 of the electronic component 400 are sandwiched between the insulator 210C of the wiring board 200C and the insulator 110 of the semiconductor device 100.

In the second embodiment, the electrodes 410 and 420 of the electronic component 400 contact the solder resist 108 and the solder resist 208C. That is, the electrodes 410 and 420 of the electronic component 400 are sandwiched between the solder resist 108 of the semiconductor device 100 and the solder resist 208C of the wiring board 200C. Note that the state where the electronic component 400 is sandwiched between the solder resists 108 and 208C, that is, the state where the electronic component 400 is pressed against the solder resists 108 and 208 is a state where the force is applied to the electronic component 400 from the solder resists 108 and 208. Thus, in the state, the electronic component 400 may not be directly in contact with the solder resist 108, and may not be directly in contact with the solder resist 208C. For example, a solder may be formed between the electronic component 400 and the solder resist 108, and a solder may be formed between the electronic component 400 and the solder resist 208C.

In a method for causing the electronic component 400 to be sandwiched between the wiring board 200C and the package board 102, the temperature of the wiring board 200C may be increased to a temperature equal to or higher than the melting temperature of solder, earlier than the temperature of the semiconductor device 100 is increased to the temperature equal to or higher than the melting temperature of solder. For example, by adjusting the temperature of a heater disposed in the reflow furnace, the temperature of the wiring board 200C can be increased to a temperature equal to or higher than the melting temperature of solder, earlier than the temperature of the semiconductor device 100 is increased to the temperature equal to or higher than the melting temperature of solder. By adjusting the temperature of the wiring board 200C and the temperature of the semiconductor device 100 in this manner, the solder pastes P1 to P4 supplied onto the wiring board 200C can be melted earlier than the solder balls B1 to B4 are melted. In another method, a solder paste whose melting temperature is lower than that of the solder balls B1 to B4 may be used as the solder pastes P1 to P4.

Figure 18:
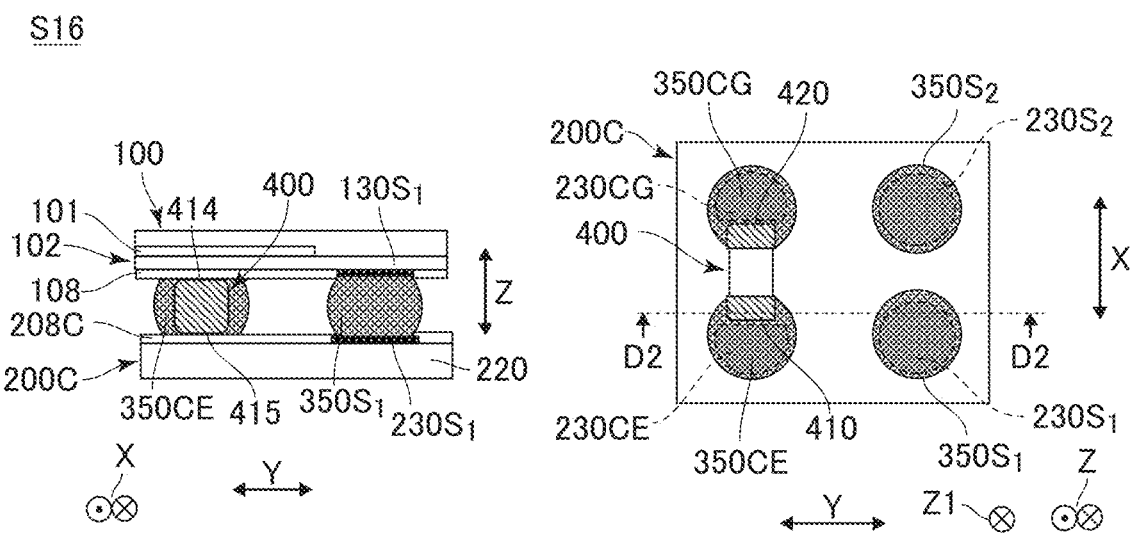
FIG. 18 is a diagram for illustrating the method of manufacturing the processing module of the second embodiment.

After that, in a process S16 illustrated in FIG. 18, the molten solders M11 to M14 are solidified by cooling the molten solders M11 to M14. The bonding member 350CE is formed by solidifying the molten solder M11. In addition, the bonding member 350CG is formed by solidifying the molten solder M12. In addition, the bonding member $350S_1$ is formed by solidifying the molten solder M13. In addition, the bonding member $350S_2$ is formed by solidifying the molten solder M14.

The volume of each of the bonding members 350CE and 350CG is larger than the volume of each of the bonding members $350S_1$ and $350S_2$. This is because although the volumes of the solder balls B1 to B4 are equal to each other, the volume of each of the solder pastes P1 and P2 is larger than the volume of each of the solder pastes P3 and P4. On the other hand, since the electrodes 410 and 420 of the electronic component 400 are sandwiched between the insulator 210C and the insulator 110, the amount of sinking of the semiconductor device 100 is reduced by the electronic component 400. That is, the diameter of each of the bonding members 350CE and 350CG is suppressed from being increased due to the sinking of the semiconductor device 100. As a result, the possibility that the short-circuit failure occurs between the bonding member 350CE and the bonding member $350S_1$ is reduced, and the possibility that the short-circuit failure occurs between the bonding member 350CG and the bonding member $350S_2$ is reduced.

Through the above-described processes S11 to S16, the processing module 300C is manufactured. After that, the processing module 300C is disposed in the housing 611 illustrated in FIG. 1, so that the camera body 601, that is, the digital camera 600 is manufactured.

In the processing module 300C manufactured in this manner, the electrode 410 of the electronic component 400 is in contact with the insulator 210C directly or via solder, and thus is not directly in contact with the pad 230CE. In addition, the electrode 410 of the electronic component 400 is in contact with the insulator 110 directly or via solder, and thus is not directly in contact with the pad 130E. In addition, the electrode 420 of the electronic component 400 is in contact with the insulator 210C directly or via solder, and thus is not directly in contact with the pad 230CG. In addition, the electrode 420 of the electronic component 400 is in contact with the insulator 110 directly or via solder, and thus is not directly in contact with the pad 130G. Furthermore, in the second embodiment, when viewed in the Z direction, the whole of the electrode 410 and the whole of the electrode 420 of the electronic component 400 overlap with the solder resists 208C. On the other hand, when viewed from the Z direction, one portion of the electrode 410 of the electronic component 400 and one portion of the electrode 420 of the electronic component 400 do not overlap with the solder resist 108, but the other portion of the electrode 410 and the other portion of the electrode 420 overlap with the solder resist 108.

That is, in the second embodiment, the electrodes 410 and 420 of the electronic component 400 are disposed between the package board 102 and the wiring board 200C in a state where the electrodes 410 and 420 of the electronic component 400 are sandwiched between the insulator 110 of the package board 102 and the insulator 210C of the wiring board 200C. Note that the shape of the pad 130E may be a circle that lacks a segment when viewed in the Z direction. In this case, when viewed in the Z direction, the whole of the electrode 410 of the electronic component 400 overlaps with the solder resist 108. In addition, the shape of the pad 130G may be a circle that lacks a segment when viewed in the Z direction. In this case, when viewed in the Z direction, the whole of the electrode 420 of the electronic component 400 overlaps with the solder resist 108.

In the second embodiment, when the solder balls B1 to B4 melt in the manufacturing process of the processing module 300C, the molten solder wets and spreads on the pads 230CE and 230CG of the wiring board 200C, so that the semiconductor device 100 sinks from the position in which the semiconductor device 100 is located before the solder melts. When the semiconductor device 100 sinks, the electronic component 400 serves as a spacer, and regulates the sinking of the semiconductor device 100. In this manner, the distance between the semiconductor device 100 and the wiring board 200C in the Z direction is prevented from becoming smaller than the height of the electronic component 400 in the Z direction. Thus, the possibility that the bonding members 350CE and 350CG are crushed is reduced. As a result, the possibility that the short-circuit failure occurs between the bonding member 350CE and the bonding member $350S_1$ is reduced, and the possibility that the short-circuit failure occurs between the bonding member 350CG and the bonding member $350S_2$ is reduced.

In addition, in the second embodiment, in the processes S15-1 and S15-2, the possibility that the molten solder in contact with the pads 230CE and 130E is pushed out by the volume of a portion of the electronic component 400 (the portion includes the electrode 410) is reduced. Thus, in the processing module 300C manufactured in this manner, the possibility that the short-circuit failure occurs between the bonding member 350CE and the bonding member $350S_1$ is reduced. In addition, in the processes S15-1 and S15-2, the possibility that the molten solder in contact with the pads 230CG and 130G is pushed out by the volume of a portion of the electronic component 400 (the portion includes the electrode 420) is reduced. Thus, in the processing module 300C manufactured in this manner, the possibility that the short-circuit failure occurs between the bonding member 350CG and the bonding member $350S_2$ is reduced.

In the second embodiment, a distance D10 between the pad 230CE and the pad 130E in the Z direction is larger than a distance D20 between the insulator 210C and the insulator 110 in the Z direction. The distance D20 is also the distance between the solder resist 208C and the solder resist 108 in the Z direction. In addition, if the electrode 410 is in contact with the solder resist 208C and the solder resist 108, the distance D20 is equal to a height D30 of the electrode 410 in the Z direction.

As described above, since the electronic component 400 is not directly in contact with the pads 230CE, 230CG, 130E, and 130G, the distance between the wiring board 200C and the package board 102 can be set at a proper distance in the heating processes of S15-1 and S15-2. Thus, the possibility that the bonding member 350CE is crushed is reduced, and the possibility that the short-circuit failure occurs between the bonding member 350CE and the bonding member $350S_1$ is reduced. Similarly, the distance between the wiring board 200C and the package board 102 can be set at a proper distance, by the electronic component 400, in the heating processes of S15-1 and S15-2. Thus, the possibility that the bonding member 350CG is crushed is reduced, and the possibility that the short-circuit failure occurs between the bonding member 350CG and the bonding member $350S_2$ is reduced.

In addition, it is preferable that the pitch P between the pad 230CE and the pads $230S_1$ and the height D30 of the electronic component 400 in the Z direction satisfy the relationship of P/4<D30<P Note that the height D30 of the electronic component 400 in the Z direction is the height of the electrode 410 in the Z direction. The height of the electrode 420 in the Z direction is equal to the height of the electrode 410 in the Z direction.

That is, the height D30 of the electronic component 400 is preferably larger than one quarter of the pitch P between the pad 230CE and the pad $230S_1$. In addition, the height D30 of the electronic component 400 is preferably smaller than the pitch P between the pad 230CE and the pad $230S_1$.

For example, if the pitch P is 0.4 mm, it is preferable that the electronic component 400 have the 0402 size in which the height D30 is 0.2 mm, or the 0201 size in which the height D30 is 0.125 mm.

Since the height D30 of the electronic component 400 is smaller than the pitch P, the possibility that the open-circuit failure occurs in the bonding members 350CE and 350CG is reduced even if the electronic component 400 is disposed between the wiring board 200C and the package board 102.

In addition, since the height D30 of the electronic component 400 is larger than one quarter of the pitch P, the amount of sinking of the semiconductor device 100 is reduced, so that the possibility that the short-circuit failure occurs in the bonding members 350CE and 350CG is effectively reduced.

As can be understood from FIGS. 12 and 14A, a distance D40 between the electrode 410 and the solder resist 208C is smaller than the height D30 of the electronic component 400. The height D30 of the electronic component 400 is preferably 0.125 mm. Thus, the distance D40 between the electrode 410 and the solder resist 208C is preferably smaller than 0.125 mm, for example. The distance D40 between the electrode 410 and the solder resist 208C is preferably equal to or smaller than 100 μm, and is more preferably equal to or smaller than 50 μm. Similarly, the distance between the electrode 420 and the solder resist 208C is smaller than 0.125 mm, for example. The distance between the electrode 420 and the solder resist 208C is preferably equal to or smaller than 100 μm, and is more preferably equal to or smaller than 50 μm.

In addition, as can be understood from FIGS. 12 and 14A, a distance D60 between the electrode 410 and the solder resist 108 is smaller than the height D30 of the electronic component 400. The height D30 of the electronic component 400 is preferably 0.125 mm. Thus, the distance D60 between the electrode 410 and the solder resist 108 is preferably smaller than 0.125 mm, for example. The distance D60 between the electrode 410 and the solder resist 108 is preferably equal to or smaller than 100 μm, and is more preferably equal to or smaller than 50 μm. Similarly, the distance between the electrode 420 and the solder resist 108 is smaller than 0.125 mm, for example. The distance between the electrode 420 and the solder resist 108 is preferably equal to or smaller than 100 μm, and is more preferably equal to or smaller than 50 μm.

In addition, as can be understood from FIGS. 12 and 14A, the distance D40 between the electrode 410 and the solder resist 208C is smaller than half the height D30 of the electronic component 400. Similarly, the distance between the electrode 420 and the solder resist 208C is smaller than half the height D30 of the electronic component 400.

In addition, as can be understood from FIGS. 12 and 14A, the distance D60 between the electrode 410 and the solder resist 108 is smaller than half the height D30 of the electronic component 400. Similarly, the distance between the electrode 420 and the solder resist 108 is smaller than half the height D30 of the electronic component 400.

In addition, each of the distance between the electrode 410 and the wiring board 200C and the distance between the electrode 420 and the wiring board 200C is preferably equal to or smaller than 50 μm. Specifically, each of the distance D40 between the electrode 410 and the solder resist 208C and the distance between the electrode 420 and the solder resist 208C is preferably equal to or smaller than 50 μm.

In addition, each of the distance between the electrode 410 and the semiconductor device 100 and the distance between the electrode 420 and the semiconductor device 100 is preferably equal to or smaller than 50 μm. Specifically, each of the distance D60 between the electrode 410 and the solder resist 108 and the distance between the electrode 420 and the solder resist 108 is preferably equal to or smaller than 50 μm.

In addition, as can be understood from FIGS. 12 and 14A, the height D30 of the electrode 410 of the electronic component 400 in the Z direction is larger than each of the distance between the electronic component 400 and the wiring board 200C and the distance between the electronic component 400 and the semiconductor device 100. Similarly, the height of the electrode 420 of the electronic component 400 in the Z direction is larger than each of the distance between the electronic component 400 and the wiring board 200C and the distance between the electronic component 400 and the semiconductor device 100.

In addition, as can be understood from FIG. 12, the distance D40 between the electrode 410 and the solder resist 208C is smaller than the distance between the element body 401 and the solder resist 108, and the distance D60 between the electrode 410 and the solder resist 108 is smaller than the distance between the element body 401 and the solder resist 208C.

As described above, in the processing module 300C of the second embodiment, the possibility of the open-circuit failure and the short-circuit failure is reduced, and the bonding members 350CE and 350CG can be formed stably. In addition, since the electrodes 410 and 420 of the electronic component 400 are disposed, sandwiched between the insulator 210C and the insulator 110, the amount of sinking of the semiconductor device 100 in the Z direction is reduced (the semiconductor device 100 sinks when the solder melts). Thus, the bonding members 350CE and 350CG are formed, without being crushed by the semiconductor device 100.

In addition, the maximum diameter of each of the bonding members 350CE and 350CG is decreased. As a result, the possibility that the short-circuit failure occurs in the bonding members 350CE and 350CG is reduced, and the bonding members 350CE and 350CG can be formed stably. Therefore, the yield of the manufactured processing modules 300C is increased.

Note that also in the processing module 300C of the second embodiment, modifications of the processing module 300C, such as the first and the second modifications of the first embodiment, are applicable although not illustrated.

Example 1

Next, Example 1 will be described. In Example 1, results in an experiment performed for the first embodiment are shown. In the experiment for manufacturing the processing module 300, a BGA semiconductor package was prepared as the semiconductor device 100. In the semiconductor device 100, the pitch between the solder ball B1 and the solder ball B2 measured 0.5656 mm. In addition, the pitch between the solder ball B1 and the solder ball B3 measured 0.40 mm. In addition, the pitch between the solder ball B2 and the solder ball B4 measured 0.40 mm. In a direction perpendicular to a cross section of the semiconductor device 100, the height of each of the solder balls B1 to B4 from the surface of the solder resist 208 measured 0.2 mm. The electronic component 400 prepared is a chip component having the 0402 size.

The thickness of each of the pads of the semiconductor device 100 and the thickness of each of the pads of the wiring board 200 measured 0.015 mm. The thickness of each of the solder resists 108 and 208 measured 0.020 mm. In the semiconductor device 100, the height from the conductor pattern to the surface of the solder resist 108 measured 0.020 mm. In the wiring board 200, the height from the conductor pattern to the surface of the solder resist 208 measured 0.020 mm. As can be understood from FIGS. 3, 5A, and 10, each of the distance D40 between the electrode 410 and the solder resist 208 and the distance between the electrode 420 and the solder resist 208 is smaller than the thickness of the solder resist 208. In addition, as can be understood from FIGS. 3, 5A, and 10, each of the distance D60 between the electrode 410 and the solder resist 108 and the distance between the electrode 420 and the solder resist 108 is smaller than the thickness of the solder resist 108. Thus, each of the distance D40 between the electrode 410 and the solder resist 208 and the distance between the electrode 420 and the solder resist 208 is equal to or smaller than 20 μm. Similarly, each of the distance D60 between the electrode 410 and the solder resist 108 and the distance between the electrode 420 and the solder resist 108 is equal to or smaller than 20 For example, the height D30 of the electronic component 400 is 150 to 200 μm, whereas the distance D60 between the electrode 410 and the solder resist 108 is 5 to 151 μm.

The pads 130 of the semiconductor device 100 and the pads 230 of the wiring board 200 were formed like a circle, when viewed in the Z direction. The size φ of each of the pads 130 viewed in the Z direction measured 0.23 mm. The size φ of each of the pads 230 viewed in the Z direction measured 0.23 mm.

In the process S2 illustrated in FIG. 7B, the solder pastes P1 to P4 were formed on the wiring board 200 in screen printing. The portion P11 of the solder paste P1 was applied onto the portion 208E of the solder resist 208. The portion P11 is a portion that projects from the pad 230E and serves as a guide path for the electronic component 400. The portion P21 of the solder paste P2 was applied onto the portion 208G of the solder resist 208. The portion P21 is a portion that projects from the pad 230G and serves as a guide path for the electronic component 400. The width of each of the portions P11 and P21 measured 0.175 mm, and the length of each of the portions P11 and P21 measured 0.3 mm. The solder pastes P1 and P2 were formed at positions at which the solder pastes P1 and P2 were not in contact with the pads 230S when viewed in the Z direction. The distance between the solder pastes P1 and P2 decreases as the solder pastes P1 and P2 extend away from the pads 230E and 230G in the Y direction. The thickness of the mask 23 measured 0.1 mm.

In the process S3 illustrated in FIG. 7C, the electronic component 400 was placed on the portion P11 of the solder paste P1 and the portion P21 of the solder paste P2.

In the process S4 illustrated in FIG. 8A, the semiconductor device 100 was placed on the wiring board 200 such that the pad 130E faces the pad 230E, the pad 130G faces the pad 230G, and the pads 130S face the pads 230S.

Then, the structure in which the semiconductor device 100 and the electronic component 400 were mounted on the wiring board 200 was conveyed to a reflow furnace, and in the processes S5-1 and S5-2 illustrated in FIGS. 8B and 8C, the reflow heating was performed on the structure at a peak temperature of the atmosphere in the reflow furnace. The peak temperature was set at a temperature equal to or higher than 230° C.

In the process S5-1, while the solder balls B1 to B4 melted and the molten solder wet and spread on the pads 130E, 130G, 130S$i$, and 130S$_2$, the semiconductor device 100 sank in the Z1 direction. Since the semiconductor device 100 sank, the electronic component 400 was sandwiched between the solder resist 208 of the wiring board 200 and the solder resist 108 of the semiconductor device 100. As a result, the semiconductor device 100 was prevented from sinking more.

After that, in the process S5-2, the solder pastes P1 to P4 melted while the heating was continued. The molten solders, into which the solder pastes P1 and P2 had melted, aggregated on the respective pads 230E and 230G. The electronic component 400 did not reach a position directly above the pads 230E and 230G, and stopped at a position at which the electronic component 400 was sandwiched between the solder resist 108 and the solder resist 208.

After that, in the process S6 illustrated in FIG. 9, the structure was cooled. The bonding member 350E was formed so that the electrode 410, the pad 130E, and the pad 230E were bonded to each other. The bonding member 350G was formed so that the electrode 420, the pad 130G, and the pad 230G were bonded to each other.

As illustrated in FIG. 5B, the electronic component 400 was disposed between the wiring board 200 and the package board 102, such that the virtual line-segment L1 was shifted from the virtual line-segment L2 when viewed in the Z1 direction. The distance D measured 0.15 to 0.18 mm. The width W of each of the electrodes 410 and 420 measured 0.2 mm. The pitch P measured 0.5656 mm.

The solder sticks to the electrodes 410 and 420 when the electrodes 410 and 420 of the electronic component 400 are disposed on the solder pastes P1 and P2 in the process S3. The solder is caused to protrude from between the solder resist 108 and the electrode 410, the solder resist 108 and the electrode 420, the solder resist 208 and the electrode 410, and the solder resist 208 and the electrode 420 by the pressing performed in the process S5-2. As a result, the molten solder covers each of the electrodes 410 and 420. Thus, in the process S6, a solder having a thickness of about 5 to 20 µm may be left between the solder resist 108 and the electrode 410, the solder resist 108 and the electrode 420, the solder resist 208 and the electrode 410, and the solder resist 208 and the electrode 420.

Example 2

Next, Example 2 will be described. In Example 2, results in an experiment performed for the second embodiment are shown. In the experiment for manufacturing the processing module 300C, a BGA semiconductor package was prepared as the semiconductor device 100. In the semiconductor device 100, the pitch between the solder ball B1 and the solder ball B2 measured 0.5656 mm. In addition, the pitch between the solder ball B1 and the solder ball B3 measured 0.40 mm. In addition, the pitch between the solder ball B2 and the solder ball B4 measured 0.40 mm. In a direction perpendicular to a cross section of the semiconductor device 100, the height of the solder balls B1 to B4 from the surface of the solder resist 208C measured 0.2 mm. The electronic component 400 prepared is a chip component having the 0402 size.

The thickness of each of the pads of the semiconductor device 100 and the thickness of each of the pads of the wiring board 200 C measured 0.015 mm. The thickness of each of the solder resists 108 and 208C measured 0.020 mm. In the semiconductor device 100, the height from the conductor pattern to the surface of the solder resist 108 measured 0.020 mm. In the wiring board 200C, the height from the conductor pattern to the surface of the solder resist 208C measured 0.020 mm.

As can be understood from FIGS. 12 and 14A, each of the distance D40 between the electrode 410 and the solder resist 208C and the distance between the electrode 420 and the solder resist 208C is smaller than the thickness of the solder resist 208C. In addition, as can be understood from FIGS. 12 and 14A, each of the distance D60 between the electrode 410 and the solder resist 108 and the distance between the electrode 420 and the solder resist 108 is smaller than the thickness of the solder resist 108. Thus, each of the distance D40 between the electrode 410 and the solder resist 208C and the distance between the electrode 420 and the solder resist 208C is equal to or smaller than 20 Similarly, each of the distance D60 between the electrode 410 and the solder resist 108 and the distance between the electrode 420 and the solder resist 108 is equal to or smaller than 20 For example, the height D30 of the electronic component 400 is 150 to 200 whereas the distance D60 between the electrode 410 and the solder resist 108 is 5 to 15 µm.

The pads 130 of the semiconductor device 100 were formed like a circle, when viewed in the Z direction. The size y of each of the pads 130 viewed in the Z direction measured 0.23 mm.

The pads 230S of the plurality of pads 230 of the wiring board 200C were formed like a circle, when viewed in the Z direction. The size y of each of the pads 230S viewed in the Z direction measured 0.23 mm. The shape of each of the pads 230CE and 230CG is a circle that has a diameter y of 0.23 mm, and that lacks a segment.

In the process S2 illustrated in FIG. 16B, the solder pastes P1 to P4 were formed on the wiring board 200C in screen printing. The portion P11 of the solder paste P1 was applied onto the portion 208E of the solder resist 208C. The portion P11 is a portion that projects from the pad 230CE and serves as a guide path for the electronic component 400. The portion P21 of the solder paste P2 was applied onto the portion 208G of the solder resist 208C. The portion P21 is a portion that projects from the pad 230CG and serves as a guide path for the electronic component 400. The width of each of the portions P11 and P21 measured 0.175 mm, and the length of each of the portions P11 and P21 measured 0.3 mm. The solder pastes P1 and P2 were formed at positions at which the solder pastes P1 and P2 were not in contact with the pads 230S when viewed in the Z direction. The distance between the solder pastes P1 and P2 decreases as the solder pastes P1 and P2 extend away from the pads 230E and 230G in the Y direction. The thickness of the mask 23 measured 0.1 mm.

In the process S13 illustrated in FIG. 16C, the electronic component 400 was placed on the portion P11 of the solder paste P1 and the portion P21 of the solder paste P2.

In the process S14 illustrated in FIG. 17A, the semiconductor device 100 was placed on the wiring board 200C such that the pad 130E faces the pad 230CE, the pad 130G faces the pad 230CG, and the pads 130S face the pads 230S.

Then, the structure in which the semiconductor device 100 and the electronic component 400 were mounted on the wiring board 200C was conveyed to a reflow furnace, and in the processes S15-1 and S15-2 illustrated in FIGS. 17B and 17C, the reflow heating was performed on the structure at a peak temperature of the atmosphere in the reflow furnace. The peak temperature was set at a temperature equal to or higher than 230° C.

In the process S15-1, the solder pastes P1 to P4 melted. The molten solders, into which the solder pastes P1 and P2 had melted, aggregated on the respective pads 230CE and 230CG. By the aggregation of the molten solders, into which the solder pastes P1 and P2 had melted, the electronic component 400 was guided to the vicinity of the solder balls B1 and B2.

In the process S15-2, while the solder balls B1 to B4 melted and the molten solder wet and spread on the pads 130E, 130G, 130S$i$, and 130S$_2$, the semiconductor device 100 sank in the Z1 direction. Since the semiconductor device 100 sank, the electronic component 400 was sandwiched between the solder resist 208C of the wiring board 200C and the solder resist 108 of the semiconductor device 100.

In the process S15-2, the solder balls B1 to B4 melted, and before the semiconductor device 100 sank and contacted the electronic component 400, the electronic component 400 was caused to move to a space between the pads 230CE and 230CG, by the aggregation force of the molten solder. As a result, one portion of the electrode 410 of the electronic component 400 and one portion of the electrode 420 of the electronic component 400 were sandwiched between the solder resist 208C and the solder resist 108. In this manner, the sinking of the semiconductor device 100 was suppressed.

The solder sticks to the electrodes 410 and 420 when the electrodes 410 and 420 of the electronic component 400 are disposed on the solder pastes P1 and P2 in the process S13. The solder is caused to protrude from between the solder resist 108 and the electrode 410, the solder resist 108 and the electrode 420, the solder resist 208 and the electrode 410, and the solder resist 208 and the electrode 420 by the pressing performed in the process S15-2. As a result, the molten solder covers each of the electrodes 410 and 420. Thus, in the process S16, a solder having a thickness of about 5 to 20 µm may be left between the solder resist 108 and the electrode 410, the solder resist 108 and the electrode 420, the solder resist 208 and the electrode 410, and the solder resist 208 and the electrode 420.

Comparative Example

Figure 19:
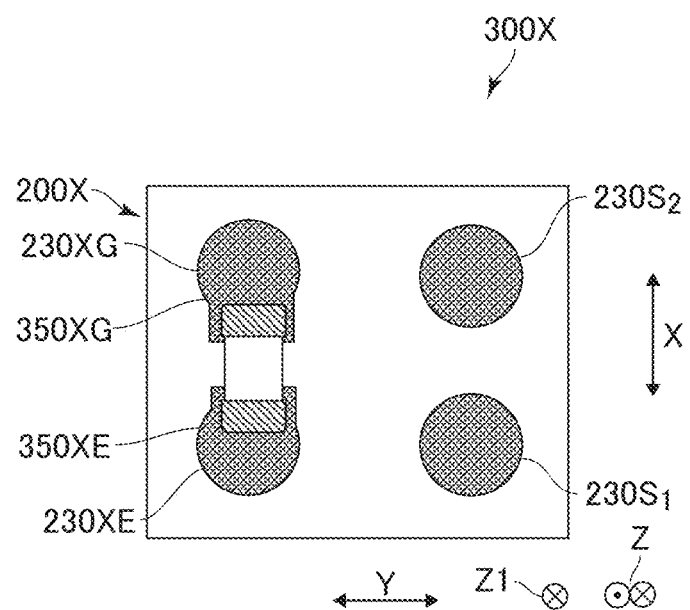
FIG. 19 is a plan view of one portion of a processing module of Comparative Example.

For comparison with Example 1 and Example 2, a processing module of Comparative Example was also manufactured. FIG. 19 is a plan view of one portion of a processing module 300X of Comparative Example. In FIG. 19, the semiconductor device is not illustrated. The configuration of the semiconductor device of the processing module 300X is the same as that of the semiconductor device 100. The processing module 300X includes a wiring board 200X and an electronic component 400. The wiring board 200X includes a pad 230XE and a pad 230XG. When viewed in the Z1 direction, the area of the pad 230XE is larger than the area of the pad 230E, and the area of the pad 230XG is larger than the area of the pad 230G. In addition, the wiring board 200X includes no solder resist.

For manufacturing the processing module 300X, as in Example 1 and Example 2, the solder pastes P1 to P4 were applied onto the wiring board 200X, and the electronic component 400 was placed on the solder pastes P1 and P2. The electronic component 400 was moved by the aggregation force of the molten solder, which had been melted by the reflow heating. The electrode 410 was caused to face the pad 230XE in the Z direction, and the electrode 420 was caused to face the pad 230XG in the Z direction. The electrode 410 was bonded to the pad 230XE via a bonding member 350XE, and the electrode 420 was bonded to the pas 230XG via a bonding member 350XG.

Experimental Results

In the bonding structure in Example 1, since the electronic component 400 was sandwiched between the solder resist 108 and the solder resist 208, the amount of sinking of the semiconductor device 100 was reduced. In addition, the electronic component 400 was disposed between the wiring board 200 and the package board 102, such that the virtual line-segment L1 was shifted from the virtual line-segment L2 when viewed in the Z1 direction. As a result, in the processes S5-1 and S5-2, the electrodes 410 and 420 of the electronic component 400 were not drawn into the vicinity of the pads 230E and 230G, respectively.

In Comparative Example, the area of each of the pads 230XE and 230XG is larger than the area of each of the pads 230E and 230G of Example 1, and than the area of each of the pads 230CE and 230CG of Example 2. Thus, the molten solder easily wet and spread, and there was a case where the open-circuit failure occurred. In contrast, the open-circuit failure did not occur in Example 1 and Example 2.

In addition, in Comparative Example, no solder resist exists in an area on which the electrodes 410 and 420 of the electronic component 400 is disposed. Thus, the semiconductor device 100 sank by 30 µm, with respect to a reference position in which the semiconductor device 100 was located before the heating was performed. In Example 2, the semiconductor device 100 sank by 10 µm, with respect to the reference position. The reason that the amount of sinking of the semiconductor device 100 of Example 2 is smaller than the amount of sinking of the semiconductor device 100 of Comparative Example is that the height from the conductor pattern of the wiring board 200C to the surface of the solder resist 208 measures 20 µm. In addition, the reason that the amount of sinking of the semiconductor device 100 of Example 2 is smaller than the amount of sinking of the semiconductor device 100 of Comparative Example is that each of the step between the bottom surface of the element body 401 and the bottom surface 415 of the electrode 410 of the electronic component 400 and the step between the bottom surface of the element body 401 and the bottom surface 425 of the electrode 420 of the electronic component 400 measures about 10 to 20 µm. Thus, since the electrodes 410 and 420 are positioned on the solder resist 208, the amount of sinking of the semiconductor device 100 in the Z1 direction can be reduced by about 20 µm (the semiconductor device 100 sinks when the solder melts), compared with the case where the electrodes 410 and 420 are respectively disposed on the pads 230XE and 230XG.

Figure 20A:
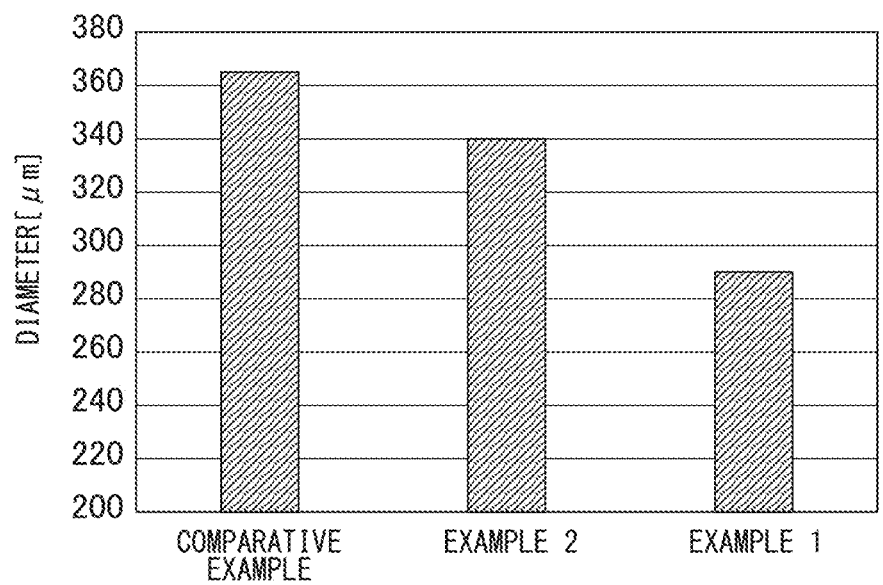
FIG. 20A is a graph illustrating experimental results in Example 1, Example 2, and Comparative Example.
Figure 20B:
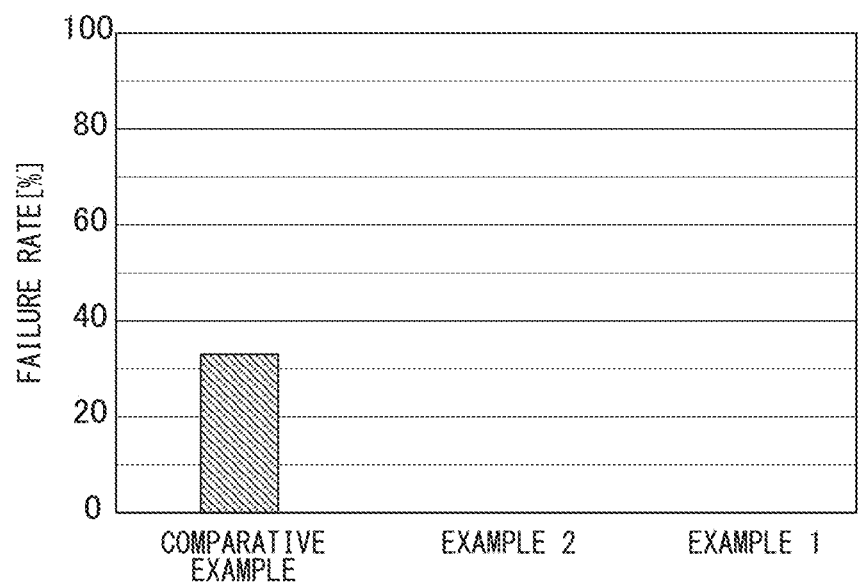
FIG. 20B is a graph illustrating experimental results in Example 1, Example 2, and Comparative Example.

FIGS. 20A and 20B area graphs illustrating experimental results in Example 1, Example 2, and Comparative Example. The vertical axis of FIG. 20A represents the maximum diameter of any one of the bonding members 350E and 350G of Example 1, viewed in the Z direction; the maximum diameter of any one of the bonding members 350CE and 350CG of Example 2, viewed in the Z direction; and the maximum diameter of any one of the bonding members 350XE and 350XG of Comparative Example, viewed in the Z direction. FIG. 20B illustrates a failure rate of short-circuit failure of a bonding structure. The failure rate is obtained by dividing the number of short-circuit failures between bonding members adjacent to each other, by the number of products.

As illustrated in FIG. 20A, the maximum diameter in Comparative Example is 365 µm, whereas the maximum diameter in Example 1 is 290 µm and the maximum diameter in Example 2 is 340 µm. Thus, the diameters of bonding members of Example 1 and Example 2 are smaller than the diameter of a bonding member of Comparative Example. That is, in Example 1 and Example 2, the amount of sinking of the semiconductor device 100 was made smaller than the amount of sinking of the semiconductor device 100 of Comparative Example. As a result, the diameters of the bonding members of Example 1 and Example 2 were made smaller than the diameter of the bonding member of Comparative Example. In addition, the diameter of a bonding member of Example 1 is smaller than the diameter of a bonding member of Example 2. That is, in Example 1, the amount of sinking of the semiconductor device 100 was made smaller than the amount of sinking of the semiconductor device 100 of Example 2. As a result, the diameter of the bonding members of Example 1 was made smaller than the diameter of the bonding member of Example 2.

Thus, in Example 1 and Example 2, the possibility that a bonding member is crushed and the diameter of the bonding member is increased can be reduced. In Example 1, the possibility that the diameter of a bonding member is increased can be more effectively reduced. As a result, as illustrated in FIG. 20B, the failure rate of short-circuit failure is 33% in Comparative Example, whereas the failure rate of short-circuit failure is 0% in Example 1 and Example 2.

Thus, in Example 1, while the open-circuit failure of the electrodes 410 and 420 of the electronic component 400 can be prevented, the short-circuit failure between the bonding member 350E and the bonding members $350S_1$ can be prevented, and the short-circuit failure between the bonding member 350G and the bonding members $350S_2$ can be prevented. In addition, in Example 2, while the open-circuit failure of the electrodes 410 and 420 of the electronic component 400 can be prevented, the short-circuit failure between the bonding member 350CE and the bonding members $350S_1$ can be prevented, and the short-circuit failure between the bonding member 350CG and the bonding members $350S_2$ can be prevented.

The present invention is not limited to the above-described embodiments, and can be modified variously within a technical concept of the present disclosure. In addition, the effects described in the embodiments are merely examples of the most suitable effects produced by the present invention. Thus, the effects of the present disclosure are not limited to the effects described in the embodiments.

In the above-described first and second embodiments, the description has been made for the case where the insulator 210 includes the solder resist 208 and the insulator 110 includes the solder resist 108. However, the present disclosure is not limited to this. For example, the insulator 210 may not include the solder resist 208, and the insulator 110 may not include the solder resist 108. That is, the electronic component 400 has only to be sandwiched between the insulator 210 and the insulator 110.

In addition, a first conductor pattern that overlaps with the electronic component 400 in the Z direction may be disposed in the insulator 210, for example, between the insulating board 220 and the solder resist 208. In another case, a second conductor pattern that overlaps with the electronic component 400 in the Z direction may be disposed in the insulator 110, for example, between the insulating board 120 and the solder resist 108. In another case, the first conductor pattern may be disposed in the insulator 210, and the second conductor pattern may be disposed in the insulator 110. The first conductor pattern may be connected to any of the plurality of pads 230, or may be connected to none of the plurality of pads 230. The second conductor pattern may be connected to any of the plurality of pads 130, or may be connected to none of the plurality of pads 130.

In the above-described embodiments, the description has been made for the case where the electrical component 400 is a chip capacitor. However, the present disclosure is not limited to this. For example, the electronic component 400 may be a passive component, such as a chip resistor or a chip inductor.

In addition, in the above-described first embodiment, the description has been made for the case where the semiconductor device 100 that includes a wiring board is mounted on the wiring board 200. However, the present disclosure is not limited to this. For example, another wiring board may be mounted on the wiring board 200. In this case, the electronic component 400 has only to be disposed between the wiring board 200 and the other wiring board.

In addition, in the structure in which the electronic component 400 is mounted on the wiring board 200, the wiring board, such as the package board 102, may not be disposed on the electronic component 400. That is, in the manufacturing process in which the electronic component 400 is bonded to the wiring board 200, the electronic component 400 may be soldered to the wiring board 200 in a state where the electronic component 400 is pressed against the insulator 210 of the wiring board 200, with a jig (not illustrated). With this operation, the electrodes 410 and 420 of the electronic component 400 can be prevented from moving onto the pads 230G and 230E, and the electronic component 400 can be disposed on the insulator 210 of the wiring board 200.

In addition, in the above-described second embodiment, the description has been made for the case where the semiconductor device 100 that includes a wiring board is mounted on the wiring board 200C. However, the present disclosure is not limited to this. For example, another wiring board may be mounted on the wiring board 200C. In this case, the electronic component 400 has only to be disposed between the wiring board 200C and the other wiring board.

In addition, in the structure in which the electronic component 400 is surface-mounted on the wiring board 200C, the wiring board, such as the package board 102, may not be disposed on the electronic component 400. That is, in the manufacturing process in which the electronic component 400 is bonded to the wiring board 200C, the electronic component 400 may be soldered to the wiring board 200C in a state where the electronic component 400 is pressed against the insulator 210C of the wiring board 200C, with a jig (not illustrated). With this operation, the electronic component 400 can be disposed on the insulator 210C of the wiring board 200C.

In addition, in the above-described first and second embodiments, the description has been made for the case where the semiconductor device 100 is a BGA semiconductor package. However, the present disclosure is not limited to this. For example, the semiconductor device 100 may be a land grid array (LGA) semiconductor package. In a case where the semiconductor device 100 is an LGA semiconductor package, the solder balls are not used in manufacturing the processing module. In this case, for mounting the semiconductor device 100, the solder paste is applied onto one or both of the mounting surface 103 and the mounting surface 201. In addition, the semiconductor device 100, which is a wiring component, may be a chip-size package. In this case, a redistribution pattern and solder balls, which are formed in wafer level, can be disposed on the back surface of the semiconductor element 101, which is a semiconductor chip. Thus, the package board 102 may not be disposed in the semiconductor device 100.

In addition, in the above-described first embodiment, the description has been made, as an example, for the case where the first insulating member, which forms the insulating area R1 of the mounting surface 201, is an organic insulating film such as the solder resist 208, and in the above-described second embodiment, the description has been made, as an example, for the case where the first insulating member, which forms the insulating area R1C of the mounting surface 201C, is an organic insulating film such as the solder resist 208C. However, the present disclosure is not limited to these. For example, the first insulating member may be an insulating member other than the organic insulating film, such as an insulating substrate (e.g., a ceramic substrate or a plastic substrate); and the pads 230 or the pads 230C may be disposed on a main surface of the insulating substrate. In this case, the insulating area of the mounting surface is an area of the main surface of the insulating substrate, except for areas hidden by the pads 230 or 230C. In another case, the first insulating member may be an inorganic insulating film made of silicon oxide, silicon nitride, or aluminum oxide, for example; and the inorganic insulating film may cover a portion of the conductor layer 205 or 205C, other than the pads 230 or 230C. In this case, the insulating area of the mounting surface is the area of the main surface of the inorganic insulating film.

In addition, in the above-described first and second embodiments, the description has been made, as an example, for the case where the second insulating member, which forms the insulating area R2 of the mounting surface 103, is an organic insulating film such as the solder resist 108. However, the present disclosure is not limited to this. For example, the second insulating member may be an insulating member other than the organic insulating film, such as an insulating substrate (e.g., a ceramic substrate or a plastic substrate); and the pads 130 may be disposed on a main surface of the insulating substrate. In this case, the insulating area of the mounting surface is an area of the main surface of the insulating substrate, except for areas hidden by the pads 130. In another case, the second insulating member may be an inorganic insulating film made of silicon oxide, silicon nitride, or aluminum oxide, for example; and the inorganic insulating film may cover a portion of the conductor layer 105, other than the pads 130. In this case, the insulating area of the mounting surface is the area of the main surface of the inorganic insulating film.

In addition, the description has been made for the case where the first wiring component is a printed wiring board and the second wiring component is an integrated-circuit component. However, the present disclosure is not limited to this. For example, the first wiring component may be a first printed wiring board, and the second wiring component may be a second printed wiring board. In another case, the first wiring component may be an integrated-circuit component, and the second wiring component may be a printed wiring board. In another case, the first wiring component may be a first integrated-circuit component, and the second wiring component may be a second integrated-circuit component.

In addition, in the above-described first and second embodiments, the description has been made for the case where the electronic module is any one of the processing modules 300 and 300C. However, the present disclosure is not limited to this. For example, the electronic module may be the sensor module 900.

In addition, the electronic apparatus to which the electronic module of the above-described embodiments can be applied may be an information apparatus, such as a smartphone of a personal computer, or may be a communication apparatus, such as a modem or a router. In another case, the electronic apparatus may be an office apparatus, such as a printer or a copying machine, a medical apparatus, such as an X-ray imaging apparatus or an endoscope, an industrial apparatus, such as a robot or a semiconductor manufacturing apparatus, or a transportation apparatus, such as a vehicle, an air plane, or a ship.

In addition, the disclosure of the present specification includes not only features described explicitly in the present specification, but also all features that can be understood from the present specification and the drawings attached to the present specification. In addition, the disclosure of the present specification includes the complement of each of the concepts described in the present specification. That is, if the present specification describes, for example, a feature in which A is B, the present specification discloses a feature in which A is not B, even if the present specification does not describe the feature in which A is not B. This is because if a feature in which A is B is described, the feature is described in consideration of the feature in which A is not B.

The present disclosure provides a technique that is advantageous for reducing the occurrence of short-circuit failure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-176322, filed Nov. 2, 2022, and Japanese Patent Application No. 2023-169939 filed Sep. 29, 2023, which are hereby incorporated by reference herein in their entirety.

What is claimed is:

1. An electronic module comprising:
a first wiring component including a first pad, a second pad, and a first insulating member configured to define the first pad and the second pad, the first pad, the second pad, and the first insulating member being formed in a first mounting surface;
a first electronic component including a first electrode and a second electrode and being surface-mounted on the first mounting surface;
a first bonding member configured to bond the first pad and the first electrode together; and
a second bonding member configured to bond the second pad and the second electrode together;
wherein the first electrode and the second electrode are positioned on an insulating area of the first mounting surface, the insulating area being formed by the first insulating member, and
wherein a distance between the first electrode and the first insulating member is smaller than a distance between the first electrode and the first pad.

2. The electronic module according to claim 1, wherein the first wiring component includes a first insulating board, and a first conductor layer including the first pad and the second pad,
wherein the first conductor layer is disposed between the first insulating member and the first insulating board, and
wherein the first electrode and the second electrode do not overlap with the first pad and the second pad when viewed in a direction perpendicular to the first mounting surface.

3. The electronic module according to claim 1, wherein a distance between the second electrode and the first insulating member is smaller than a distance between the second electrode and the second pad.

4. The electronic module according to claim 1, wherein each of the distance between the first electrode and the first insulating member and the distance between the second electrode and the first insulating member is smaller than 0.125 mm.

5. The electronic module according to claim 1, wherein each of the distance between the first electrode and the first insulating member and the distance between the second electrode and the first insulating member is smaller than half a height of the first electrode.

6. The electronic module according to claim 1, wherein each of a distance between the first electrode and the first wiring component and a distance between the second electrode and the first wiring component is equal to or smaller than 50 μm.

7. The electronic module according to claim 1, wherein the first insulating member is a first solder resist, wherein the first bonding member and the second bonding member contain solder, and wherein each of a distance between the first electrode and the first solder resist and a distance between the second electrode and the first solder resist is smaller than a thickness of the first solder resist.

8. The electronic module according to claim 1, wherein each of the distance between the first electrode and the first insulating member and the distance between the second electrode and the first insulating member is equal to or smaller than 20 µm.

9. The electronic module according to claim 1, further comprising:

a second wiring component disposed facing the first wiring component, wherein the first electronic component is disposed between the first wiring component and the second wiring component.

10. The electronic module according to claim 9, wherein each of a distance between the first electrode and the second wiring component and a distance between the second electrode and the second wiring component is equal to or smaller than 50 µm.

11. The electronic module according to claim 9, wherein a height of the first electrode of the first electronic component in a direction in which the first wiring component and the second wiring component face each other is larger than a distance between the first electronic component and the first wiring component, and than a distance between the first electronic component and the second wiring component.

12. The electronic module according to claim 9, wherein the second wiring component includes a second mounting surface, the first mounting surface and the second mounting surface being electrically connected with each other.

13. The electronic module according to claim 12, wherein the second wiring component includes a second insulating member formed in the second mounting surface, and wherein a distance between the first electronic component and the second insulating member is smaller than 0.125 mm.

14. The electronic module according to claim 12, wherein the second wiring component includes a third pad, a fourth pad, and a second insulating member configured to define the third pad and the fourth pad, the third pad, the fourth pad, and the second insulating member being formed in the second mounting surface, wherein the first bonding member is configured to bond the first pad, the third pad, and the first electrode together, wherein the second bonding member is configured to bond the second pad, the fourth pad, and the second electrode together, and wherein a distance between the first electronic component and the second insulating member is smaller than a distance between the first electronic component and the third pad.

15. The electronic module according to claim 14, wherein the second wiring component includes a second insulating board, and a second conductor layer including the third pad and the fourth pad, the second conductor layer being disposed between the second insulating member and the second insulating board, and wherein the first electrode and the second electrode do not overlap with the third pad and the fourth pad when viewed in a direction perpendicular to the second mounting surface.

16. The electronic module according to claim 14, wherein the second insulating member is a second solder resist, wherein the first bonding member and the second bonding member are solder, and wherein each of a distance between the first electrode and the second solder resist and a distance between the second electrode and the second solder resist is smaller than a thickness of the second solder resist.

17. The electronic module according to claim 14, wherein each of a distance between the first electrode and the second insulating member and a distance between the second electrode and the second insulating member is equal to or smaller than 20 µm.

18. The electronic module according to claim 14, wherein the first electronic component includes an element body between the first electrode and the second electrode, a distance between the first electrode and the first insulating member being smaller than a distance between the element body and the second insulating member, a distance between the first electrode and the second insulating member being smaller than a distance between the element body and the first insulating member.

19. The electronic module according to claim 14, wherein the first pad and the third pad are configured to face each other in a height direction of the first electronic component, and wherein a distance between the first pad and the third pad in the height direction is larger than a distance between the first insulating member and the second insulating member in the height direction.

20. The electronic module according to claim 9, further comprising:

a second electronic component disposed between the first wiring component and the second wiring component and smaller in height than the first electronic component, wherein an electrode of the second electronic component is positioned on a pad disposed on the first mounting surface.

21. The electronic module according to claim 9, wherein at least one of the first wiring component and the second wiring component is an integrated-circuit component.

22. The electronic module according to claim 9, wherein at least one of the first wiring component and the second wiring component is a printed wiring board.

23. The electronic module according to claim 1, wherein when viewed in a direction perpendicular to the first mounting surface, a first virtual line-segment from a center of the first electrode to a center of the second electrode does not overlap with a second virtual line-segment from a center of the first pad to a center of the second pad.

24. The electronic module according to claim 23, wherein when viewed in a direction perpendicular to the first mounting surface, a shortest distance between the first virtual line-segment and the second virtual line-segment is larger than half a width of the first electrode.

25. The electronic module according to claim 23, wherein the first wiring component includes a fifth pad positioned closest to the first pad among a plurality of pads disposed in the first mounting surface in a direction that intersects a direction in which the first pad and the second pad are adjacent to each other, and wherein when viewed in a direction perpendicular to the first mounting surface, a shortest distance between the first virtual line-segment and the second virtual line-segment is smaller than a pitch between the first pad and the fifth pad.

26. The electronic module according to claim 1, wherein the first wiring component includes a fifth pad positioned closest to the first pad among a plurality of pads disposed in the first mounting surface in a direction that intersects a direction in which the first pad and the second pad are adjacent to each other, and
wherein the first electrode is closer to the first pad than to the fifth pad.

27. The electronic module according to claim 1, wherein the first wiring component includes a fifth pad positioned closest to the first pad among a plurality of pads disposed in the first mounting surface in a direction that intersects a direction in which the first pad and the second pad are adjacent to each other, and
wherein a height of the first electronic component is larger than one quarter of a pitch between the first pad and the fifth pad.

28. The electronic module according to claim 1, wherein the first wiring component includes a fifth pad positioned closest to the first pad among a plurality of pads disposed in the first mounting surface in a direction that intersects a direction in which the first pad and the second pad are adjacent to each other, and
wherein a height of the first electronic component is smaller than a pitch between the first pad and the fifth pad.

29. The electronic module according to claim 1, wherein the first electronic component is a passive component.

30. The electronic module according to claim 1, wherein the first electronic component is a capacitor.

31. The electronic module according to claim 1, wherein a size of the first electronic component in a plan view is equal to or smaller than a size of 0.4 mm×0.2 mm.

32. An electronic apparatus comprising:
a housing; and
the electronic module according to claim 1 and disposed in the housing.

33. The electronic apparatus according to claim 32 and comprising an image sensor.

34. A method of manufacturing an electronic module, the method comprising:
supplying a first solder paste such that the first solder paste extends from a top of a first pad of a wiring component to a top of an insulating member of the wiring component, and supplying a second solder paste such that the second solder paste extends from a top of a second pad of the wiring component to a top of the insulating member of the wiring component,
placing an electronic component on the wiring component such that a first electrode of the electronic component contacts a portion of the first solder paste formed on the insulating member, and that a second electrode of the electronic component contacts a portion of the second solder paste formed on the insulating member, and
forming a first molten solder and a second molten solder by melting the first solder paste and the second solder paste by heating the first solder paste and the second solder paste in a state where the electronic component is pressed against the insulating member, and forming a first bonding member and a second bonding member by solidifying the first molten solder and the second molten solder by cooling the first molten solder and the second molten solder, the first bonding member and the second bonding member being members that bond the first electrode and the second electrode to the wiring component in a state where the first electrode and the second electrode are positioned on the insulating member.

* * * * *